US012699262B2

(12) United States Patent
Kurashina et al.

(10) Patent No.: US 12,699,262 B2
(45) Date of Patent: Aug. 4, 2026

(54) MEMS ACTUATOR, MEMS ACTUATOR DRIVE METHOD, AND MEMS ACTUATOR CONTROL PROGRAM

(71) Applicant: HAMAMATSU PHOTONICS K.K., Hamamatsu (JP)

(72) Inventors: Takayuki Kurashina, Hamamatsu (JP); Tomofumi Suzuki, Hamamatsu (JP); Tatsuya Sugimoto, Hamamatsu (JP); Hiroo Yamamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 746 days.

(21) Appl. No.: 17/916,821

(22) PCT Filed: Jan. 27, 2021

(86) PCT No.: PCT/JP2021/002840
§ 371 (c)(1),
(2) Date: Oct. 4, 2022

(87) PCT Pub. No.: WO2021/205715
PCT Pub. Date: Oct. 14, 2021

(65) Prior Publication Data
US 2023/0152573 A1 May 18, 2023

(30) Foreign Application Priority Data
Apr. 6, 2020 (JP) .................................. 2020-068527

(51) Int. Cl.
| | |
|---|---|
| *G02B 26/08* | (2006.01) |
| *B81B 7/02* | (2006.01) |
| *G02B 26/10* | (2006.01) |

(52) U.S. Cl.
CPC ............ *G02B 26/0841* (2013.01); *B81B 7/02* (2013.01); *B81B 2201/042* (2013.01);
(Continued)

(58) Field of Classification Search
CPC ...... G02B 26/0841; G02B 26/10; B81B 7/02; B81B 2201/042; B81B 2203/0136; B81B 2207/03
See application file for complete search history.

(56) References Cited

U.S. PATENT DOCUMENTS

| | | | |
|---|---|---|---|
| 2019/0018114 A1* | 1/2019 | Patterson | .............. H01L 23/544 |
| 2020/0018948 A1* | 1/2020 | Steiner | ............... G01R 27/2605 |
| 2020/0285047 A1* | 9/2020 | Pu | ........................ G02B 26/101 |

FOREIGN PATENT DOCUMENTS

| | | |
|---|---|---|
| CN | 102598315 A | 7/2012 |
| CN | 110799889 A | 2/2020 |

(Continued)

OTHER PUBLICATIONS

International Preliminary Report on Patentability mailed Oct. 20, 2022 for PCT/JP2021/002840.

*Primary Examiner* — Bumsuk Won
*Assistant Examiner* — Ray Alexander Dean
(74) *Attorney, Agent, or Firm* — FAEGRE DRINKER BIDDLE & REATH LLP

(57) ABSTRACT

A MEMS actuator includes: a drive circuit for applying a drive voltage having a time waveform, which periodically repeats rising and falling and includes a period to be a constant voltage after the rising and before the falling, between a fixed comb electrode and a movable comb electrode; and a timing detection circuit that generates a capacitance derivative signal indicating a derivative value of a capacitance between the fixed comb electrode and the movable comb electrode by converting a current signal, which is output from the fixed comb electrode or the movable comb electrode within the period due to a change in the capacitance, into a voltage signal and detects a timing when the capacitance derivative signal reaches a threshold value. The drive circuit controls a relationship between the
(Continued)

timing detected by the timing detection circuit and a timing of the falling to be constant.

23 Claims, 36 Drawing Sheets

(52) U.S. Cl.
    CPC ... *B81B 2203/0136* (2013.01); *B81B 2207/03* (2013.01); *G02B 26/10* (2013.01)

(56) References Cited

FOREIGN PATENT DOCUMENTS

| JP | 2004-069731 A | | 3/2004 |
|----|---------------|---|--------|
| JP | 2005208251 A | * | 8/2005 |
| JP | 2013-160953 A | | 8/2013 |
| JP | 2017-129661 A | | 7/2017 |
| JP | 2017-181951 A | | 10/2017 |

* cited by examiner

*Fig.2*
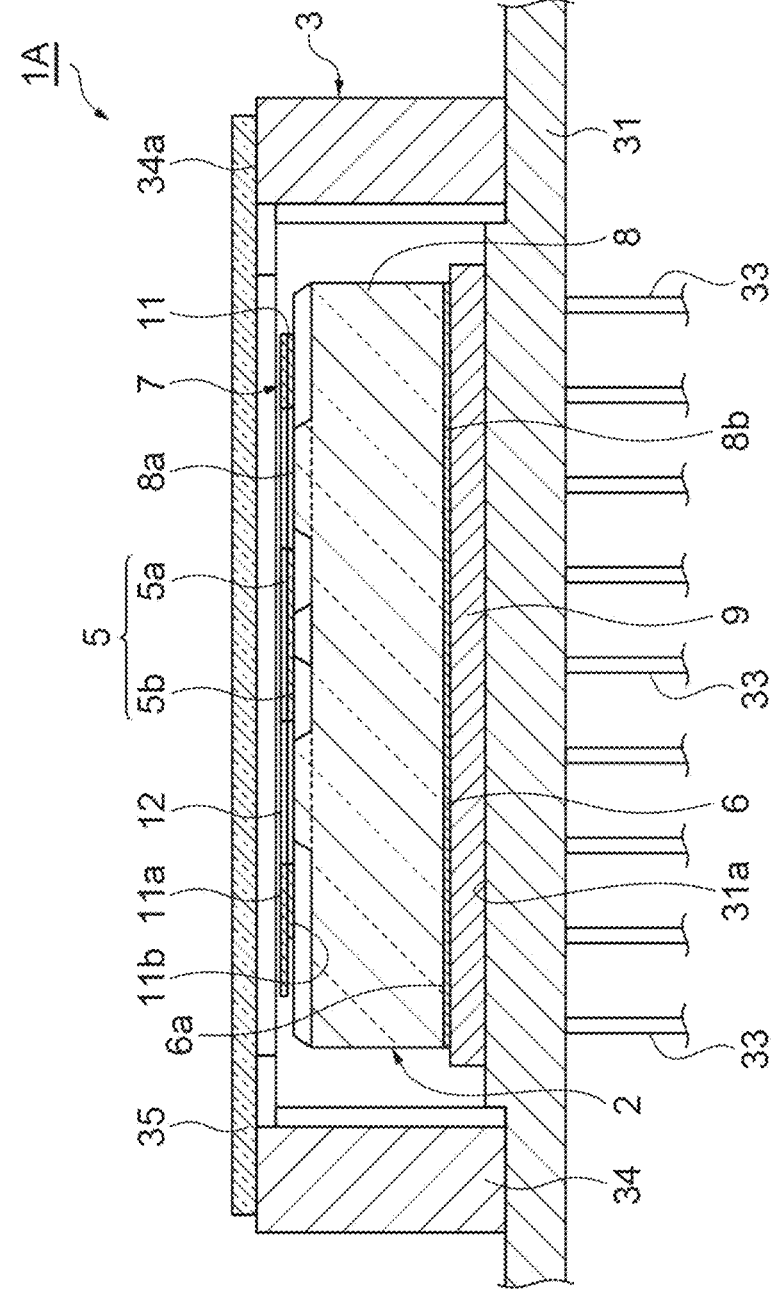
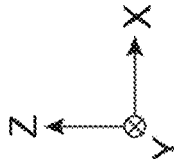

(a)

(b)

(c)

*Fig.17*
(a)
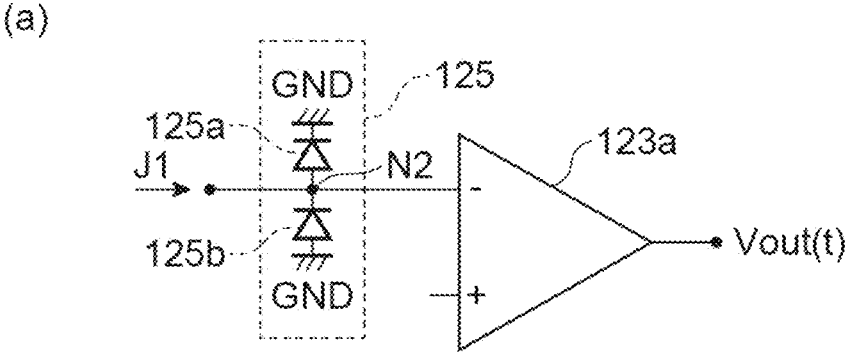
(b)
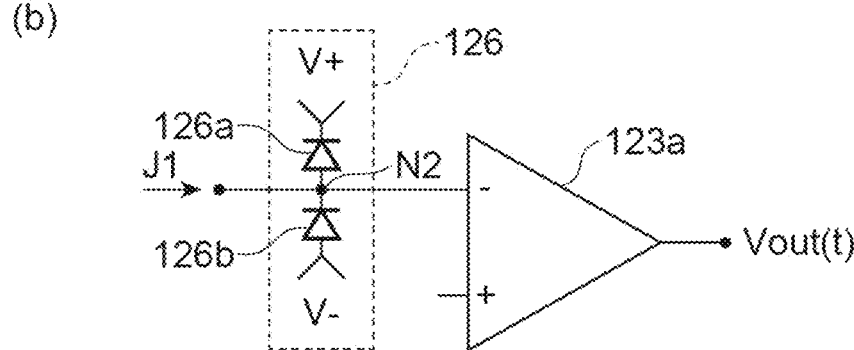

*Fig.19*
(a)
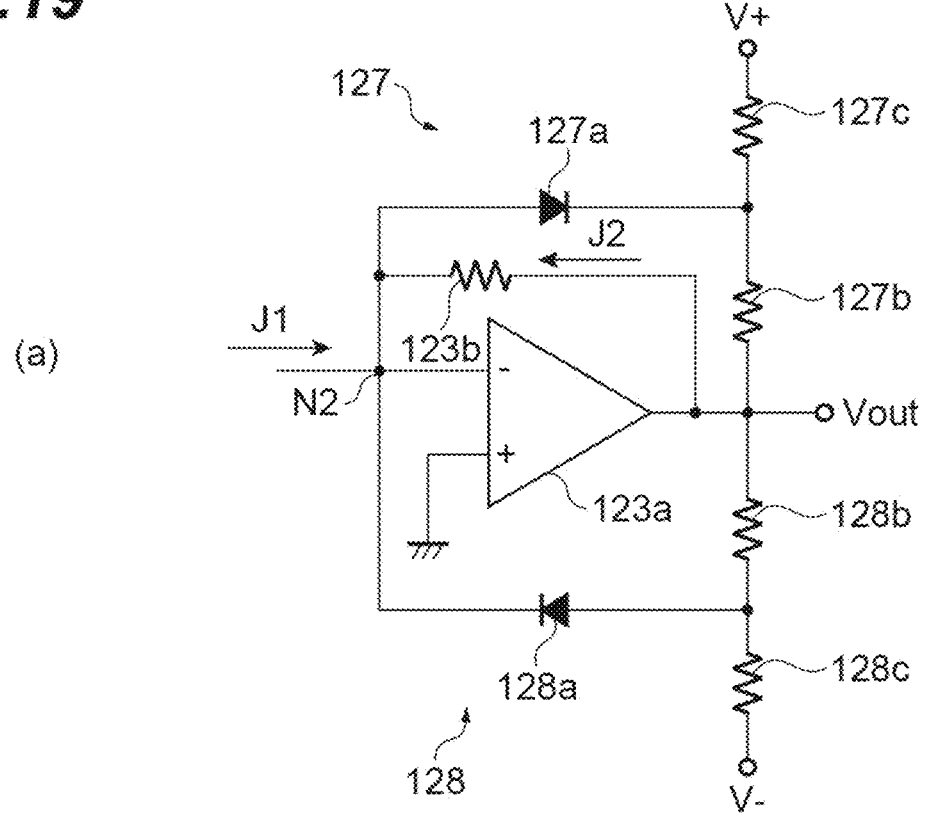
(b)
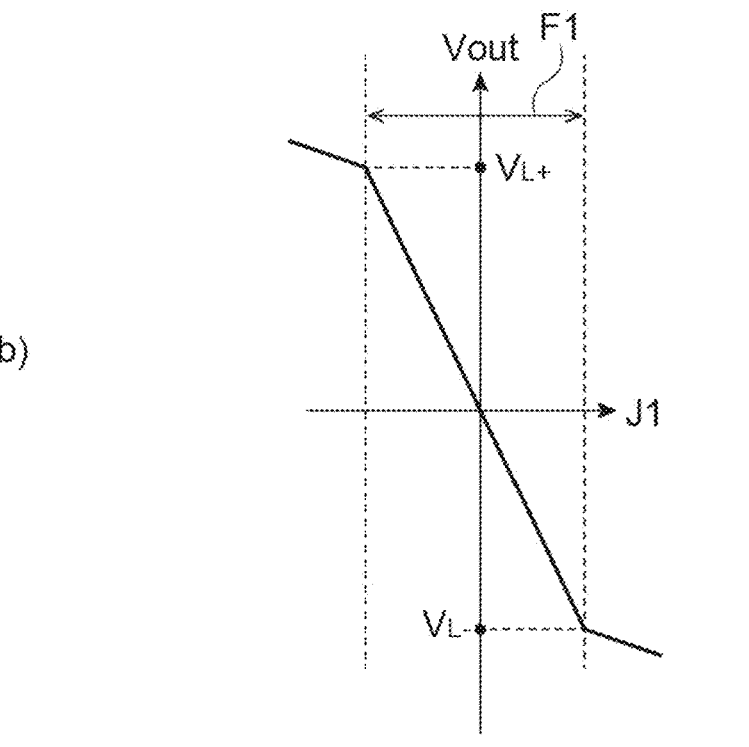

*Fig.20*
(a)
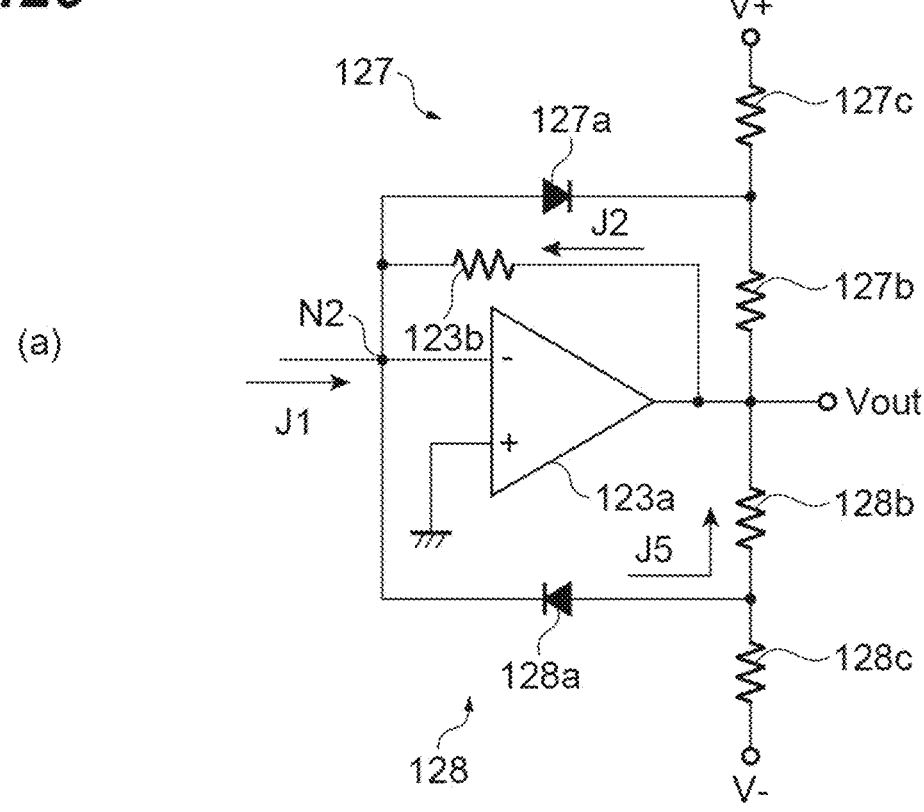
(b)
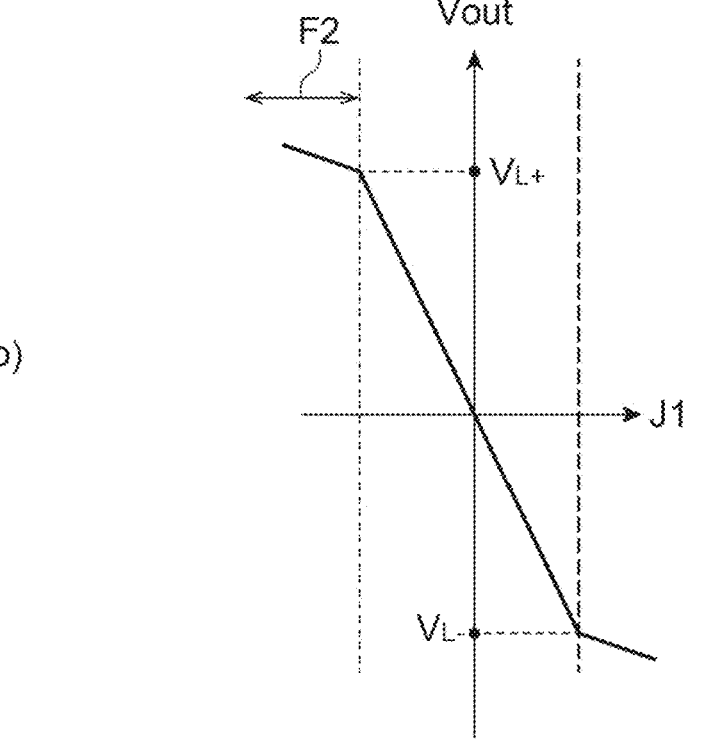

*Fig.21*
(a)
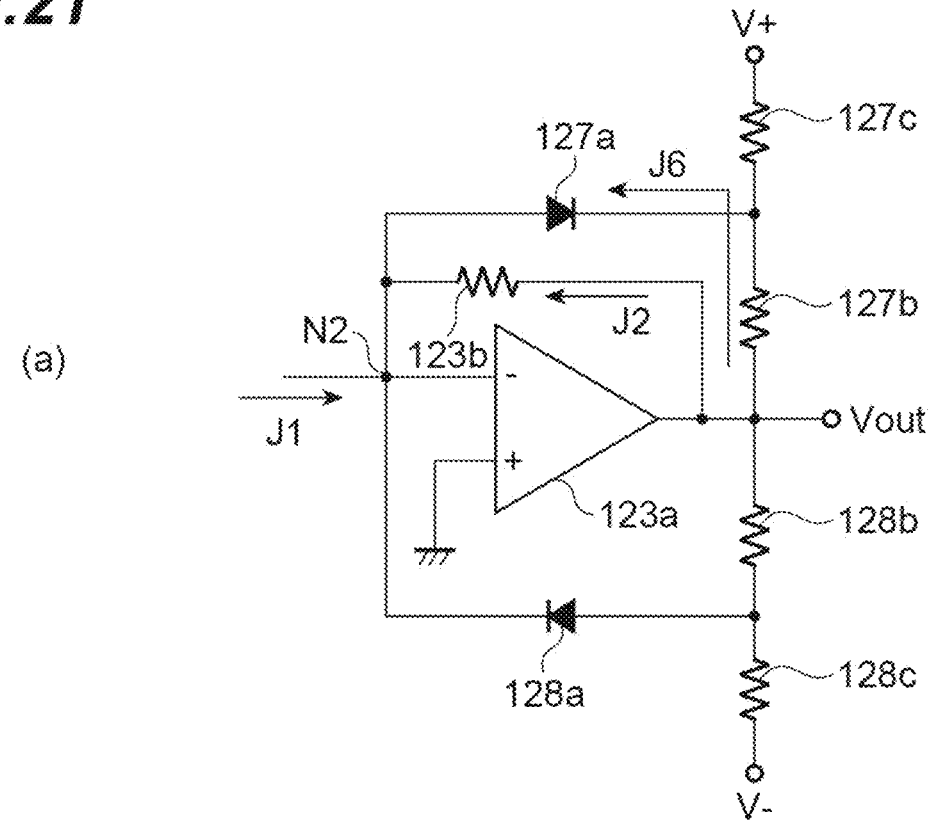
(b)
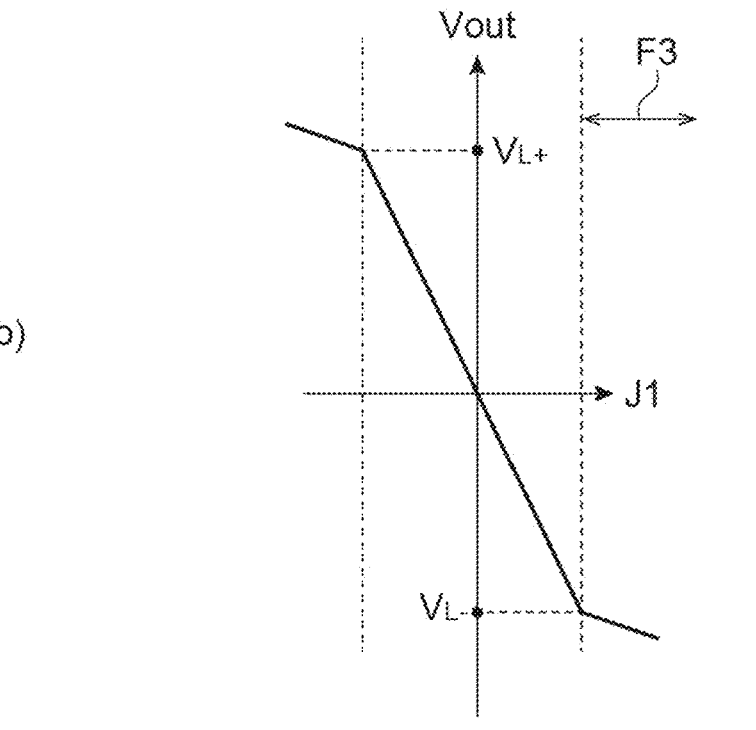

*Fig.28*
(a)
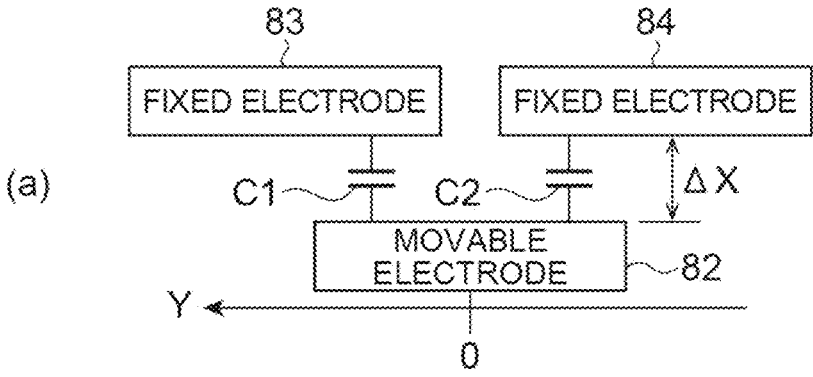
(b)
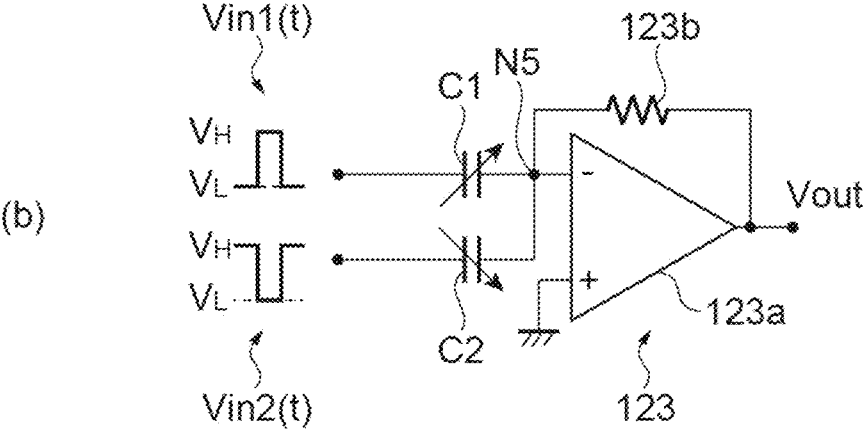

*Fig.30*
(a)
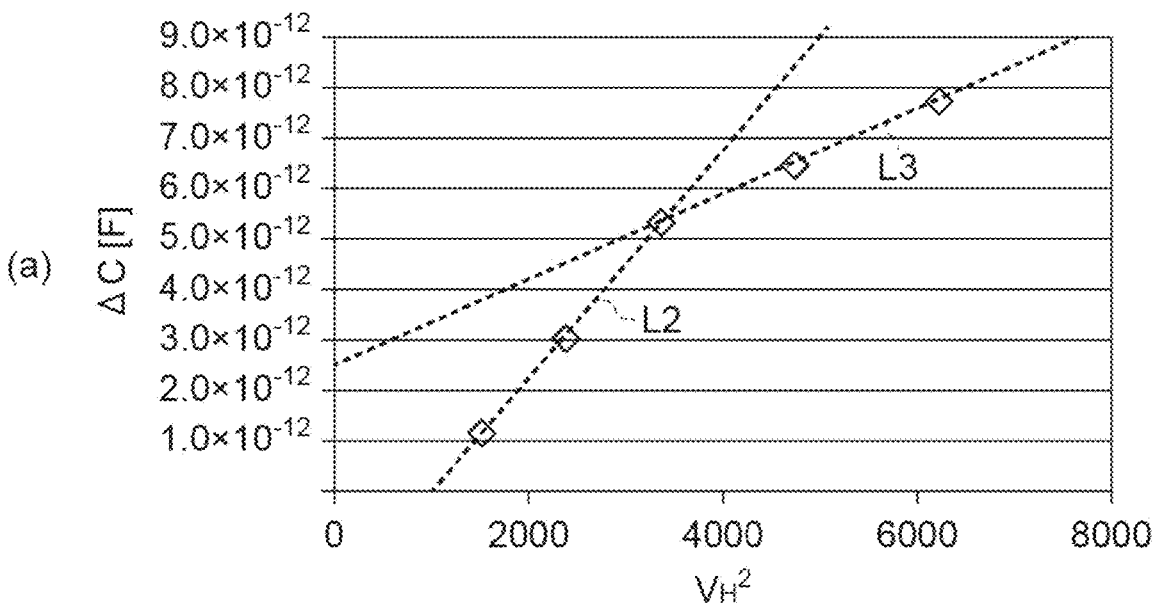
(b)
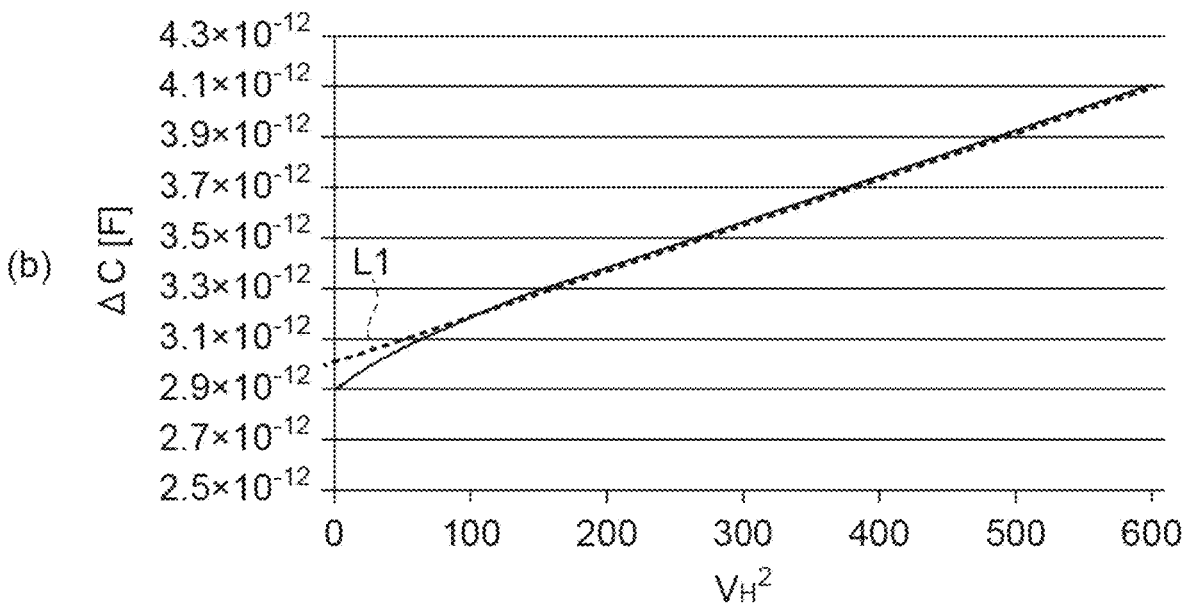

*Fig.31*
(a)
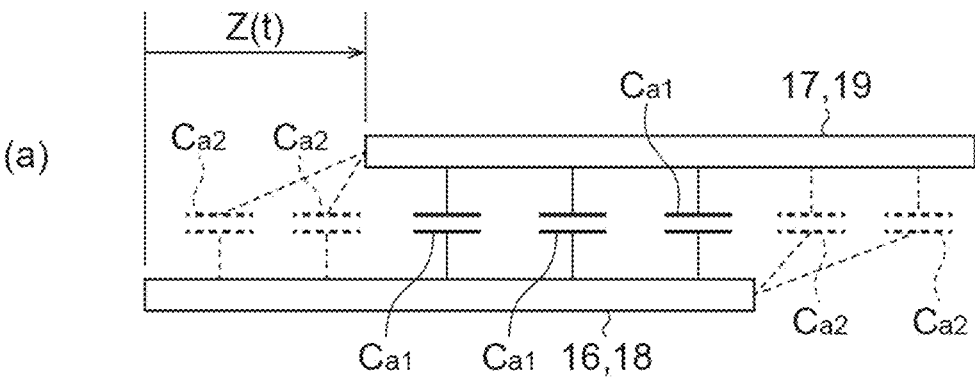
(b)
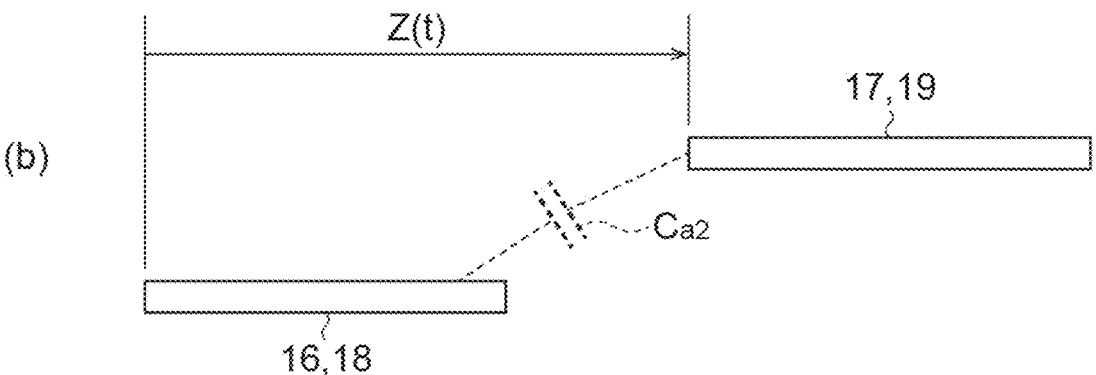

MEMS ACTUATOR, MEMS ACTUATOR DRIVE METHOD, AND MEMS ACTUATOR CONTROL PROGRAM

TECHNICAL FIELD

The present disclosure relates to a MEMS actuator, a MEMS actuator drive method, and a MEMS actuator control program.

BACKGROUND ART

Patent Literature 1 discloses a technique for a vibration mirror and a method for controlling the swing angle of the vibration mirror. The vibration mirror described in this literature is a micro optical system to which micromachining technology is applied, and deflects a light beam by vibrating the micro mirror substrate back and forth with a torsion beam as a rotation axis.

CITATION LIST

Patent Literature

Patent Literature 1: Japanese Unexamined Patent Publication No. 2004-069731

SUMMARY OF INVENTION

Technical Problem

Actuators by Micro Electro Mechanical Systems (MEMS) are used in the field of, for example, a vibration mirror for periodically displacing a minute movable portion. In such a technical field, when periodically displacing the movable portion, a drive voltage is periodically applied to the comb electrode of the MEMS actuator in synchronization with the displacement cycle. Then, by matching the frequency of the drive voltage with the resonance frequency of the movable portion, the movable portion can be displaced by the maximum amplitude.

However, the resonance frequency of the movable portion in the MEMS actuator fluctuates due to changes in temperature, humidity, and the like. If the frequency of the drive voltage deviates from the resonance frequency of the movable portion due to the fluctuation in the resonance frequency of the movable portion, the operation of the movable portion at the maximum amplitude is adversely affected. In particular, when the MEMS actuator has a configuration in which the maximum amplitude of the movable portion is large, such as a configuration in which the elastic coefficient of a portion that elastically supports the movable portion is small, the non-linearity of the amplitude with respect to the frequency increases. Therefore, even if the frequency of the drive voltage deviates slightly from the resonance frequency of the movable portion, the amplitude is greatly reduced.

In addition, conventionally, there has been a technique for keeping the resonance frequency of the movable portion constant by controlling the temperature of the MEMS actuator to be constant. However, in such a technique, it is necessary to add a configuration for temperature control, which is an obstacle to the miniaturization of the MEMS actuator. In addition, it is not possible to suppress a fluctuation in the resonance frequency due to a change in humidity.

Therefore, it is an object of the present disclosure to provide a MEMS actuator, a MEMS actuator drive method, and a MEMS actuator control program capable of bringing the frequency of a drive voltage close to the resonance frequency regardless of a fluctuation in the resonance frequency of a movable portion.

Solution to Problem

A MEMS actuator according to an embodiment includes: a base portion; a movable portion supported so as to be elastically displaceable with respect to the base portion; a fixed comb electrode including a plurality of first comb fingers and provided to the base portion; a movable comb electrode that includes a plurality of second comb fingers and drives the movable portion by an electrostatic force generated between the fixed comb electrode and the movable comb electrode, the plurality of first comb fingers and the plurality of second comb fingers being alternately arranged; a drive circuit that applies a drive voltage having a time waveform, which periodically repeats rising and falling and includes a period to be a constant voltage after the rising and before the falling, between the fixed comb electrode and the movable comb electrode; and a timing detection circuit that generates a capacitance derivative signal indicating a derivative value of a capacitance between the fixed comb electrode and the movable comb electrode by converting a current signal, which is output from the fixed comb electrode or the movable comb electrode within the period due to a change in the capacitance, into a voltage signal and detects a timing when the capacitance derivative signal reaches a threshold value. The drive circuit controls a relationship between the timing detected by the timing detection circuit and a timing of the falling to be constant.

A MEMS actuator according to another embodiment includes: a base portion; a movable portion supported so as to be elastically displaceable with respect to the base portion; a first fixed comb electrode including a plurality of first comb fingers and provided to the base portion; a first movable comb electrode that includes a plurality of second comb fingers and drives the movable portion by an electrostatic force generated between the first fixed comb electrode and the first movable comb electrode, the plurality of first comb fingers and the plurality of second comb fingers being alternately arranged; a second fixed comb electrode including a plurality of third comb fingers and provided to the base portion; a second movable comb electrode including a plurality of fourth comb fingers, the plurality of third comb fingers and the plurality of fourth comb fingers being alternately arranged; a drive circuit that applies a drive voltage having a time waveform periodically repeating rising and falling between the first fixed comb electrode and the first movable comb electrode; and a timing detection circuit that applies a voltage including a period to be a constant voltage excluding 0 V between the second fixed comb electrode and the second movable comb electrode, generates a capacitance derivative signal indicating a derivative value of a capacitance between the second fixed comb electrode and the second movable comb electrode by converting a current signal, which is output from the second fixed comb electrode or the second movable comb electrode within the period due to a change in the capacitance, into a voltage signal, and detects a timing when the capacitance derivative signal reaches a threshold value. The drive circuit controls a relationship between the timing detected by the timing detection circuit and a timing of the falling to be constant.

A method for driving a MEMS actuator according to an embodiment is a MEMS actuator drive method. The MEMS actuator includes: a base portion; a movable portion supported so as to be elastically displaceable with respect to the base portion; a fixed comb electrode including a plurality of first comb fingers and provided to the base portion; and a movable comb electrode including a plurality of second comb fingers and driving the movable portion by an electrostatic force generated between the fixed comb electrode and the movable comb electrode, the plurality of first comb fingers and the plurality of second comb fingers being alternately arranged. The drive method includes a drive step for applying a drive voltage having a time waveform, which periodically repeats rising and falling and includes a period to be a constant voltage after the rising and before the falling, between the fixed comb electrode and the movable comb electrode. In the drive step, a capacitance derivative signal indicating a derivative value of a capacitance between the fixed comb electrode and the movable comb electrode is generated by converting a current signal, which is output from the fixed comb electrode or the movable comb electrode within the period due to a change in the capacitance, into a voltage signal, a timing when the capacitance derivative signal reaches a threshold value is detected, and a relationship between the timing and a timing of the falling is controlled to be constant.

A method for driving a MEMS actuator according to another embodiment is a MEMS actuator drive method. The MEMS actuator includes: a base portion; a movable portion supported so as to be elastically displaceable with respect to the base portion; a first fixed comb electrode including a plurality of first comb fingers and provided to the base portion; a first movable comb electrode including a plurality of second comb fingers and driving the movable portion by an electrostatic force generated between the first fixed comb electrode and the first movable comb electrode, the plurality of first comb fingers and the plurality of second comb fingers being alternately arranged; a second fixed comb electrode including a plurality of third comb fingers and provided to the base portion; and a second movable comb electrode including a plurality of fourth comb fingers, the plurality of third comb fingers and the plurality of fourth comb fingers being alternately arranged. The drive method includes a drive step for applying a drive voltage having a time waveform periodically repeating rising and falling between the first fixed comb electrode and the first movable comb electrode. In the drive step, a voltage including a period to be a constant voltage excluding 0 V is applied between the second fixed comb electrode and the second movable comb electrode, a capacitance derivative signal indicating a derivative value of a capacitance between the second fixed comb electrode and the second movable comb electrode is generated by converting a current signal, which is output from the second fixed comb electrode or the second movable comb electrode within the period due to a change in the capacitance, into a voltage signal, a timing when the capacitance derivative signal reaches a threshold value is detected, and a relationship between the timing and a timing of the falling is controlled to be constant.

Advantageous Effects of Invention

According to the present disclosure, it is possible to provide a MEMS actuator, a MEMS actuator drive method, and a MEMS actuator control program capable of bringing the frequency of the drive voltage close to the resonance frequency regardless of the fluctuation in the resonance frequency of the movable portion.

BRIEF DESCRIPTION OF DRAWINGS

FIG. 2 is a cross-sectional view taken along the line II-II of FIG. 1.

FIG. 17(a) is a circuit diagram showing a clamp circuit 125 in this modification example, and FIG. 17(b) is a circuit diagram showing a general protection circuit 126 provided in an operational amplifier.

FIG. 19 is a diagram illustrating the operation of the second modification example, where FIG. 19(a) shows the current-voltage conversion circuit 123B shown in FIG. 18 in a simplified manner and FIG. 19(b) is a graph showing a correlation between the current signal J1 and the capacitance derivative signal Vout.

FIG. 20 is a diagram illustrating the operation of the second modification example, where FIG. 20(a) shows the current-voltage conversion circuit 123B shown in FIG. 18 in a simplified manner and FIG. 20(b) is a graph showing a correlation between the current signal J1 and the capacitance derivative signal Vout.

FIG. 21 is a diagram illustrating the operation of the second modification example, where FIG. 21(a) shows the current-voltage conversion circuit 123B shown in FIG. 18 in a simplified manner and FIG. 21(b) is a graph showing a correlation between the current signal J1 and the capacitance derivative signal Vout.

FIG. 28(a) is a diagram schematically showing a capacitance C1 generated between a first fixed comb electrode 83 and a movable comb electrode 82 and a capacitance C2 generated between a second fixed comb electrode 84 and the movable comb electrode 82 and FIG. 28(b) is a circuit diagram showing the current-voltage conversion circuit 123 connected to the capacitors C1 and C2.

FIG. 30(a) is a graph showing the relationship between $(V_H)^2$ and the fluctuation width $\Delta C$ of the capacitance $C_a$ in the first embodiment and FIG. 30(b) is a graph showing the relationship between $(V_H)^2$ and the fluctuation width $\Delta C$ of the capacitances C1 and C2 in the second embodiment.

FIG. 31 is a diagram schematically showing a fixed comb electrode 16 (18) and a movable comb electrode 17 (19) in the first embodiment.

DESCRIPTION OF EMBODIMENTS

Figure 1:
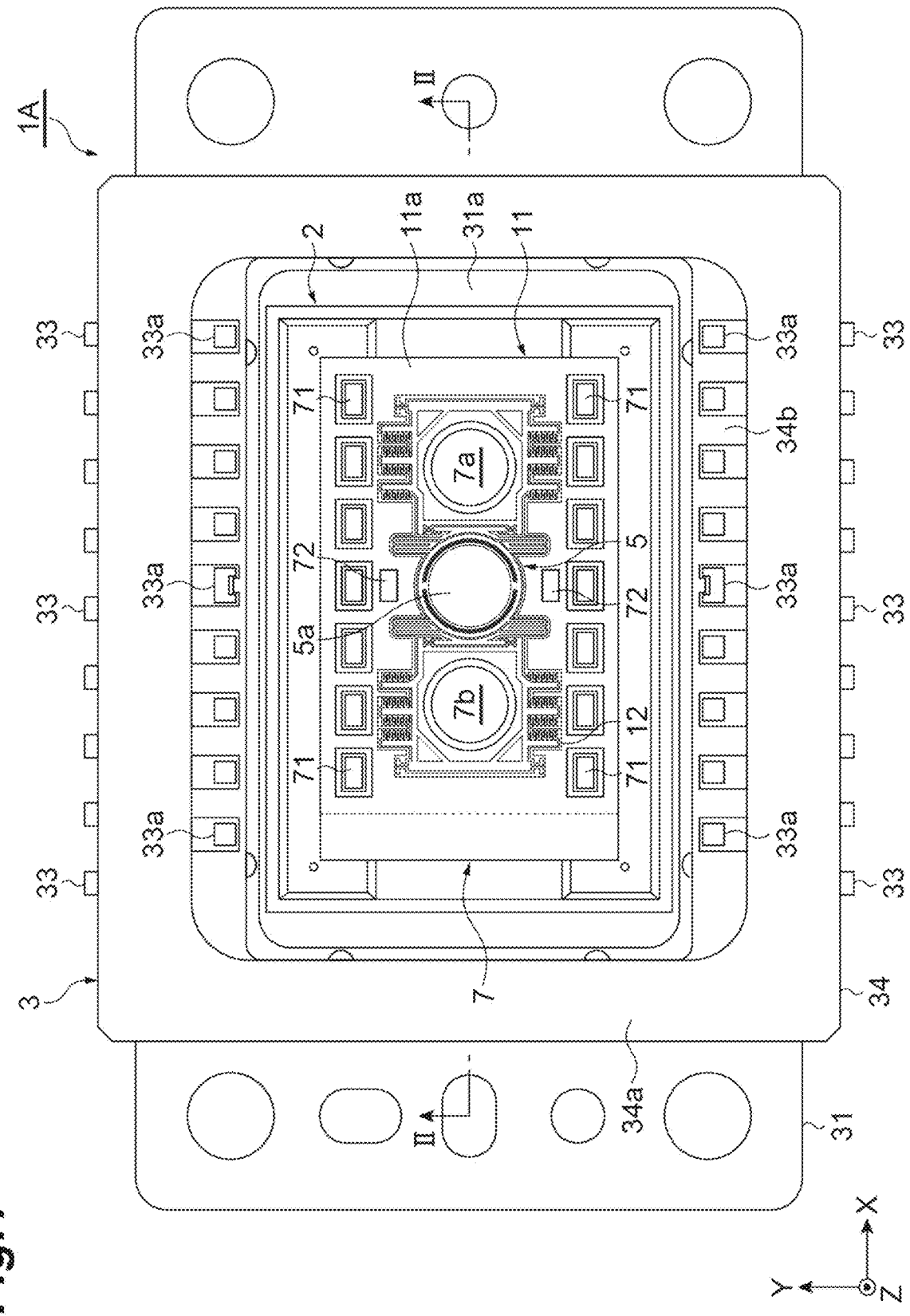
FIG. 1 is a plan view showing the configuration of an optical module 1A including a MEMS actuator.

A first MEMS actuator according to an embodiment includes: a base portion; a movable portion supported so as to be elastically displaceable with respect to the base portion; a fixed comb electrode including a plurality of first comb fingers and provided to the base portion; a movable comb electrode that includes a plurality of second comb fingers and drives the movable portion by an electrostatic force generated between the fixed comb electrode and the movable comb electrode, the plurality of first comb fingers and the plurality of second comb fingers being alternately arranged; a drive circuit that applies a drive voltage having a time waveform, which periodically repeats rising and falling and includes a period to be a constant voltage after the rising and before the falling, between the fixed comb electrode and the movable comb electrode; and a timing detection circuit that generates a capacitance derivative signal indicating a derivative value of a capacitance between the fixed comb electrode and the movable comb electrode by converting a current signal, which is output from the fixed comb electrode or the movable comb electrode within the period due to a change in the capacitance, into a voltage signal and detects a timing when the capacitance derivative signal reaches a threshold value. The drive circuit controls a relationship between the timing detected by the timing detection circuit and a timing of the falling to be constant.

In addition, a method for driving a first MEMS actuator according to an embodiment is a MEMS actuator drive method. The MEMS actuator includes: a base portion; a movable portion supported so as to be elastically displaceable with respect to the base portion; a fixed comb electrode including a plurality of first comb fingers and provided to the base portion; and a movable comb electrode including a plurality of second comb fingers and driving the movable portion by an electrostatic force generated between the fixed comb electrode and the movable comb electrode, the plurality of first comb fingers and the plurality of second comb fingers being alternately arranged. The drive method includes a drive step for applying a drive voltage having a time waveform, which periodically repeats rising and falling and includes a period to be a constant voltage after the rising and before the falling, between the fixed comb electrode and the movable comb electrode. In the drive step, a capacitance derivative signal indicating a derivative value of a capacitance between the fixed comb electrode and the movable comb electrode is generated by converting a current signal, which is output from the fixed comb electrode or the movable comb electrode within the period due to a change in the capacitance, into a voltage signal, a timing when the capacitance derivative signal reaches a threshold value is detected, and a relationship between the timing and a timing of the falling is controlled to be constant.

In the MEMS actuator and the drive method, a drive voltage having a time waveform periodically repeating rising and falling is applied between the fixed comb electrode and the movable comb electrode. Therefore, by bringing the frequency of the drive voltage close to the resonance frequency of the movable portion, the amplitude of the movable portion can be brought close to the maximum amplitude. At this time, due to the change in the capacitance between the fixed comb electrode and the movable comb electrode, a current signal is output from the fixed comb electrode or the movable comb electrode. When the time waveform of the drive voltage includes a period to be a constant voltage (excluding 0 V), the current signal within the period indicates a derivative value of the capacitance between the fixed comb electrode and the movable comb electrode. For example, when the movable portion passes through the center of the amplitude, the capacitance becomes a maximum, and the current value of this current signal momentarily becomes zero.

In the MEMS actuator and the drive method described above, the time waveform of the drive voltage includes a period to be a constant voltage after the rising and before the falling. Then, by converting the current signal output from the fixed comb electrode or the movable comb electrode within the period into a voltage signal, the capacitance derivative signal indicating the derivative value of the capacitance is generated. In addition, the timing when the capacitance derivative signal reaches a threshold value is detected, and the relationship between the timing and the timing of the falling is controlled to be constant. Therefore, since the position of the movable portion at the time of falling of the drive voltage can be made constant, the frequency of the drive voltage can be brought close to the resonance frequency regardless of the fluctuation in the resonance frequency of the movable portion.

The first MEMS actuator described above may further include a clamp circuit and/or a soft limiter circuit for shortening a fluctuation period of the capacitance derivative signal due to the rising of the drive voltage. In this case, by shortening the fluctuation period of the capacitance derivative signal at the rising of the drive voltage, it is possible to suppress a situation in which the detection of the timing when the capacitance derivative signal reaches a threshold value is interrupted by the fluctuation.

A second MEMS actuator according to another embodiment includes: a base portion; a movable portion supported so as to be elastically displaceable with respect to the base portion; a first fixed comb electrode including a plurality of first comb fingers and provided to the base portion; a first movable comb electrode that includes a plurality of second comb fingers and drives the movable portion by an electrostatic force generated between the first fixed comb electrode and the first movable comb electrode, the plurality of first comb fingers and the plurality of second comb fingers being alternately arranged; a second fixed comb electrode including a plurality of third comb fingers and provided to the base portion; a second movable comb electrode including a plurality of fourth comb fingers, the plurality of third comb fingers and the plurality of fourth comb fingers being alternately arranged; a drive circuit that applies a drive voltage having a time waveform periodically repeating rising and falling between the first fixed comb electrode and the first movable comb electrode; and a timing detection circuit that applies a voltage including a period to be a constant voltage excluding 0 V between the second fixed comb electrode and the second movable comb electrode, generates a capacitance derivative signal indicating a derivative value of a capacitance between the second fixed comb electrode and the second movable comb electrode by converting a current signal, which is output from the second fixed comb electrode or the second movable comb electrode within the period due to a change in the capacitance, into a voltage signal, and detects a timing when the capacitance derivative signal reaches a threshold value. The drive circuit controls a relationship between the timing detected by the timing detection circuit and a timing of the falling to be constant.

In addition, a method for driving a second MEMS actuator according to another embodiment is a MEMS actuator drive method. The MEMS actuator includes: a base portion; a movable portion supported so as to be elastically displaceable with respect to the base portion; a first fixed comb electrode including a plurality of first comb fingers and provided to the base portion; a first movable comb electrode including a plurality of second comb fingers and driving the movable portion by an electrostatic force generated between the first fixed comb electrode and the first movable comb electrode, the plurality of first comb fingers and the plurality of second comb fingers being alternately arranged; a second fixed comb electrode including a plurality of third comb fingers and provided on the base portion; and a second movable comb electrode including a plurality of fourth comb fingers, the plurality of third comb fingers and the plurality of fourth comb fingers being alternately arranged. The drive method includes a drive step for applying a drive voltage having a time waveform periodically repeating rising and falling between the first fixed comb electrode and the first movable comb electrode. In the drive step, a voltage including a period to be a constant voltage excluding 0 V is applied between the second fixed comb electrode and the second movable comb electrode, a capacitance derivative signal indicating a derivative value of a capacitance between the second fixed comb electrode and the second movable comb electrode is generated by converting a current signal, which is output from the second fixed comb electrode or the second movable comb electrode within the period due to a change in the capacitance, into a voltage signal, a timing when the capacitance derivative signal reaches a threshold value is detected, and a relationship between the timing and a timing of the falling is controlled to be constant.

In the MEMS actuator and the drive method, a drive voltage having a time waveform periodically repeating rising and falling is applied between the first fixed comb electrode and the first movable comb electrode. Therefore, by bringing the frequency of the drive voltage close to the resonance frequency of the movable portion, the amplitude of the movable portion can be brought close to the maximum amplitude. At this time, since the second movable comb electrode is also displaced together with the movable portion, a current signal is output from the second fixed comb electrode or the second movable comb electrode due to the change in the capacitance between the second fixed comb electrode and the second movable comb electrode. When a voltage including a period to be a constant voltage excluding 0 V is applied between the second fixed comb electrode and the second movable comb electrode, the current signal within the period indicates the derivative value of the capacitance between the second fixed comb electrode and the second movable comb electrode. For example, when the movable portion passes through the center of the amplitude, the capacitance becomes a maximum, and the current value of this current signal momentarily becomes zero.

In the MEMS actuator and the drive method described above, a voltage including a period to be a constant voltage excluding 0 V is applied between the second fixed comb electrode and the second movable comb electrode. Then, by converting the current signal output from the second fixed comb electrode or the second movable comb electrode within the period into a voltage signal, the capacitance derivative signal indicating the derivative value of the capacitance is generated. In addition, the timing when the capacitance derivative signal reaches a threshold value is detected, and the relationship between the timing and the timing of the falling is controlled to be constant. Therefore, since the position of the movable portion at the time of falling of the drive voltage can be made constant, the frequency of the drive voltage can be brought close to the resonance frequency regardless of the fluctuation in the resonance frequency of the movable portion.

In the second MEMS actuator described above, a distance between the second movable comb electrode and the movable portion may be shorter than a distance between the first movable comb electrode and the movable portion. In this case, since the amplitude of the second movable comb electrode can be made larger, it is possible to improve the detection accuracy of the timing when the capacitance derivative signal reaches a threshold value.

In the first and second MEMS actuators described above, the drive circuit may match the falling timing with the timing when the capacitance derivative signal reaches the threshold value. Similarly, in the drive step of the first and second drive methods described above, the falling timing may be made to match the timing when the capacitance derivative signal reaches the threshold value. For example, in these manners, it is possible to control the relationship between the timing when the capacitance derivative signal reaches the threshold value and the falling timing to be constant.

In the first and second MEMS actuators described above, the drive circuit may shift the falling timing to a predetermined time after the timing when the capacitance derivative signal reaches the threshold value. Similarly, in the drive step of the first and second drive methods described above, the falling timing may be shifted to a predetermined time after the timing when the capacitance derivative signal reaches the threshold value. For example, in these manners, it is possible to control the relationship between the timing when the capacitance derivative signal reaches the threshold value and the falling timing to be constant. Further, since it can be confirmed that the capacitance derivative signal has reached the threshold value before the drive voltage drops (that is, the capacitance derivative signal disappears), the timing when the capacitance derivative signal reaches the threshold value can be detected more reliably.

In the first and second MEMS actuators described above, the threshold value may be a value corresponding to a case where the current signal is zero. Similarly, in the first and second drive methods described above, the threshold value may be a value corresponding to a case where the current signal is zero. In this case, it is possible to accurately detect the timing when the movable comb electrode and the fixed comb electrode are closest to each other (in an example, the timing suitable for the falling of the drive voltage).

In the first and second MEMS actuators described above, the time waveform of the drive voltage may periodically include a rectangular wave with the rising and the falling, and a duty ratio of the drive voltage may be 20% or more and less than 50%. Similarly, in the first and second drive methods described above, the time waveform of the drive voltage may periodically include a rectangular wave with the rising and the falling, and a duty ratio of the drive voltage may be 20% or more and less than 50%. Assuming that the duty ratio of the drive voltage is 50%, there is a possibility that electrostatic attraction is applied at the timing when the movable comb electrode and the fixed comb electrode move away from each other due to a control error or the like. This leads to a decrease in the amplitude of the movable portion. By setting the duty ratio of the drive voltage to less than 50%, such a possibility can be reduced. In addition, by setting the duty ratio of the drive voltage to 20% or more, sufficient electrostatic attraction can be applied between the movable comb electrode and the fixed comb electrode.

In the first and second MEMS actuators described above, the timing detection circuit may include a comparator for comparing the capacitance derivative signal with the threshold value. Similarly, in the drive step of the first and second drive methods described above, a comparison between the capacitance derivative signal and the threshold value may be performed by using a comparator. In this case, since the timing when the capacitance derivative signal reaches the threshold value can be detected by a simple circuit, it is possible to contribute to the miniaturization and cost reduction of the MEMS actuator.

In the first and second MEMS actuators described above, the timing detection circuit may include a transimpedance amplifier for converting the current signal into the voltage signal. Similarly, in the drive step of the first and second drive methods described above, the current signal may be converted into the voltage signal by using a transimpedance amplifier. In this case, for example, as compared with a case where a resistor (shunt resistor) is connected in series with the fixed comb electrode or the movable comb electrode and the current signal is converted into the voltage signal by using the voltage drop in the resistor, it is possible to reduce the fluctuation in the voltage between the comb electrodes and apply a desired voltage between the comb electrodes with high accuracy.

The first and second MEMS actuators described above may further include an integrator circuit for time-integrating the capacitance derivative signal. By time-integrating the capacitance derivative signal, the displacement amount of the movable portion in a predetermined period can be easily detected.

In the first and second MEMS actuators described above, the movable portion may be a vertical vibration type. When the movable comb electrode is provided in the movable portion in the vertical vibration type, regardless of the position of the movable portion where the movable comb electrode is provided, the moment of inertia that increases is constant, and the amount of decrease in the resonance frequency is also constant. Therefore, since the number of comb fingers can be increased, a large capacitance value can be obtained. In addition, in the vertical vibration method, the speed of the movable portion is the fastest at the timing when the capacitance value is the largest (the timing when the capacitance derivative value is zero). For this reason, the time change of the capacitance derivative value increases. From the above, in the vertical vibration method, high timing detection accuracy is obtained, and accordingly, it is possible to relatively easily match the timing when the movable portion passes through a predetermined position with the falling timing of the drive signal.

In the first and second MEMS actuators described above, the movable portion may be a slide type. Even in this case, the effects of the first and second MEMS actuators described above can be appropriately suitably achieved.

A first MEMS actuator control program according to an embodiment is a program for causing a computer to execute a process for controlling the drive circuit of any of the MEMS actuators described above, and controls rising and falling timings of the drive voltage output from the drive circuit while controlling the relationship between the timing detected by the timing detection circuit and the falling timing to be constant. In addition, a second MEMS actuator control program according to an embodiment is a program for causing a computer to execute a process for realizing the drive step in the drive method according to any of the drive methods described above, and controls rising and falling timings of the drive voltage while controlling the relationship between the timing when the capacitance derivative signal reaches the threshold value and the falling timing to be constant.

Hereinafter, specific examples of the MEMS actuator, the MEMS actuator drive method, and the MEMS actuator control program of the present disclosure will be described with reference to the diagrams. In addition, the invention is not limited to these examples but is defined by the claims, and is intended to include all modifications within the meaning and scope equivalent to the claims. In the following description, in the description of the diagrams, the same elements are denoted by the same reference numerals, and the repeated description thereof will be omitted.

First Embodiment

FIG. 1 is a plan view showing the configuration of an optical module 1A including a MEMS actuator. FIG. 2 is a cross-sectional view taken along the line II-II of FIG. 1. The optical module 1A can be used in an optical device such as a Fourier Transform Infrared Spectrometer (FTIR), for example. As shown in FIGS. 1 and 2, the optical module 1A of the present embodiment includes a mirror unit 2 and a package 3 in which the mirror unit 2 is housed. The package 3 has a support 31. The mirror unit 2 is arranged on one side of the support 31 in the Z-axis direction, and is attached to the support 31 by, for example, an adhesive. The support 31 is formed of, for example, copper tungsten, and has, for example, a rectangular plate shape. The mirror unit 2 includes a movable mirror 5 that moves along the Z-axis direction and a fixed mirror 6 whose position is fixed. In the optical module 1A, an interference optical system can be formed by a beam splitter unit (not shown), the movable mirror 5, and the fixed mirror 6. The interference optical system is, for example, a Michelson interference optical system.

The mirror unit 2 includes the fixed mirror 6, a mirror device 7, an optical functional member 8, and a stress reduction substrate 9. The mirror device 7 is an example of the MEMS actuator in the present embodiment, and includes a base (base portion) 11, the movable mirror 5 (movable portion), and a drive unit 12.

The base 11 has a main surface 11a and a back surface 11b on a side opposite to the main surface 11a. The base 11 has, for example, a rectangular plate shape, and the size of the planar shape thereof is, for example, 10 mm in the lateral direction and 15 mm in the longitudinal direction. The thickness of the base 11 is, for example, 0.35 mm. The movable mirror 5 has a mirror surface 5a and a mirror support portion 5b on which the mirror surface 5a is arranged. The movable mirror 5 is a movable portion using a vertical vibration method, and is elastically supported with respect to the base 11 so as to be displaceable along the Z-axis direction perpendicular to the main surface 11a. The drive unit 12 generates a driving force for displacing the movable mirror 5 along the Z-axis direction.

A pair of light passing portions 7a and 7b are provided in the mirror device 7. The pair of light passing portions 7a and 7b are arranged on both sides of the movable mirror 5 in the X-axis direction.

Figure 3:
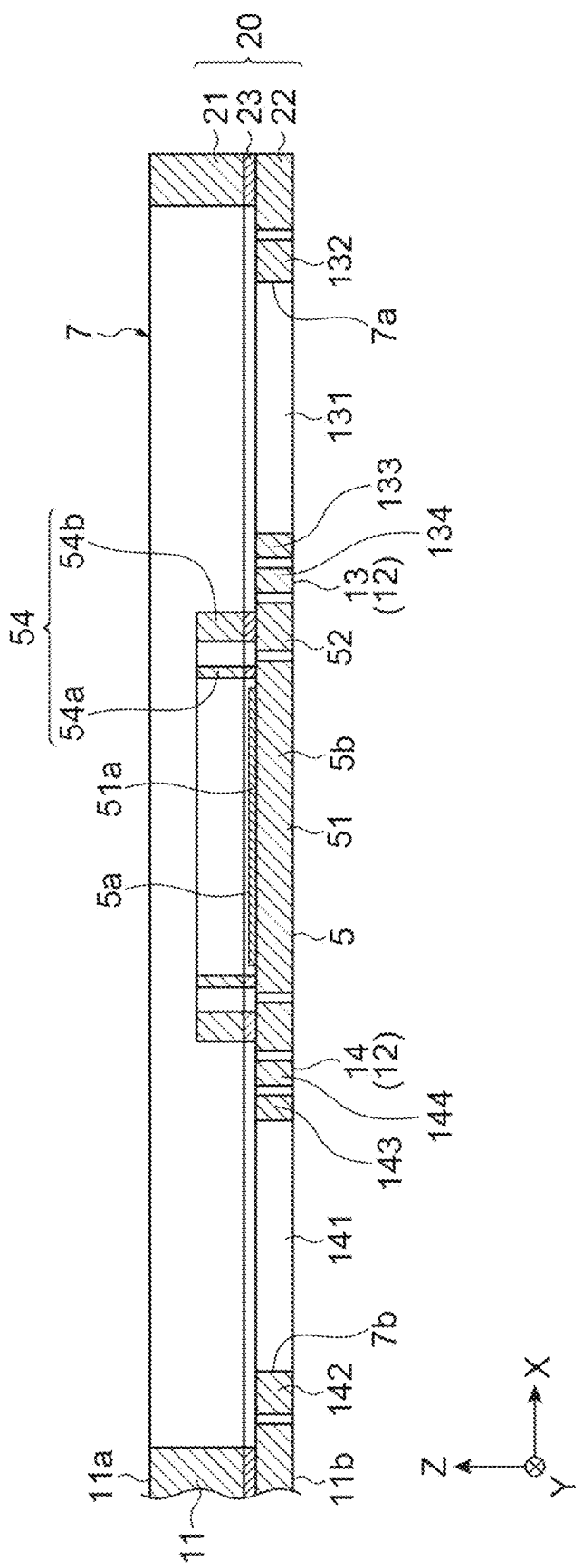
FIG. 3 is a schematic cross-sectional view of a mirror device 7 shown in FIG. 1.
Figure 4:
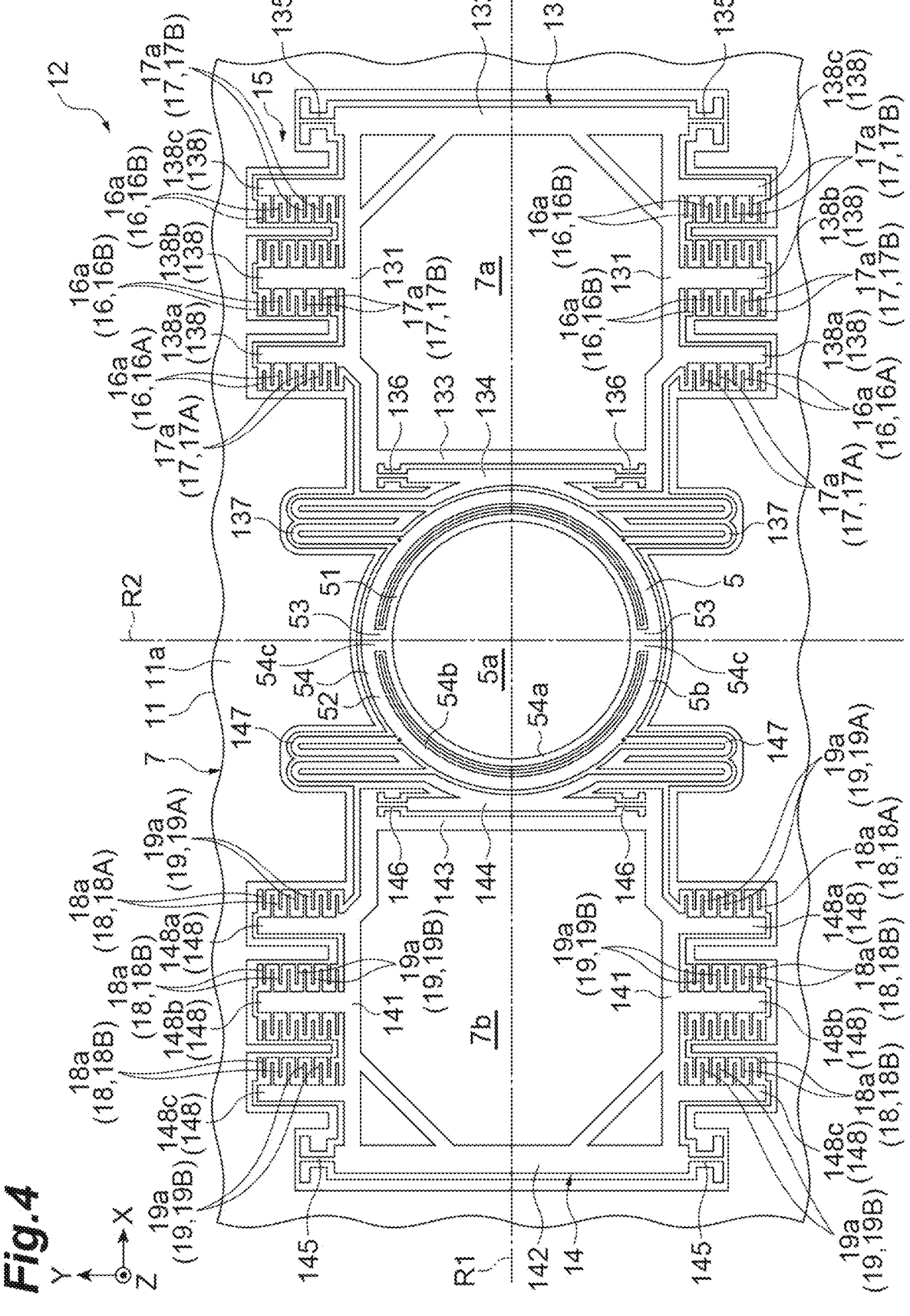
FIG. 4 is an enlarged plan view of the mirror device 7 shown in FIG. 1.

Here, the configuration of the mirror device 7 will be described in detail with reference to FIGS. 2, 3 and 4. FIG. 3 is a schematic cross-sectional view of the mirror device 7 shown in FIG. 1. FIG. 3 schematically shows the mirror device 7 in a state in which the dimension in the Z-axis direction is enlarged more than the actual size. FIG. 4 is an enlarged plan view of the mirror device 7 shown in FIG. 1.

The base 11, the mirror support portion 5b of the movable mirror 5, and the drive unit 12 are formed by an SOI (Silicon On Insulator) substrate 20. The mirror device 7 is formed, for example, in a rectangular plate shape. The SOI substrate 20 has a support layer 21, a device layer 22, and an intermediate layer 23. The support layer 21 and the device layer 22 are silicon layers. The intermediate layer 23 is an insulating layer arranged between the support layer 21 and the device layer 22. The SOI substrate 20 has the support layer 21, the intermediate layer 23, and the device layer 22 in this order from one side in the Z-axis direction.

The base 11 is formed by parts of the support layer 21, the device layer 22, and the intermediate layer 23. The main surface 11a of the base 11 is a surface of the support layer 21 on a side opposite to the intermediate layer 23. The back surface 11b of the base 11 is a surface of the device layer 22 on a side opposite to the intermediate layer 23. The support layer 21 forming the base 11 is thicker than the device layer 22 forming the base 11. The thickness of the support layer 21 forming the base 11 is, for example, about four times the thickness of the device layer 22 forming the base 11. In the mirror unit 2, as shown in FIG. 2, the back surface 11b of the base 11 and a surface 8a of the optical functional member 8 are bonded to each other.

The movable mirror 5 is arranged with the intersection of an axis line R1 and an axis line R2 as its center position (center of gravity position). The axis line R1 is a straight line extending in the X-axis direction. The axis line R2 is a straight line extending in the Y-axis direction. When viewed from the Z-axis direction, the mirror device 7 has a shape approximately axisymmetric with respect to each of the axis line R1 and the axis line R2. The mirror support portion 5b of the movable mirror 5 has an arrangement portion 51, a frame portion 52, a pair of connection portions 53, and a rib portion 54. The arrangement portion 51, the frame portion 52, and the pair of connection portions 53 are formed by a part of the device layer 22. The arrangement portion 51 has a circular shape when viewed from the Z-axis direction. A metal film is provided on a surface 51a of the arrangement portion 51 on one side in the Z-axis direction, and the surface of the metal film is the mirror surface 5a. The mirror surface 5a extends vertically in the Z-axis direction and has a circular shape. The surface 51a of the arrangement portion 51 is a surface of the device layer 22 on the intermediate layer 23 side.

The frame portion 52 extends in an annular shape when viewed from the Z-axis direction, and surrounds the arrangement portion 51 at a distance from the arrangement portion 51. Each of the pair of connection portions 53 connects the arrangement portion 51 and the frame portion 52 to each other. The pair of connection portions 53 are arranged on both sides of the arrangement portion 51 in the Y-axis direction.

The rib portion 54 is formed by the support layer 21 and the intermediate layer 23 arranged on the device layer 22. The rib portion 54 has an inner rib portion 54a, an outer rib portion 54b, and a pair of connecting rib portions 54c. The inner rib portion 54a is arranged on the surface of the arrangement portion 51 on one side in the Z-axis direction. The inner rib portion 54a surrounds the mirror surface 5a when viewed from the Z-axis direction. The outer rib portion 54b is arranged on the surface of the frame portion 52 on one side in the Z-axis direction. The outer rib portion 54b surrounds the inner rib portion 54a when viewed from the Z-axis direction, and surrounds the mirror surface 5a. The pair of connecting rib portions 54c are arranged on the surfaces of the pair of connection portions 53 on one side in the Z-axis direction. Each connecting rib portion 54c connects the inner rib portion 54a and the outer rib portion 54b to each other.

The drive unit 12 has a first elastic support portion 13, a second elastic support portion 14, and an actuator portion 15. The first elastic support portion 13, the second elastic support portion 14, and the actuator portion 15 are formed by a part of the device layer 22.

Each of the first elastic support portion 13 and the second elastic support portion 14 is connected between the base 11 and the movable mirror 5. The first elastic support portion 13 and the second elastic support portion 14 elastically support the movable mirror 5 so that the movable mirror 5 (mirror support portion 5*b*) can be displaced along the Z-axis direction (direction crossing the mirror surface 5*a*).

The first elastic support portion 13 includes a pair of levers 131, a first link member 132, a second link member 133, an intermediate member 134, a pair of first torsion bars 135, a pair of second torsion bars 136, a pair of non-linearity reduction springs 137, and a plurality of electrode support portions 138.

The pair of levers 131 are arranged on both sides of the light passing portion 7*a* in the Y-axis direction, and face each other in the Y-axis direction. Each lever 131 has a plate shape extending along a plane perpendicular to the Z-axis direction. The first link member 132 is hung between the end portions of the pair of levers 131 on a side opposite to the movable mirror 5. The first link member 132 has a plate shape extending along a plane perpendicular to the Z-axis direction, and extends along the Y-axis direction. The second link member 133 is hung between the end portions of the pair of levers 131 on the movable mirror 5 side. The second link member 133 has a plate shape extending along a plane perpendicular to the Z-axis direction, and extends along the Y-axis direction.

The pair of levers 131, the first link member 132, and the second link member 133 define the light passing portion 7*a*. The light passing portion 7*a* is, for example, a cavity (hole). Alternatively, a light transmissive material may be arranged in the light passing portion 7*a*.

The intermediate member 134 has a plate shape extending along a plane perpendicular to the Z-axis direction, and extends along the Y-axis direction. The intermediate member 134 is arranged between the movable mirror 5 and the second link member 133 (in other words, between the movable mirror 5 and the light passing portion 7*a*). The intermediate member 134 is connected to the movable mirror 5 through the non-linearity reduction spring 137, as will be described later.

The pair of first torsion bars 135 are hung between one end portion of one lever 131 and the base 11 and between one end portion of the other lever 131 and the base 11, respectively. That is, the pair of first torsion bars 135 are connected between the pair of levers 131 and the base 11. Each first torsion bar 135 extends along the Y-axis direction. The pair of first torsion bars 135 are arranged on the same center line parallel to the Y-axis direction.

The pair of second torsion bars 136 are hung between the other end portion of one lever 131 and one end of the intermediate member 134 and between the other end portion of the other lever 131 and the other end of the intermediate member 134, respectively. That is, the pair of second torsion bars 136 are connected between the pair of levers 131 and the movable mirror 5. Each second torsion bar 136 extends along the Y-axis direction. The pair of second torsion bars 136 are arranged on the same center line parallel to the Y-axis direction.

The pair of non-linearity reduction springs 137 are connected between the movable mirror 5 and the intermediate member 134. That is, the pair of non-linearity reduction springs 137 are connected between the movable mirror 5 and the second torsion bar 136. Each non-linearity reduction spring 137 meanders and extends when viewed from the Z-axis direction. One end of each non-linearity reduction spring 137 is connected to the intermediate member 134, and the other end of each non-linearity reduction spring 137 is connected to the frame portion 52. The non-linearity reduction spring 137 is configured such that, when the movable mirror 5 is displaced in the Z-axis direction, the amount of deformation of the non-linearity reduction spring 137 around the Y-axis direction is smaller than the amount of deformation of each of the first torsion bar 135 and the second torsion bar 136 around the Y-axis direction and the amount of deformation of the non-linearity reduction spring 137 in the X-axis direction is larger than the amount of deformation of each of the first torsion bar 135 and the second torsion bar 136 in the X-axis direction. Therefore, since it is possible to suppress the non-linearity in the torsional deformation of the first torsion bar 135 and the second torsion bar 136, it is possible to suppress the degradation of the control characteristics of the movable mirror 5 due to the non-linearity.

The plurality of electrode support portions 138 include a pair of first electrode support portions 138*a*, a pair of second electrode support portions 138*b*, and a pair of third electrode support portions 138*c*. Each of the electrode support portions 138*a*, 138*b*, and 138*c* has a plate shape extending along a plane perpendicular to the Z-axis direction, and extends along the Y-axis direction. Each of the electrode support portions 138*a*, 138*b*, and 138*c* extends from the lever 131 toward the side opposite to the light passing portion 7*a*. The pair of first electrode support portions 138*a* are arranged on the same center line parallel to the Y-axis direction. The pair of second electrode support portions 138*b* are arranged on the same center line parallel to the Y-axis direction. The pair of third electrode support portions 138*c* are arranged on the same center line parallel to the Y-axis direction. In the X-axis direction, the first electrode support portion 138*a*, the second electrode support portion 138*b*, and the third electrode support portion 138*c* are arranged side by side in this order from the movable mirror 5 side.

The second elastic support portion 14 includes a pair of levers 141, a first link member 142, a second link member 143, an intermediate member 144, a pair of first torsion bars 145, a pair of second torsion bars 146, a pair of non-linearity reduction springs 147, and a plurality of electrode support portions 148.

The pair of levers 141 are arranged on both sides of the light passing portion 7*b* in the Y-axis direction, and face each other in the Y-axis direction. Each lever 141 has a plate shape extending along a plane perpendicular to the Z-axis direction. The first link member 142 is hung between the end portions of the pair of levers 141 on a side opposite to the movable mirror 5. The first link member 142 has a plate shape extending along a plane perpendicular to the Z-axis direction, and extends along the Y-axis direction. The second link member 143 is hung between the end portions of the pair of levers 141 on the movable mirror 5 side. The second link member 143 has a plate shape extending along a plane perpendicular to the Z-axis direction, and extends along the Y-axis direction.

The pair of levers 141, the first link member 142, and the second link member 143 define the light passing portion 7*b*. The light passing portion 7*b* is, for example, a cavity (hole). Alternatively, a light transmissive material may be arranged in the light passing portion 7*b*.

The intermediate member 144 has a plate shape extending along a plane perpendicular to the Z-axis direction, and extends along the Y-axis direction. The intermediate member 144 is arranged between the movable mirror 5 and the second link member 143 (in other words, between the movable mirror 5 and the light passing portion 7*b*). The intermediate member 144 is connected to the movable mirror 5 through the non-linearity reduction spring 147, as will be described later.

The pair of first torsion bars 145 are hung between one end portion of one lever 141 and the base 11 and between one end portion of the other lever 141 and the base 11, respectively. That is, the pair of first torsion bars 145 are connected between the pair of levers 141 and the base 11. Each first torsion bar 145 extends along the Y-axis direction. The pair of first torsion bars 145 are arranged on the same center line parallel to the Y-axis direction.

The pair of second torsion bars 146 are hung between the other end portion of one lever 141 and one end of the intermediate member 144 and between the other end portion of the other lever 141 and the other end of the intermediate member 144, respectively. That is, the pair of second torsion bars 146 are connected between the pair of levers 141 and the movable mirror 5. Each second torsion bar 146 extends along the Y-axis direction. The pair of second torsion bars 146 are arranged on the same center line parallel to the Y-axis direction.

The pair of non-linearity reduction springs 147 are connected between the movable mirror 5 and the intermediate member 144. That is, the pair of non-linearity reduction springs 147 are connected between the movable mirror 5 and the second torsion bar 146. Each non-linearity reduction spring 147 meanders and extends when viewed from the Z-axis direction. One end of each non-linearity reduction spring 147 is connected to the intermediate member 144, and the other end of each non-linearity reduction spring 147 is connected to the frame portion 52. The non-linearity reduction spring 147 is configured such that, when the movable mirror 5 is displaced in the Z-axis direction, the amount of deformation of the non-linearity reduction spring 147 around the Y-axis direction is smaller than the amount of deformation of each of the first torsion bar 145 and the second torsion bar 146 around the Y-axis direction and the amount of deformation of the non-linearity reduction spring 147 in the X-axis direction is larger than the amount of deformation of each of the first torsion bar 145 and the second torsion bar 146 in the X-axis direction. Therefore, since it is possible to suppress the non-linearity in the torsional deformation of the first torsion bar 145 and the second torsion bar 146, it is possible to suppress the degradation of the control characteristics of the movable mirror 5 due to the non-linearity.

The plurality of electrode support portions 148 include a pair of first electrode support portions 148a, a pair of second electrode support portions 148b, and a pair of third electrode support portions 148c. Each of the electrode support portions 148a, 148b, and 148c has a plate shape extending along a plane perpendicular to the Z-axis direction, and extends along the Y-axis direction. Each of the electrode support portions 148a, 148b, and 148c extends from the lever 141 toward the side opposite to the light passing portion 7b. The pair of first electrode support portions 148a are arranged on the same center line parallel to the Y-axis direction. The pair of second electrode support portions 148b are arranged on the same center line parallel to the Y-axis direction. The pair of third electrode support portions 148c are arranged on the same center line parallel to the Y-axis direction. In the X-axis direction, the first electrode support portion 148a, the second electrode support portion 148b, and the third electrode support portion 148c are arranged side by side in this order from the movable mirror 5 side.

The actuator portion 15 generates a driving force for displacing the movable mirror 5 along the Z-axis direction. The actuator portion 15 has fixed comb electrodes 16 and 18 and movable comb electrodes 17 and 19. The fixed comb electrodes 16 and 18 are provided on the base 11, and the positions of the fixed comb electrodes 16 and 18 are fixed by the base 11. The movable comb electrodes 17 and 19 are connected to the electrode support portions 138 and 148, respectively, and are provided so as to be displaceable in the Z direction relative to the fixed comb electrodes 16 and 18, respectively.

More specifically, the fixed comb electrode 16 is provided on a part of the surface of the device layer 22 of the base 11 facing the electrode support portion 138. The fixed comb electrode 16 has a plurality of fixed comb fingers (first comb fingers) 16a extending along a plane perpendicular to the Y-axis direction. These fixed comb fingers 16a are arranged side by side at predetermined distances therebetween in the Y-axis direction. The movable comb electrode 17 is provided on the surface of each electrode support portion 138 on the movable mirror 5 side. The movable comb electrode 17 has a plurality of movable comb fingers (second comb fingers) 17a extending along a plane perpendicular to the Y-axis direction. These movable comb fingers 17a are arranged side by side at predetermined distances therebetween in the Y-axis direction.

In the fixed comb electrode 16 and the movable comb electrode 17, a plurality of fixed comb fingers 16a and a plurality of movable comb fingers 17a are alternately arranged. That is, each fixed comb finger 16a of the fixed comb electrode 16 is located between the movable comb fingers 17a of the movable comb electrode 17. The fixed comb fingers 16a and the movable comb fingers 17a adjacent to each other face each other in the Y-axis direction. The distance between the fixed comb fingers 16a and the movable comb fingers 17a adjacent to each other is, for example, about several μm.

The fixed comb electrode 18 is provided on a part of the surface of the device layer 22 of the base 11 facing the electrode support portion 148. The fixed comb electrode 18 has a plurality of fixed comb fingers (first comb fingers) 18a extending along a plane perpendicular to the Y-axis direction. These fixed comb fingers 18a are arranged side by side at predetermined distances therebetween in the Y-axis direction. The movable comb electrode 19 is provided on the surface of each electrode support portion 148 on the movable mirror 5 side. The movable comb electrode 19 has a plurality of movable comb fingers (second comb fingers) 19a extending along a plane perpendicular to the Y-axis direction. These movable comb fingers 19a are arranged side by side at predetermined distances therebetween in the Y-axis direction.

In the fixed comb electrode 18 and the movable comb electrode 19, a plurality of fixed comb fingers 18a and a plurality of movable comb fingers 19a are alternately arranged. That is, each fixed comb finger 18a of the fixed comb electrode 18 is located between the movable comb fingers 19a of the movable comb electrode 19. The fixed comb fingers 18a and the movable comb fingers 19a adjacent to each other face each other in the Y-axis direction. The distance between the fixed comb fingers 18a and the movable comb fingers 19a adjacent to each other is, for example, about several μm.

As shown in FIG. 1, a plurality of electrode pads 71 are provided on the base 11. Each electrode pad 71 is arranged on the surface of the device layer 22 in an opening formed on the main surface 11a of the base 11 so as to reach the device layer 22. Some of the plurality of electrode pads 71 are electrically connected to the fixed comb electrode 16 or the fixed comb electrode 18 through the device layer 22. The other some of the plurality of electrode pads 71 are electrically connected to the movable comb electrode 17 or the movable comb electrode 19 through the first elastic support portion 13 or the second elastic support portion 14. In addition, a pair of electrode pads 72 used as ground electrodes are provided on the base 11. The pair of electrode pads 72 are arranged on the main surface 11a so as to be located on both sides of the movable mirror 5 in the Y-axis direction.

In the mirror device 7 having the above configuration, a drive voltage for displacing the movable mirror 5 along the Z-axis direction is input to the drive unit 12 through a lead pin 33. As a result, for example, an electrostatic force is generated between the fixed comb electrode 16 and the movable comb electrode 17 facing each other and between the fixed comb electrode 18 and the movable comb electrode 19 facing each other so that the movable mirror 5 is displaced to one side in the Z-axis direction. At this time, in the first elastic support portion 13 and the second elastic support portion 14, the first torsion bars 135 and 145 and the second torsion bars 136 and 146 are twisted to generate elastic force in the first elastic support portion 13 and the second elastic support portion 14. In the mirror device 7, by applying a periodic drive voltage to the drive unit 12, the movable mirror 5 is driven so as to reciprocate at its resonance frequency along the Z-axis direction. In this manner, the drive unit 12 functions as an electrostatic actuator.

FIG. 2 is referred to again. The optical functional member 8 has the surface 8a facing the back surface 11b of the base 11 and a back surface 8b on a side opposite to the surface 8a. The optical functional member 8 is integrally formed of a light transmissive material. The optical functional member 8 is formed in a rectangular plate shape by using, for example, glass, and has a size of, for example, a width of about 15 mm, a length of about 20 mm, and a thickness of about 4 mm. In addition, the material of the optical functional member 8 is selected according to the sensitivity wavelength of the optical module 1A so that, for example, glass is used when the sensitivity wavelength of the optical module 1A is in the near-infrared region and silicon is used when the sensitivity wavelength of the optical module 1A is in the mid-infrared region. The optical functional member 8 corrects the optical path difference generated between the light entering and exiting the movable mirror 5 and the light entering and exiting the fixed mirror 6. The surface 8a of the optical functional member 8 is bonded to the back surface 11b of the base 11 by direct bonding (for example, plasma-activated bonding, surface-activated bonding, atomic diffusion bonding, anode bonding, fusion bonding, and hydrophilized bonding).

The fixed mirror 6 is arranged on a side opposite to the mirror device 7 with respect to the optical functional member 8, and the position of the fixed mirror 6 with respect to the base 11 of the mirror device 7 is fixed. The fixed mirror 6 is formed on the back surface 8b of the optical functional member 8 by, for example, vapor deposition. The fixed mirror 6 has a mirror surface 6a perpendicular to the Z-axis direction. In the present embodiment, the mirror surface 5a of the movable mirror 5 and the mirror surface 6a of the fixed mirror 6 face one side in the Z-axis direction. The fixed mirror 6 reflects the light transmitted through the optical functional member 8.

The stress reduction substrate 9 is attached to the back surface 8b of the optical functional member 8 with the fixed mirror 6 interposed therebetween. The stress reduction substrate 9 is attached to the fixed mirror 6 by using, for example, an adhesive. The coefficient of thermal expansion of the stress reduction substrate 9 is closer to the coefficient of thermal expansion of the base 11 (more specifically, the coefficient of thermal expansion of the support layer 21) than the coefficient of thermal expansion of the optical functional member 8. In addition, the thickness of the stress reduction substrate 9 is closer to the thickness of the base 11 than the thickness of the optical functional member 8. The stress reduction substrate 9 is formed in a rectangular plate shape by using, for example, silicon, and has a size of, for example, a width of about 16 mm, a length of about 21 mm, and a thickness of about 0.65 mm.

As shown in FIGS. 1 and 2, the package 3 has the support 31, a plurality of lead pins 33, a frame body 34, and a light transmissive member 35. The frame body 34 is formed so as to surround the mirror unit 2 when viewed from the Z-axis direction, and is attached to a surface 31a of the support 31 by using an adhesive such as silver wax. The frame body 34 is formed of, for example, ceramic, and has, for example, a rectangular frame shape. An end surface 34a of the frame body 34 on a side opposite to the support 31 is located on a side opposite to the support 31 with respect to the virtual plane including the main surface 11a of the base 11.

The light transmissive member 35 is formed so as to close the opening of the frame body 34, and is attached to the end surface 34a of the frame body 34 by using, for example, an adhesive. The light transmissive member 35 is formed of a light transmissive material, and has, for example, a rectangular plate shape. Here, since the end surface 34a of the frame body 34 is located on the side opposite to the support 31 with respect to the virtual plane including the main surface 11a of the base 11, the light transmissive member 35 is spaced apart from the mirror device 7. Therefore, in the optical module 1A, when the movable mirror 5 reciprocates along the Z-axis direction, the movable mirror 5 and the drive unit 12 are prevented from coming into contact with the light transmissive member 35.

Each lead pin 33 is provided in the frame body 34 so that one end portion 33a is located inside the frame body 34 and the other end portion (not shown) is located outside the frame body 34. One end portion 33a of the lead pin 33 is electrically connected to the electrode pads 71 and 72 corresponding to the lead pin 33 in the mirror device 7 through a wire (not shown). In the optical module 1A, a drive voltage for displacing the movable mirror 5 along the Z-axis direction is input to the drive unit 12 through the plurality of lead pins 33. In the present embodiment, a stepped surface 34b extending in the X-axis direction is formed on both sides of the optical functional member 8 in the Y-axis direction, and one end portion 33a of each lead pin 33 is arranged on the stepped surface 34b. Each lead pin 33 extends in the Z-axis direction on both sides of the support 31 in the Y-axis direction, and the other end portion of each lead pin 33 is located below the support 31 in the Z-axis direction.

Figure 5:
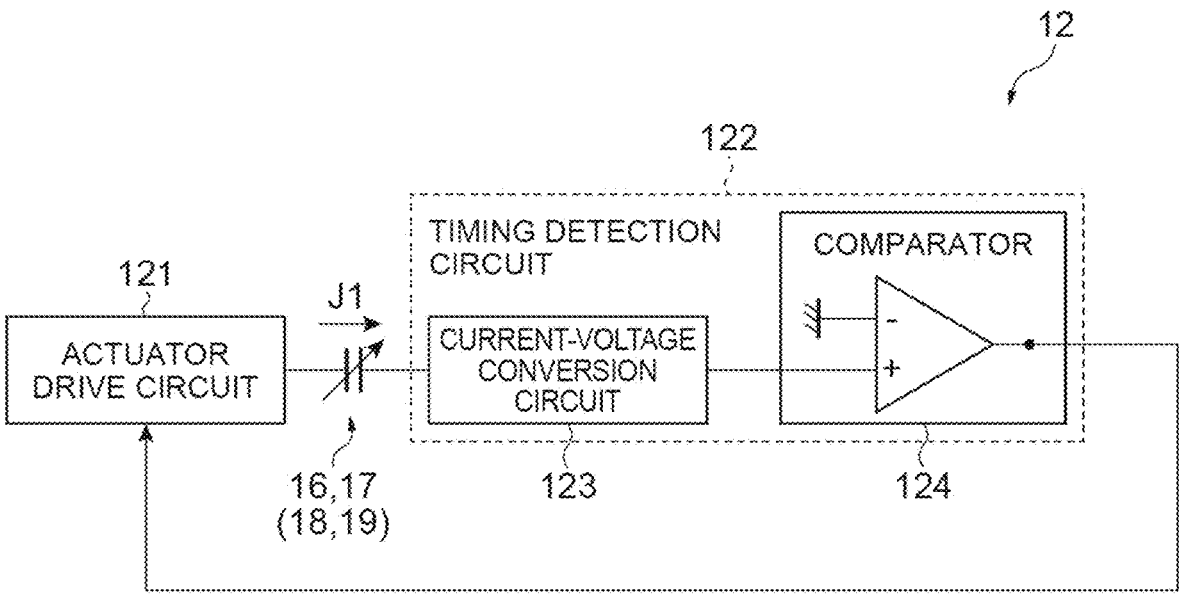
FIG. 5 is a diagram schematically showing the circuit configuration of a drive unit 12.

Subsequently, the drive unit 12 will be further described. FIG. 5 is a diagram schematically showing the circuit configuration of the drive unit 12. As shown in the diagram, the drive unit 12 includes an actuator drive circuit 121 and a timing detection circuit 122. In FIG. 5, the capacitance between the fixed comb electrodes 16 and 18 and the movable comb electrodes 17 and 19 is shown in a pseudo manner by a variable capacitance symbol.

The actuator drive circuit 121 is an example of a drive circuit in the present embodiment. The actuator drive circuit 121 applies a drive voltage between the fixed comb electrode 16 and the movable comb electrode 17 described above and between the fixed comb electrode 18 and the movable comb electrode 19 described above. The actuator drive circuit 121 includes, for example, a signal processing unit including an integrated circuit such as an FPGA (field-programmable gate array), a storage unit including a non-volatile memory such as an EEPROM (Electrically Erasable Programmable Read-Only Memory) electrically connected to the signal processing unit, and a high voltage generation circuit electrically connected to the signal processing unit. The signal processing unit generates a drive signal that is the basis of the drive voltage. The high voltage generation circuit generates a drive voltage based on the drive signal from the signal processing unit. The high voltage generation circuit is, for example, an HVIC (High Voltage IC).

Figure 6:
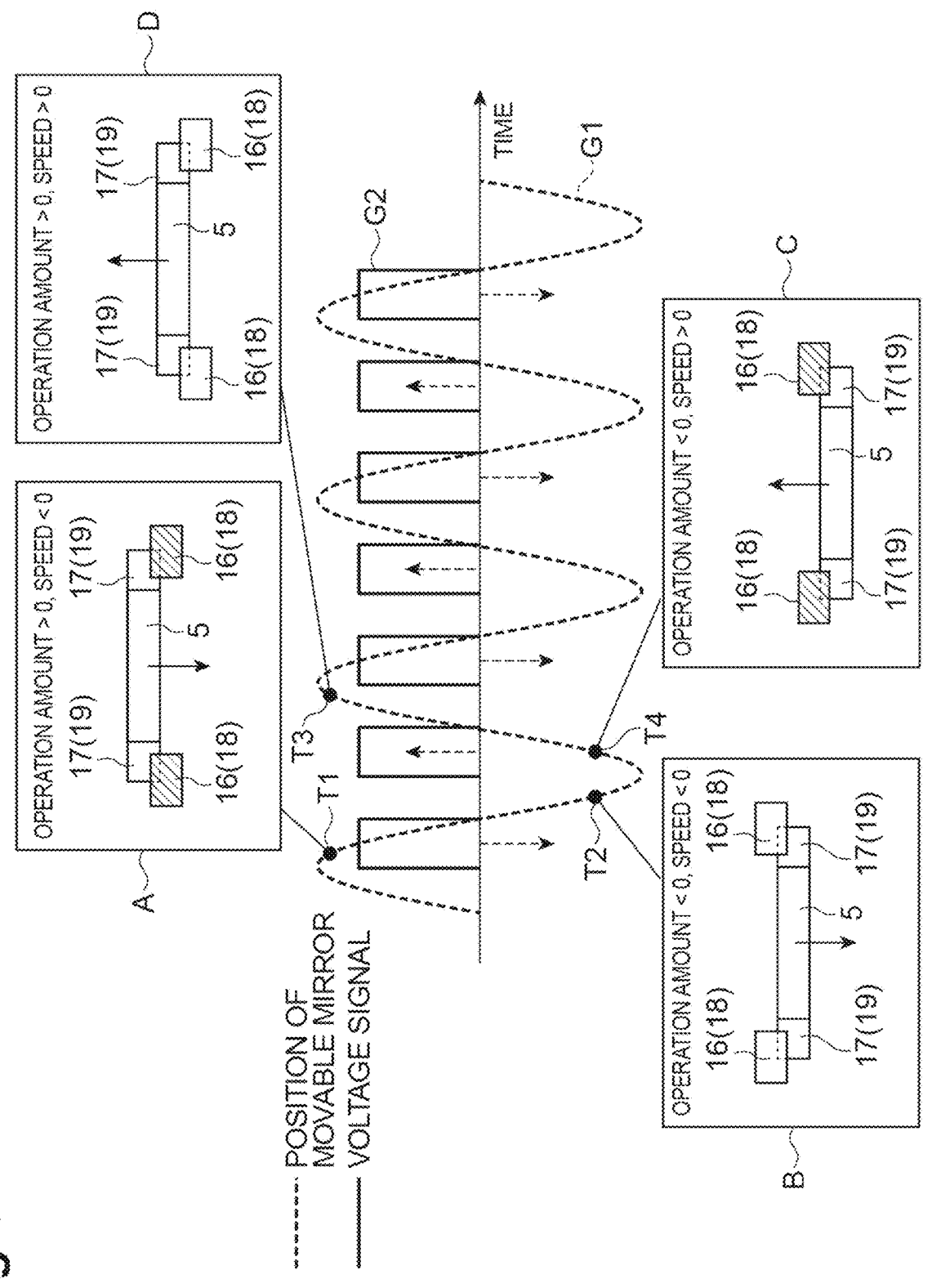
FIG. 6 is a diagram for explaining a drive voltage output from an actuator drive circuit 121.

FIG. 6 is a diagram for explaining a drive voltage output from the actuator drive circuit 121. FIG. 6 shows a graph G1 showing the time change of the position of the movable mirror 5 and a graph G2 showing the time waveform of the drive voltage. The horizontal axis of the graphs G1 and G2 indicate time. The vertical axis of the graph G1 indicates the position of the movable mirror 5 in the Z direction, and the vertical axis of the graph G2 indicates the magnitude of the voltage. In addition, in FIG. 6, FIGS. A to D showing the relative positional relationship between the fixed comb electrode 16 (18) and the movable comb electrode 17 (19) at the plurality of timings T1 to T4 are shown. As shown in FIG. 6, the actuator drive circuit 121 generates a drive voltage having a frequency that is twice the resonance frequency of the movable mirror 5. The drive voltage is a continuous pulse signal that repeats rising and falling at fixed periods, and in the present embodiment, is a rectangular wave having a duty ratio of 20% or more and less than 50%, for example.

The rising timing of the drive voltage is controlled to match or slightly lag behind the timing of the maximum point and the minimum point corresponding to the turning point in the time change of the position of the movable mirror 5. In addition, the falling timing of the drive voltage is controlled to match or be slightly delayed from the timing of the midpoint between the maximum point and the minimum point of the movable mirror 5. In addition, in FIG. 6, the solid arrow indicates the direction of movement of the movable mirror 5, and the broken arrow indicates the direction of the driving force applied to the movable mirror 5. In addition, the fixed comb electrode 16 (18) with hatching indicates a state in which a voltage is applied, and the fixed comb electrode 16 (18) without hatching indicates a state in which no voltage is applied.

In addition, the relationship between the frequency of the drive voltage and the amplitude of the movable mirror 5 can be obtained by actually operating the mirror device 7. Alternatively, the relationship between the frequency of the drive voltage and the amplitude of the movable mirror 5 may be predicted by numerical analysis, such as the Runge-Kutta method.

FIG. 5 is referred to again. The timing detection circuit 122 is provided in order to detect the timing when the displacement of the movable mirror 5 becomes zero (that is, the position of the movable mirror 5 is the midpoint between the maximum point and the minimum point) in the time change of the position of the movable mirror 5 (graph G1 in FIG. 6). In addition, when the displacement of the movable mirror 5 becomes zero, the fixed comb electrode 16 (18) and the movable comb electrode 17 (19) are closest to each other. The actuator drive circuit 121 brings the frequency of the drive voltage close to the resonance frequency of the movable mirror 5 by controlling the relationship between the timing detected by the timing detection circuit 122 and the falling timing of the drive voltage to be constant (preferably match each other).

The timing detection circuit 122 is electrically connected to one of the fixed comb electrode 16 (18) and the movable comb electrode 17 (19). The timing detection circuit 122 includes a current-voltage conversion circuit 123 and a comparator 124. The current-voltage conversion circuit 123 converts the current signal output from the fixed comb electrode 16 (18) or the movable comb electrode 17 (19) into a voltage signal. The signal output end of the current-voltage conversion circuit 123 is electrically connected to the signal input end of the comparator 124. The comparator 124 compares the voltage signal output from the current-voltage conversion circuit 123 with a predetermined threshold value (0 V in the diagram), and outputs a signal indicating the comparison result.

The signal output end of the comparator 124 is electrically connected to the actuator drive circuit 121. The actuator drive circuit 121 controls the relationship between the timing when the displacement of the movable mirror 5 becomes zero and the timing when the drive voltage falls to be constant based on the output signal from the comparator 124.

The actuator drive circuit 121 is controlled by using, for example, a computer provided outside the optical module 1A. This computer includes a central processing unit (CPU), a volatile memory (RAM), and a non-volatile memory (ROM), and controls the actuator drive circuit 121 by executing a program stored in advance in the ROM. The program controls the rising and falling timings of the drive voltage output from the actuator drive circuit 121 while controlling the relationship between the timing when the displacement of the movable mirror 5 detected by the timing detection circuit 122 becomes zero and the timing when the drive voltage falls to be constant.

Figure 7:
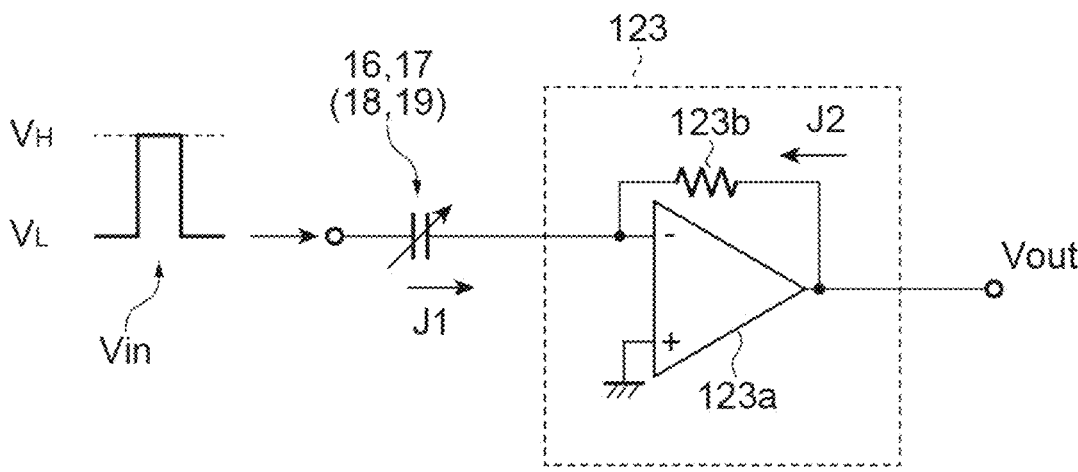
FIG. 7 is a circuit diagram showing a specific configuration example of a current-voltage conversion circuit 123.

FIG. 7 is a circuit diagram showing a specific configuration example of the current-voltage conversion circuit 123. As shown in FIG. 7, the current-voltage conversion circuit 123 is formed by, for example, a transimpedance amplifier (TIA) including an amplifier 123a and a feedback resistor 123b. Then, one of the fixed comb electrode 16 (18) and the movable comb electrode 17 (19) is electrically connected to the negative terminal of the amplifier 123a.

When the movable mirror 5 is displaced, the capacitance between the fixed comb electrode 16 (18) and the movable comb electrode 17 (19) changes. Then, due to this change, a current signal J1 is output from the fixed comb electrode 16 (18) and the movable comb electrode 17 (19). When the time waveform of the drive voltage includes a period to be a constant voltage (excluding 0 V), the current signal J1 within the period indicates a derivative value of the capacitance between the fixed comb electrode 16 (18) and the movable comb electrode 17 (19). For example, when the movable mirror 5 passes through the center of the amplitude, the magnitude (current value) of the current signal J1 momentarily becomes zero. By using this, the timing when the movable mirror 5 passes through the midpoint between the maximum point and the minimum point can be suitably detected.

Hereinafter, a specific description will be given. Now, it is assumed that a drive voltage having a constant voltage period between the rising edge and the falling edge (for example, the rectangular wave shown in FIG. 6) is applied to the other one of the fixed comb electrode 16 (18) and the movable comb electrode 17 (19). That is, a drive voltage $V_{in}(t)$ is expressed by the following Equation (1). $V_L$ is a voltage value of the rectangular wave on the low voltage side, $V_H$ is a voltage value of the rectangular wave on the high voltage side, and t is the time.

[Equation 1]

$$Vin(t) = V_H \text{ or } V_L \tag{1}$$

In addition, the current signal J1 output from one of the fixed comb electrode 16 (18) and the movable comb electrode 17 (19) is expressed by the following Equation (2). Q is the amount of charge stored as a capacitance between the fixed comb electrode 16 (18) and the movable comb electrode 17 (19). $C_a$ is a capacitance value between the fixed comb electrode 16 (18) and the movable comb electrode 17 (19).

[Equation 2]

$$J1 = \frac{dQ}{dt} - \frac{dC_a(t)Vin(t)}{dt} = Vin(t)\frac{dC_a(t)}{dt} + C_a(t)\frac{dVin(t)}{dt} \tag{2}$$

In a period in which the magnitude of Vin(t) is constant, the time derivative of Vin(t) is zero. Therefore, Equation 3 is obtained.

[Equation 3]

$$J1 = Vin(t)\frac{dC_a(t)}{dt} \tag{3}$$

Here, the relationship between a feedback current J2 in the TIA and an output voltage Vout(t) is as shown in the following Equation (4). $R_f$ is the resistance value of the feedback resistor 123b.

[Equation 4]

$$J2 = \frac{Vout(t)}{R_f} \tag{4}$$

In addition, the following conditions are satisfied at the input terminal of the amplifier 123a.

[Equation 5]

$$J1 + J2 = 0 \tag{5}$$

Therefore, the output voltage Vout(t) from the TIA is expressed by the following Equation (6).

[Equation 6]

$$Vout(t) = -R_f Vin(t)\frac{dC_a(t)}{dt} \tag{6}$$

That is, assuming that the drive voltage Vin(t) is a constant value other than zero, when the output voltage Vout(t) is zero, $dC_a(t)/dt$ is zero, and $C_a(t)$ takes an extreme value (maximum value or minimum value). That is, the timing when the movable mirror 5 passes through the midpoint between the maximum point and the minimum point can be suitably detected. For example, when $V_L = 0$ as shown in the graph G2 shown in FIG. 6, the timing can be detected only in a period in which the drive voltage Vin(t) is $V_H$. In a period in which the drive voltage Vin(t) is $V_L$ (=0), the output voltage Vout(t) is 0 V regardless of $dC_a(t)/dt$ as shown in the above Equation (6).

In addition, in an example, the resonance frequency of the movable mirror 5 is 500 Hz. In this case, the frequency of the drive voltage Vin(t) is 1 kHz, and the period of the drive voltage Vin(t) is 1 ms. Assuming that the time is the above-described dt, $dC_a$ is, for example, 10 pF, and $V_H$ is, for example, 100 V, J1=1 μA is calculated. When the range of the output voltage Vout(t) is 1 V, the required resistance value $R_f$ of the feedback resistor 123b is 1 MΩ.

Figure 8:
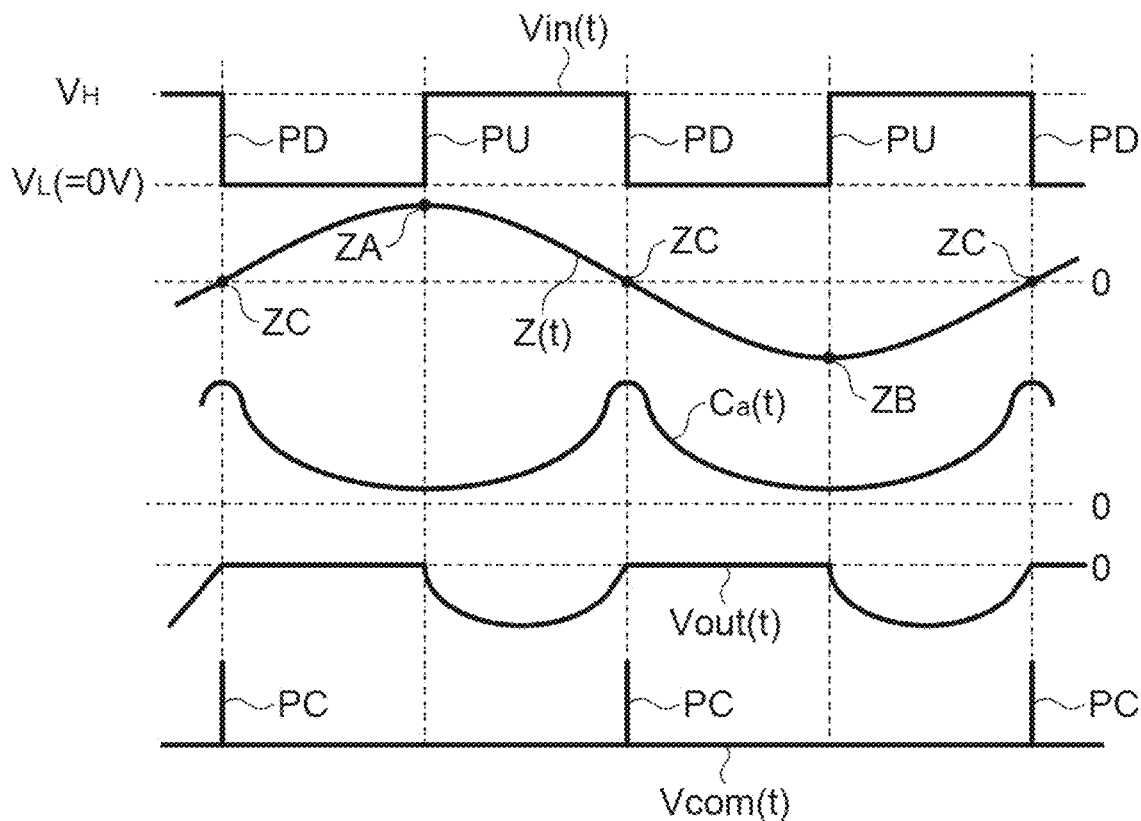
FIG. 8 is a graph showing the time change of each signal in an example.

FIG. 8 is a graph showing the time change of each signal in an example. In the diagram, in order from the top, the drive voltage Vin(t), the displacement amount Z(t) of the movable mirror 5, the capacitance $C_a(t)$, the output voltage Vout(t), and the output voltage waveform Vcom(t) from the comparator 124 are shown. In addition, the vertical axis of each graph indicates voltage or capacitance, and the horizontal axis of each graph indicates time.

As described above, the drive voltage Vin(t) has a time waveform in which rising PU and falling PD are alternately repeated at fixed periods. In the example shown in FIG. 8, the duty ratio is 50%, and the length of the period from the rising PU to the falling PD (voltage value $V_H$) and the length of the period from the falling PD to the rising PU (voltage value $V_L$) are equal. Then, the timing of the rising PU of the drive voltage Vin(t) is controlled by the actuator drive circuit 121 so as to match the timing when the displacement amount Z(t) of the movable mirror 5 becomes a maximum point ZA or a minimum point ZB, which is the turning point of the reciprocating movement. In addition, the timing of the falling PD of the drive voltage Vin(t) is controlled by the actuator drive circuit 121 so as to match the timing when the movable mirror 5 passes through a midpoint ZC between the maximum point ZA and the minimum point ZB.

The capacitance $C_a(t)$ between the fixed comb electrode 16 (18) and the movable comb electrode 17 (19) changes according to the displacement amount Z(t) of the movable mirror 5, and is the minimum at the timing when the displacement amount Z(t) becomes the maximum point ZA or the minimum point ZB and is the maximum at the timing when the displacement amount Z(t) passes through the midpoint ZC between the maximum point ZA and the minimum point ZB. In addition, as described above, the output voltage Vout(t) from the current-voltage conversion circuit 123 is 0 V in a period in which the drive voltage Vin(t) is $V_L$ (=0 V). However, in a period in which the drive voltage Vin(t) is a constant value $V_H$ excluding 0, the output voltage Vout(t) from the current-voltage conversion circuit 123 has a value indicating the time derivative of the capacitance $C_a(t)$. In this example, the comparator 124 compares the output voltage Vout(t) with 0 V (more accurately, a predetermined threshold value corresponding to the case where the current signal J1 is zero), and provides the actuator drive circuit 121 with the output voltage waveform Vcom(t) including a pulse PC that rises at the timing when the output voltage Vout(t) reaches 0 V (zero cross timing).

By using the rising timing of the pulse PC, the actuator drive circuit 121 controls the timing of the falling PD of the drive voltage Vin(t) described above. That is, the actuator drive circuit 121 matches the timing of the falling PD of the drive voltage Vin(t) with the timing when the output voltage Vout(t) reaches a predetermined threshold value.

Figure 9:
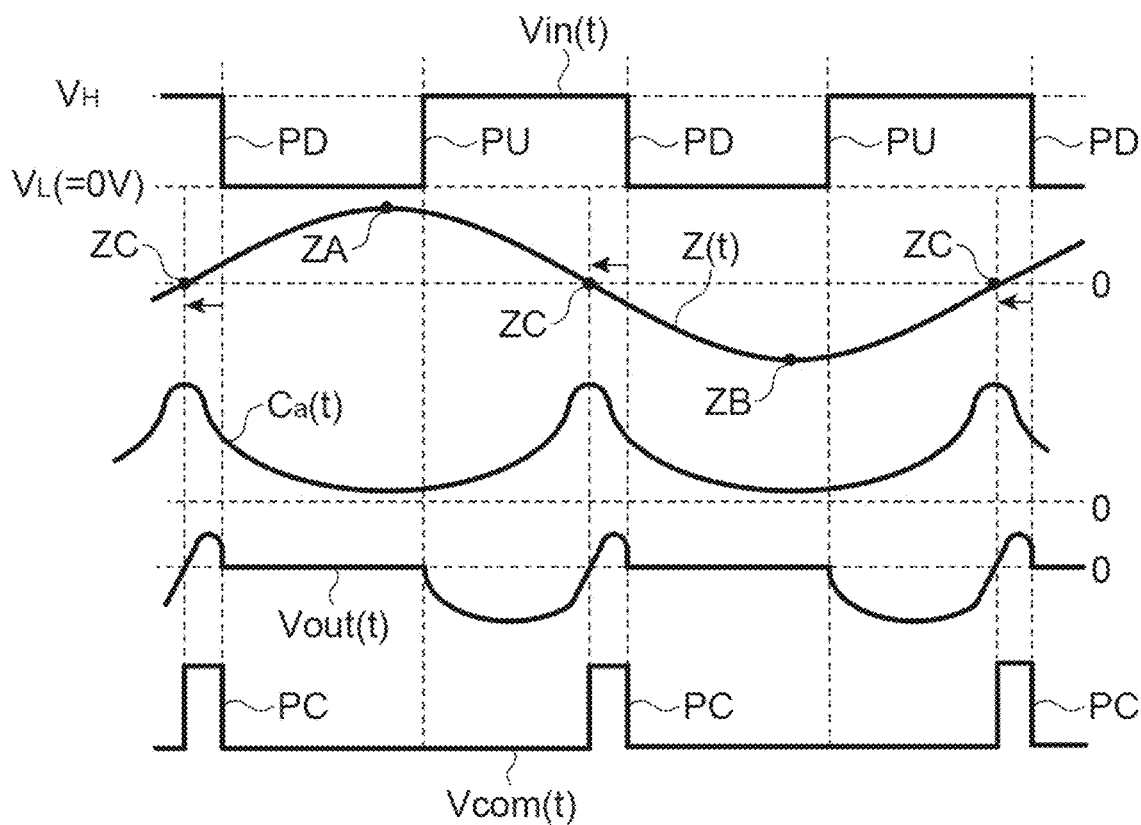
FIG. 9 is a graph showing the time change of each signal in another example.

FIG. 9 is a graph showing the time change of each signal in another example. In this example, the duty ratio is 50%, which is the same as in the example of FIG. 8, but the timing of the rising PU of the drive voltage Vin(t) is controlled by the actuator drive circuit 121 so as to be slightly delayed from the timing when the displacement amount Z(t) of the movable mirror 5 becomes the maximum point ZA or the minimum point ZB, which is the turning point of the reciprocating movement. In addition, the timing of the falling PD of the drive voltage Vin(t) is controlled by the actuator drive circuit 121 so as to be slightly delayed from the timing when the movable mirror 5 passes through the midpoint ZC between the maximum point ZA and the minimum point ZB (see the arrow in the diagram). That is, the actuator drive circuit 121 shifts the timing of the falling PD to a predetermined time after the timing when the output voltage Vout(t) reaches a predetermined threshold value. For example, the predetermined time is 0.1% or more and 15% or less of the period of the drive voltage Vin(t).

In this example, the drive voltage Vin(t) maintains a constant value $V_H$ for a while even after the maximum timing of the capacitance $C_a(t)$. Therefore, the output voltage Vout(t) from the current-voltage conversion circuit 123 maintains a positive value until the drive voltage Vin(t) drops after reaching 0 V. Therefore, the time width of each pulse PC included in the output voltage waveform Vcom(t) from the comparator 124 increases with the delay of the timing of the falling PD. In other words, the time from the rising edge to the falling edge of the output voltage waveform Vcom(t) indicates the delay time of the timing of the falling PD.

Figure 10:
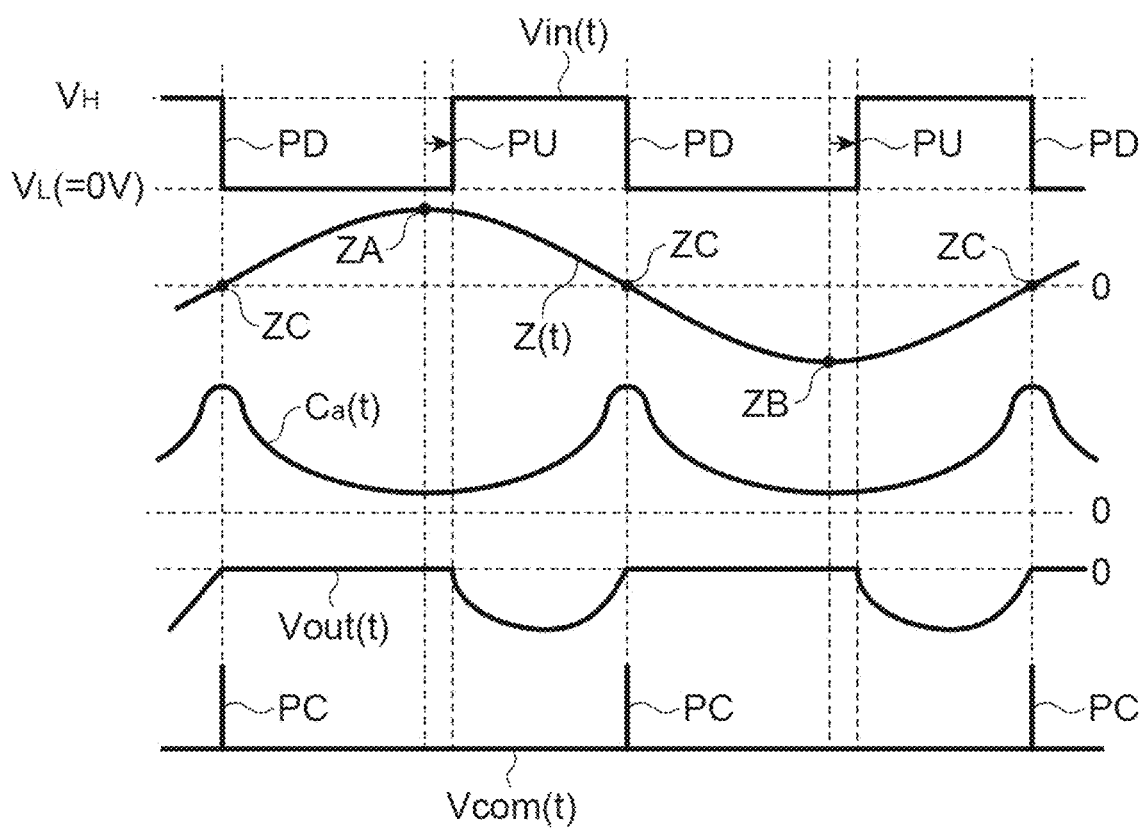
FIG. 10 is a graph showing the time change of each signal in still another example.

FIG. 10 is a graph showing the time change of each signal in still another example. In this example, the duty ratio is less than 50% (for example, 45%), and the timing of the rising PU of the drive voltage Vin(t) is controlled by the actuator drive circuit 121 so as to be slightly delayed from the timing when the displacement amount Z(t) of the movable mirror 5 becomes the maximum point ZA or the minimum point ZB (see the arrow in the diagram). In addition, the timing of the falling PD of the drive voltage Vin(t) is controlled so as to match the timing when the movable mirror 5 passes through the midpoint ZC, as in FIG. 8.

Here, the method of driving the mirror device 7 according to the present embodiment is summarized as follows. That is, the drive method according to the present embodiment includes a drive step of applying the drive voltage Vin(t) between the fixed comb electrodes 16 and 18 and the movable comb electrodes 17 and 19. The time waveform of the drive voltage Vin(t) periodically repeats the rising PU and the falling PD, and includes a period to be the constant voltage $V_H$ after the rising PU and before the falling PD. In the drive step, a capacitance derivative signal Vout(t) proportional to the time derivative of the capacitance $C_a$ is generated by converting the current signal J1, which is output from the fixed comb electrodes 16 and 18 or the movable comb electrodes 17 and 19 within the period due to the change in the capacitance $C_a$ between the fixed comb electrodes 16 and 18 and the movable comb electrodes 17 and 19, into a voltage signal. Then, the timing when the capacitance derivative signal Vout(t) reaches a predetermined threshold value is detected, and the relationship between the timing and the timing of the falling PD is controlled to be constant. At this time, the timing of the falling PD is made to match the timing when the capacitance derivative signal Vout(t) reaches a predetermined threshold value (see FIGS. 8 and 10) or is shifted after a predetermined time from the timing when the capacitance derivative signal Vout(t) reaches a predetermined threshold value (see FIG. 9). In addition, the predetermined threshold value is set to a value (for example, 0 V) corresponding to the case where the current signal J1 is zero. In addition, the time waveform of the drive voltage Vin(t) is made to periodically include a rectangular wave having the rising PU and the falling PD, and the duty ratio of the drive voltage Vin(t) is set to be 20% or more and less than 50%. In the drive step, the current signal J1 is converted into the capacitance derivative signal Vout(t), which is a voltage signal, by using the TIA, and the capacitance derivative signal Vout(t) is compared with a predetermined threshold value by using the comparator 124.

In addition, in the drive method described above, the drive step is realized by executing a program by a computer provided outside the optical module 1A, for example. The program controls the timing of the rising PU and the timing of the falling PD of the drive voltage Vin(t) while controlling the relationship between the timing when the capacitance derivative signal Vout(t) reaches a predetermined threshold value and the timing of the falling PD to be constant.

The effects obtained by the mirror device 7 and the method of driving the mirror device 7 according to the present embodiment described above will be described together with the conventional problems. Normally, the resonance frequency of the movable mirror 5 fluctuates due to changes in temperature, humidity, and the like. If the frequency of the drive voltage Vin(t) deviates from the resonance frequency of the movable mirror 5 due to the fluctuation in the resonance frequency of the movable mirror 5, the operation of the movable mirror 5 at the maximum amplitude is adversely affected. In particular, when the maximum amplitude of the movable mirror 5 is large, such as a case where the elastic coefficient of a portion (specifically, the levers 131 and 141, the first torsion bars 135 and 145, and the second torsion bars 136 and 146) that elastically supports the movable mirror 5 is small, the non-linearity of the amplitude with respect to the frequency increases. Therefore, even if the frequency of the drive voltage Vin(t) deviates slightly from the resonance frequency of the movable mirror 5, the amplitude is greatly reduced.

In response to this problem, in the present embodiment, the drive voltage Vin(t) having a time waveform periodically repeating the rising PU and the falling PD is applied between the fixed comb electrodes 16 and 18 and the movable comb electrodes 17 and 19. Therefore, by bringing the frequency of the drive voltage Vin(t) close to the resonance frequency of the movable mirror 5, the amplitude of the movable mirror 5 can be brought close to the maximum amplitude. At this time, due to the change in the capacitance $C_a$ between the fixed comb electrodes 16 and 18 and the movable comb electrodes 17 and 19, the current signal J1 from the fixed comb electrodes 16 and 18 or the movable comb electrodes 17 and 19 is output. When the time waveform of the drive voltage Vin(t) includes a period to be a constant voltage (excluding 0 V), the current signal J1 within the period indicates a derivative value of the capacitance $C_a$ between the fixed comb electrodes 16 and 18 and the movable comb electrodes 17 and 19. For example, when the movable mirror 5 passes through the center of the amplitude, the capacitance $C_a$ becomes maximum, so that the current value of the current signal J1 momentarily becomes zero.

In the present embodiment, the time waveform of the drive voltage Vin(t) includes a period to be the constant voltage $V_H$ after the rising PU and before the falling PD. Then, by converting the current signal J1 output from the fixed comb electrodes 16 and 18 or the movable comb electrodes 17 and 19 within the period into a voltage signal, the capacitance derivative signal Vout(t) indicating the derivative value of the capacitance $C_a$ is generated. In addition, the timing when the capacitance derivative signal Vout(t) reaches a predetermined threshold value is detected, and the relationship between the timing and the timing of the falling PD is controlled to be constant. Therefore, since the position of the movable mirror 5 at the time of falling PD of the drive voltage Vin(t) can be made constant, the frequency of the drive voltage Vin(t) can be brought close to the resonance frequency regardless of the fluctuation in the resonance frequency of the movable mirror 5.

FIGS. 11(a), 11(b) and 11(c) are graphs showing, as an example, measured data of the time waveform of the drive voltage Vin(t), the capacitance derivative signal Vout(t), and the output voltage Vcom(t) from the comparator 124, respectively. In addition, in this example, the pulse height of the drive voltage Vin(t) was set to 75 Vpp, the frequency of the drive voltage Vin(t) was set to 537 Hz, the duty ratio of the drive voltage Vin(t) was set to 45%, and the resistance value of the feedback resistor 123b of the TIA was set to 3.3 MΩ. As is apparent from these diagrams, according to the present embodiment, it is possible to control the timing of the falling PD of the drive voltage Vin(t) in a constant relationship with respect to the timing when the capacitance derivative signal Vout(t) has a predetermined threshold value (0 V in this example).

Figure 11:
FIGS. 11(a), 11(b) and 11(c) are graphs showing, as an example, measured data of time waveforms of a drive voltage Vin(t), a capacitance derivative signal Vout(t), and an output voltage Vcom(t) from a comparator 124, respectively.
Figure 12:
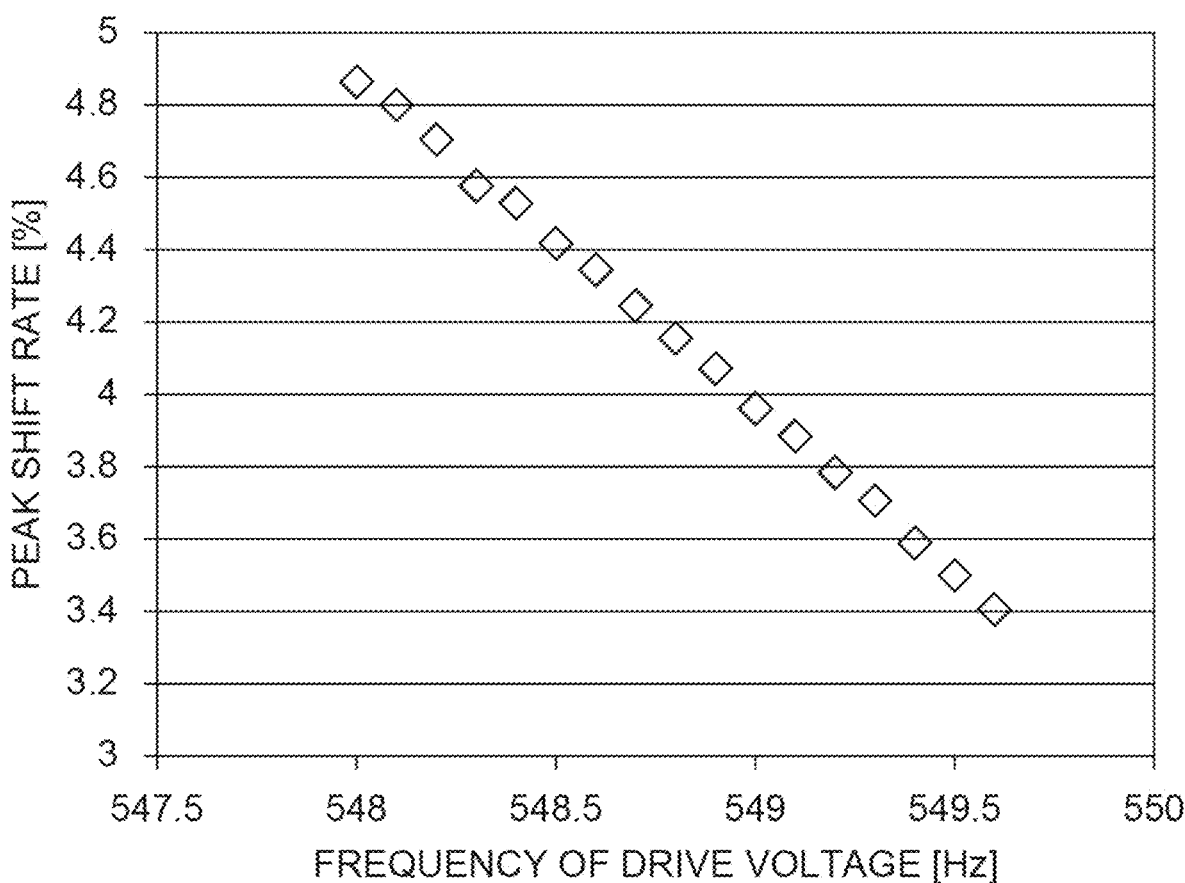
FIG. 12 is a graph showing a measurement result of the relationship between the frequency of the drive voltage Vin(t) and a time difference between a timing when the capacitance derivative signal Vout(t) becomes 0 V and the timing of falling PD.

In addition, FIG. 12 is a graph showing the measurement result of the relationship between the frequency of the drive voltage Vin(t) and the time difference between the timing when the capacitance derivative signal Vout(t) becomes 0 V (that is, the timing when the fixed comb electrodes 16 and 18 and the movable comb electrodes 17 and 19 are closest to each other) and the timing of the falling PD. In addition, the time difference is shown as a ratio of the drive voltage Vin(t) to the period (hereinafter, referred to as a peak shift rate). In this measurement, the pulse height of the drive voltage Vin(t) was set to 75 Vpp, and the duty ratio of the drive voltage Vin(t) was set to 45%. In addition, the frequency of the drive voltage Vin(t) was changed in units of 0.1 Hz, and the time difference was detected with an accuracy of about 0.1%. As is apparent from FIG. 12, when the output signal of Vcom(t) in FIG. 11 is generated immediately before the falling PD, it can be seen that the peak shift rate decreases as the frequency of the drive voltage Vin(t) increases.

As shown in FIGS. 8 and 10, the actuator drive circuit 121 (in the drive step) may match the timing of the falling PD with the timing when the capacitance derivative signal Vout(t) reaches a predetermined threshold value. For example, with such a configuration, the relationship between the timing when the capacitance derivative signal Vout(t) reaches a predetermined threshold value and the timing of the falling PD can be controlled to be constant.

Alternatively, as shown in FIG. 9, the actuator drive circuit 121 (in the drive step) may shift the timing of the falling PD to a predetermined time after the timing when the capacitance derivative signal Vout(t) reaches a predetermined threshold value. Even with such a configuration, the relationship between the timing when the capacitance derivative signal Vout(t) reaches a predetermined threshold value and the timing of the falling PD can be controlled to be constant. In addition, since it can be checked that the capacitance derivative signal Vout(t) reaches a predetermined threshold value before the drive voltage drops (that is, the capacitance derivative signal Vout(t) disappears), it is possible to more reliably detect the timing when the capacitance derivative signal Vout(t) reaches a predetermined threshold value.

As in the present embodiment, the predetermined threshold value may be a value (0 V in one example) corresponding to the case where the current signal J1 is zero. In this case, it is possible to accurately detect the timing when the movable comb electrodes 17 and 19 and the fixed comb electrodes 16 and 18 are closest to each other (in an example, the timing suitable for the falling of the drive voltage Vin(t)).

As in the present embodiment, the time waveform of the drive voltage Vin(t) may periodically include a rectangular wave having the rising PU and the falling PD, and the duty ratio of the drive voltage Vin(t) may be 20% or more and less than 50%. Assuming that the duty ratio of the drive voltage Vin(t) is 50%, there is a possibility that electrostatic attraction is applied at the timing when the movable comb electrodes 17 and 19 and the fixed comb electrodes 16 and 18 move away from each other due to a control error or the like. This leads to a decrease in the amplitude of the movable mirror 5. By setting the duty ratio of the drive voltage Vin(t) to less than 50%, such a possibility can be reduced. In addition, by setting the duty ratio of the drive voltage Vin(t) to 20% or more, sufficient electrostatic attraction can be applied between the movable comb electrodes 17 and 19 and the fixed comb electrodes 16 and 18.

As in the present embodiment, the timing detection circuit 122 may include the comparator 124 that compares the capacitance derivative signal Vout(t) with a predetermined threshold value. In other words, in the drive step, the comparison between the capacitance derivative signal Vout(t) and the predetermined threshold value may be performed by using the comparator 124. In this case, since the timing when the capacitance derivative signal Vout(t) reaches the predetermined threshold value can be detected by a simple circuit, it is possible to contribute to the miniaturization and cost reduction of the mirror device 7. In addition, as compared with, for example, a configuration in which the capacitance derivative signal Vout(t) is compared with a predetermined threshold value by using software, the comparison can be performed only on the circuit board. In this respect as well, it is possible to contribute to the simplification of the configuration. In addition, when the above comparison is performed by using software built into a computer, it is difficult to distinguish between the timing of exceeding the threshold value from the negative side to the positive side and the timing of exceeding the threshold value from the positive side to the negative side. On the other hand, since the comparator 124 operates only in the period in which the drive voltage Vin(t) is the constant value $V_H$, only the timing exceeding the threshold value from the negative side to the positive side is output. Therefore, the above comparison can be easily performed. In addition, this does not prevent the use of software built into the computer instead of the comparator 124 for the comparison between the capacitance derivative signal Vout(t) and the predetermined threshold value.

As in the present embodiment, the timing detection circuit 122 may include a TIA that converts the current signal J1 into the voltage signal Vout(t). In other words, in the drive step, the current signal J1 may be converted into the voltage signal Vout(t) by using the TIA. In this case, for example, as compared with a case where a resistor (shunt resistor) is connected in series with the fixed comb electrodes 16 and 18 or the movable comb electrodes 17 and 19 and the current signal J1 is converted into the voltage signal Vout(t) by using the voltage drop in the resistor, it is possible to reduce the voltage fluctuation between the comb electrodes and apply a desired voltage between the comb electrodes with high accuracy.

Figure 32:
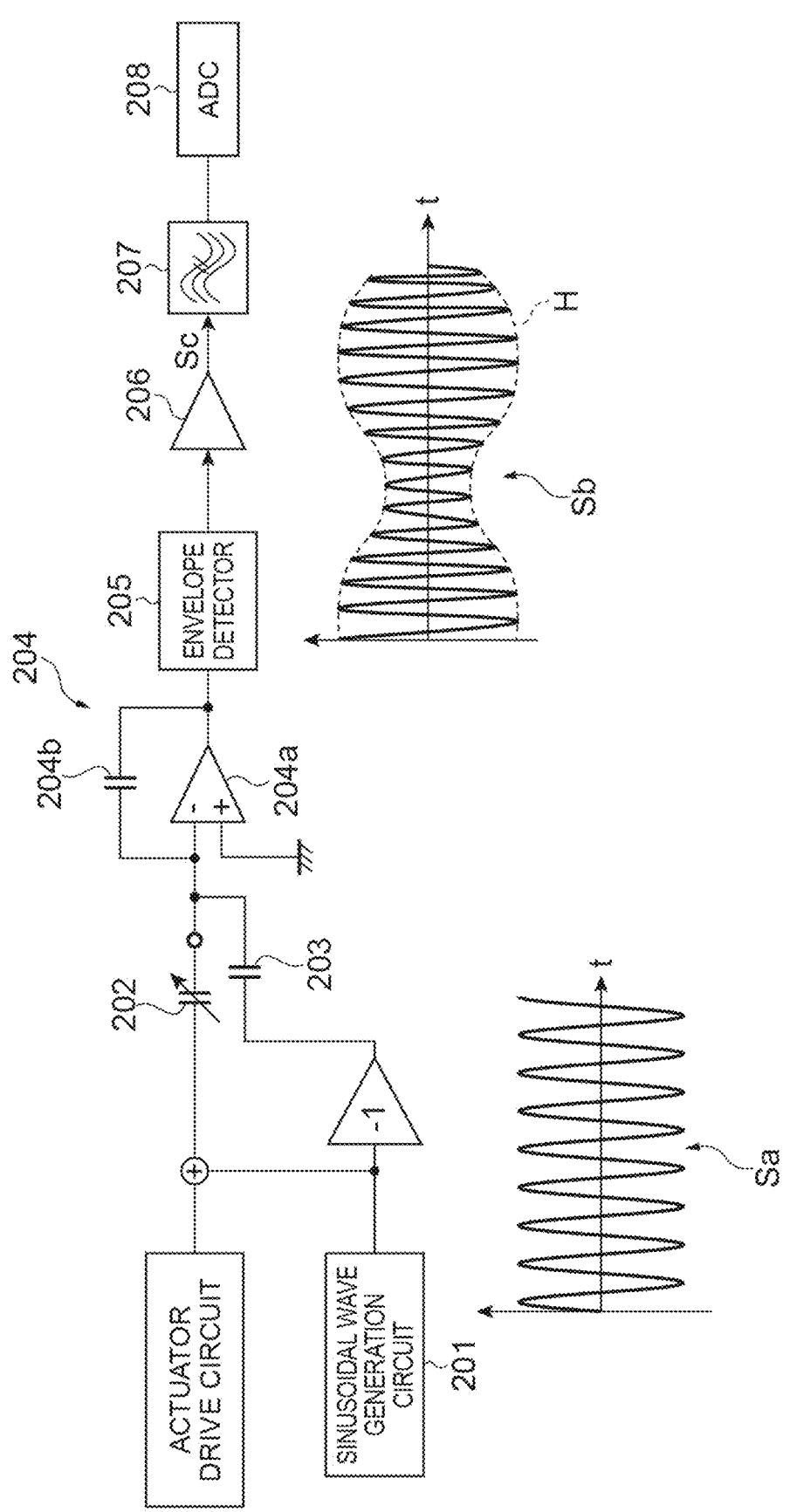
FIG. 32 is a diagram showing a circuit for detecting the maximum and/or minimum of the displacement amount of a movable mirror 5 as a comparative example.

Here, as another method of bringing the frequency of the drive voltage Vin(t) close to the resonance frequency, it is conceivable to continuously detect the displacement amount of the movable mirror 5 and control the timing of the rising PU and the falling PD of the drive voltage Vin(t) according to the maximum and/or minimum of the displacement amount of the movable mirror 5. FIG. 32 is a diagram showing a circuit for detecting the maximum and/or minimum of the displacement amount of the movable mirror 5 as a comparative example. In this circuit, a sinusoidal signal Sa from a sinusoidal wave generation circuit 201 is superimposed on a drive voltage from an actuator drive circuit and applied between a fixed comb electrode and a movable comb electrode. In addition, in FIG. 32, the fixed comb electrode and the movable comb electrode are shown as variable capacities 202. The frequency of the sinusoidal signal Sa is sufficiently higher than the resonance frequency of the movable mirror 5. On the other hand, a signal obtained by shifting the phase of the sinusoidal signal Sa from the sinusoidal wave generation circuit 201 by 180° is applied to a fixed capacitor 203 as a reference. Then, the currents output from the variable capacitor 202 and the fixed capacitor 203 are added, and a current obtained by the addition is input to an arithmetic circuit 204 including an operational amplifier 204*a*. In this case, a signal Sb output from the arithmetic circuit 204 is expressed by the following Equation (7). In addition, Vsa(t) indicates the voltage waveform of the sinusoidal signal Sa, Vsb(t) indicates the voltage waveform of the signal Sb, C is the capacitance value of the variable capacitor 202, $C_{ref}$ is the capacitance value of the fixed capacitor 203, and $C_0$ is the capacitance value of a feedback capacitor 204*b* of the arithmetic circuit 204.

[Equation 7]

$$Vsb(t) = Vsa(t)\frac{C_{ref} - C}{C_0} \tag{7}$$

An envelope H of the signal Sb indicates the capacitance value of the variable capacitor 202, that is, the displacement amount of the movable mirror 5. Thereafter, the envelope H of the signal Sb is detected by an envelope detector 205, and the detected envelope H is amplified by an amplifier 206. Then, an amplified signal Sc is input to a low pass filter 207, and the frequency component of the sinusoidal signal Sa is removed from the signal Sc. The signal Sc after passing through the low pass filter 207 is input to an analog-digital converter 208, and the signal Sc is converted into a digital signal by the analog-digital converter 208. Thereafter, the maximum timing and/or the minimum timing of the signal Sc (that is, the maximum timing and/or the minimum timing of the displacement of the movable mirror 5) is detected by a digital circuit (not shown).

However, the method shown in FIG. 32 has a problem that the circuit scale becomes large and the circuit becomes complicated. On the other hand, according to the method of the present embodiment, by focusing only on the detection of the timing when the movable mirror 5 passes through a predetermined position (the timing when the fixed comb electrodes 16 and 18 and the movable comb electrodes 17 and 19 are closest to each other), that is, the detection of the change in the capacitance between the comb electrodes, a similar function can be realized by a remarkably simple circuit configuration, as shown in FIG. 5. In addition, when the capacitance value of the variable capacitor 202 is handled as it is as in the method shown in FIG. 32, the time waveform is steep near the peak of the capacitance value and accordingly, noise tends to concentrate near the peak of the capacitance value. For this reason, it is difficult to accurately match the falling timing of the drive voltage with the peak of the capacitance value. On the other hand, according to the method of the present embodiment, it is easy to keep the S/N ratio of the current signal J1 high even near the timing when the value of the capacitance $C_a$ is a peak. Therefore, it is possible to accurately match the falling timing of the drive voltage Vin(t) with the peak of the capacitance $C_a$.

Figure 33:
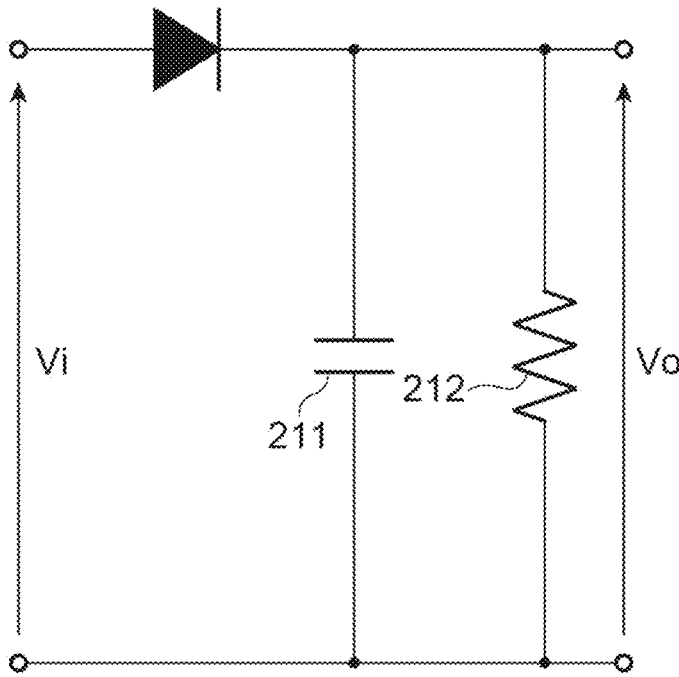
FIG. 33 is a circuit diagram showing a typical example of an envelope detector.
Figure 34:
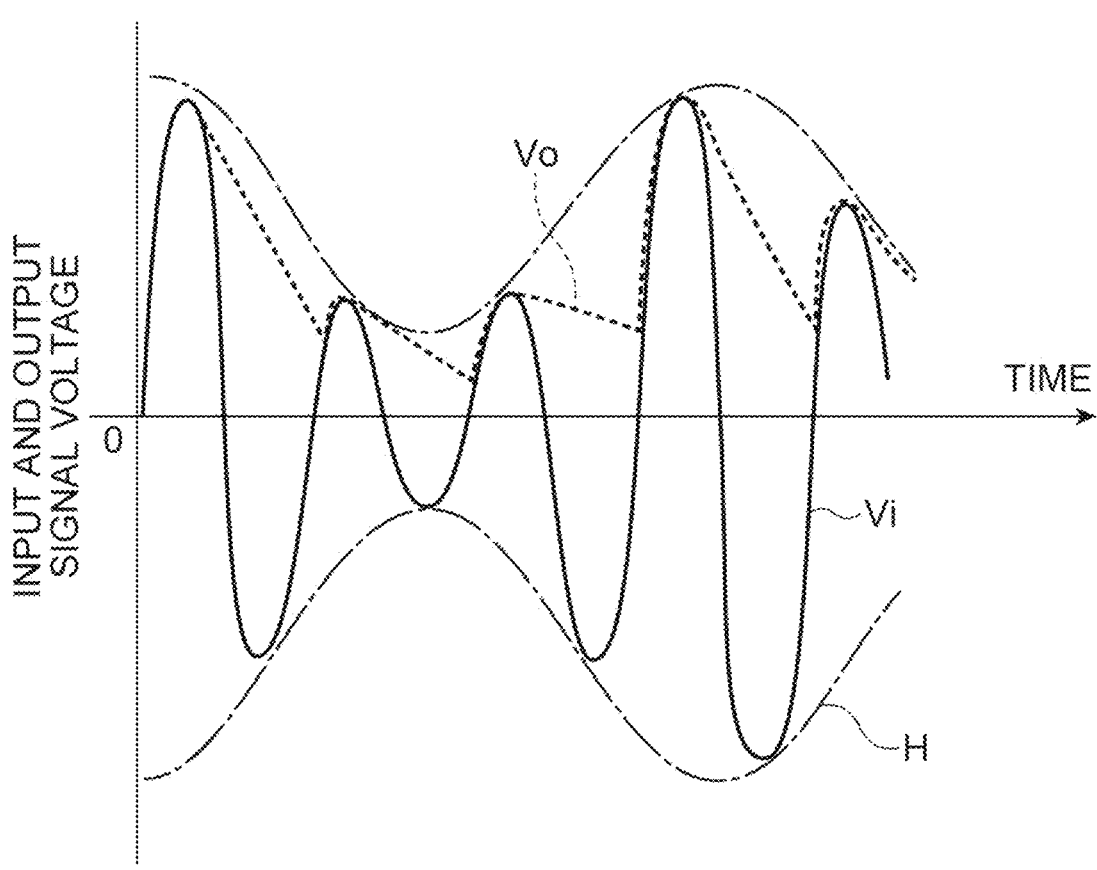
FIG. 34 is a graph showing an example of an input signal Vi to the envelope detector shown in FIG. 33 and an output signal Vo.
Figure 35:
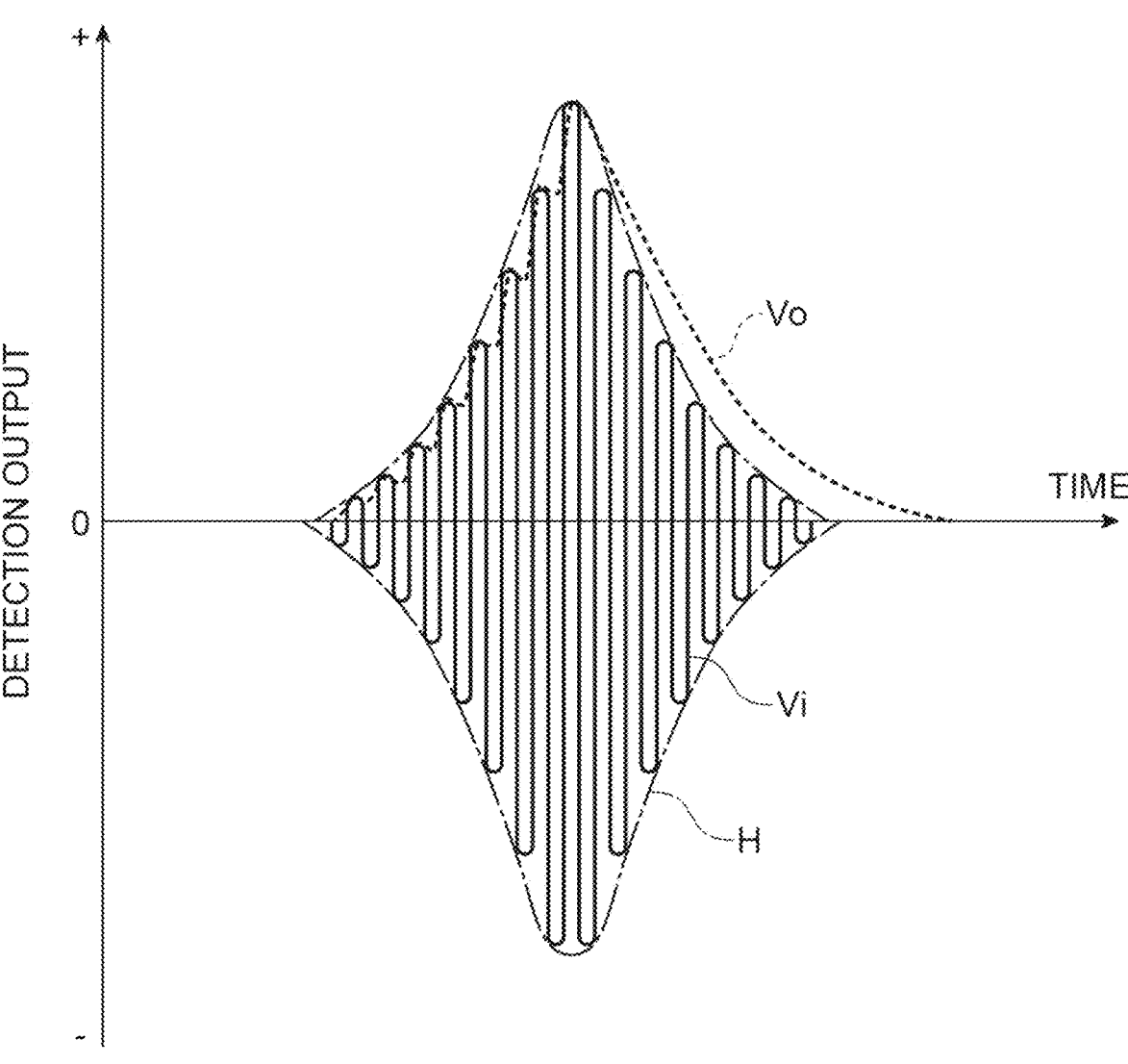
FIG. 35 is a graph showing how the output signal Vo from the envelope detector cannot follow an actual envelope H of the input signal Vi.

In addition, the method shown in FIG. 32 has the following problem. FIG. 33 is a circuit diagram showing a typical example of an envelope detector. In addition, FIG. 34 is a graph showing an example of an input signal Vi to the envelope detector shown in FIG. 33 and an output signal Vo. As shown in FIG. 34, the output signal Vo from the envelope detector includes a ripple according to the frequency of the input signal Vi, unlike the actual envelope H. This causes a decrease in the detection accuracy of the displacement amount of the movable mirror 5 and a decrease in the detection accuracy of the maximum timing and/or the minimum timing of the displacement of the movable mirror 5. In addition, if the value of the product between the capacitance value of a capacitor 211 shown in FIG. 33 and the resistance value of a resistor 212 shown in FIG. 33 is increased, the ripple included in the output signal Vo is reduced. In this case, however, as shown in FIG. 35, the output signal Vo from the envelope detector cannot follow the actual envelope H of the input signal Vi.

In contrast, in the present embodiment, the timing when the movable mirror 5 passes through the predetermined position is detected based on the capacitance derivative signal Vout(t) obtained by current-voltage conversion of the current signal J1 output from the fixed comb electrodes 16 and 18 (or the movable comb electrodes 17 and 19) when the constant voltage $V_H$ is applied. For this reason, since no envelope detector is required, the above-described problem relevant to ripple do not occur. Therefore, it is possible to improve the detection accuracy of the timing when the movable mirror 5 passes through a predetermined position.

Figure 13:
FIG. 13 is a diagram conceptually showing ripple Ri superimposed on the drive voltage.

In addition, the method shown in FIG. 32 has the following problem. Normally, in order to generate a sufficiently large electrostatic force between the fixed comb electrode and the movable comb electrode, it is necessary to apply a high voltage such as several tens to 100 volts as the drive voltage Vin(t). Such a high voltage is generally generated by using a booster circuit, such as a DC-DC converter. In addition, in a switching type booster circuit, the occurrence of ripple due to switching is unavoidable. FIG. 13 is a diagram conceptually showing ripple Ri superimposed on the drive voltage. As shown in the diagram, the ripple Ri is a periodic wave having the same frequency as the switching frequency, and vibrates around the drive voltage. When the ripple Ri having an amplitude ΔV is superimposed on the drive voltage, the above Equation (7) is modified as follows.

[Equation 8]

$$Vsb(t) = \{Vsa(t) + \Delta V\}\frac{C_{ref} - C}{C_0} \tag{8}$$

In this case, assuming that Vsa(t) is 1 V and ΔV is 0.1 V, an output error of up to 10% occurs.

On the other hand, when the ripple Ri having the amplitude ΔV is superimposed on the constant voltage $V_H$ in the present embodiment, the above Equation (6) is modified as follows.

[Equation 9]

$$Vout(t) = -R_f \{Vin(t) + \Delta V\} \frac{dC_a(t)}{dt} \tag{9}$$

Since the magnitude of the constant voltage $V_H$ is at least 10 V, the output error is 1% or less even if $\Delta V$ is 0.1 V. That is, according to the present embodiment, it is possible to obtain high detection accuracy by reducing the influence of the ripple Ri included in the drive voltage.

First Modification Example

Figure 14:
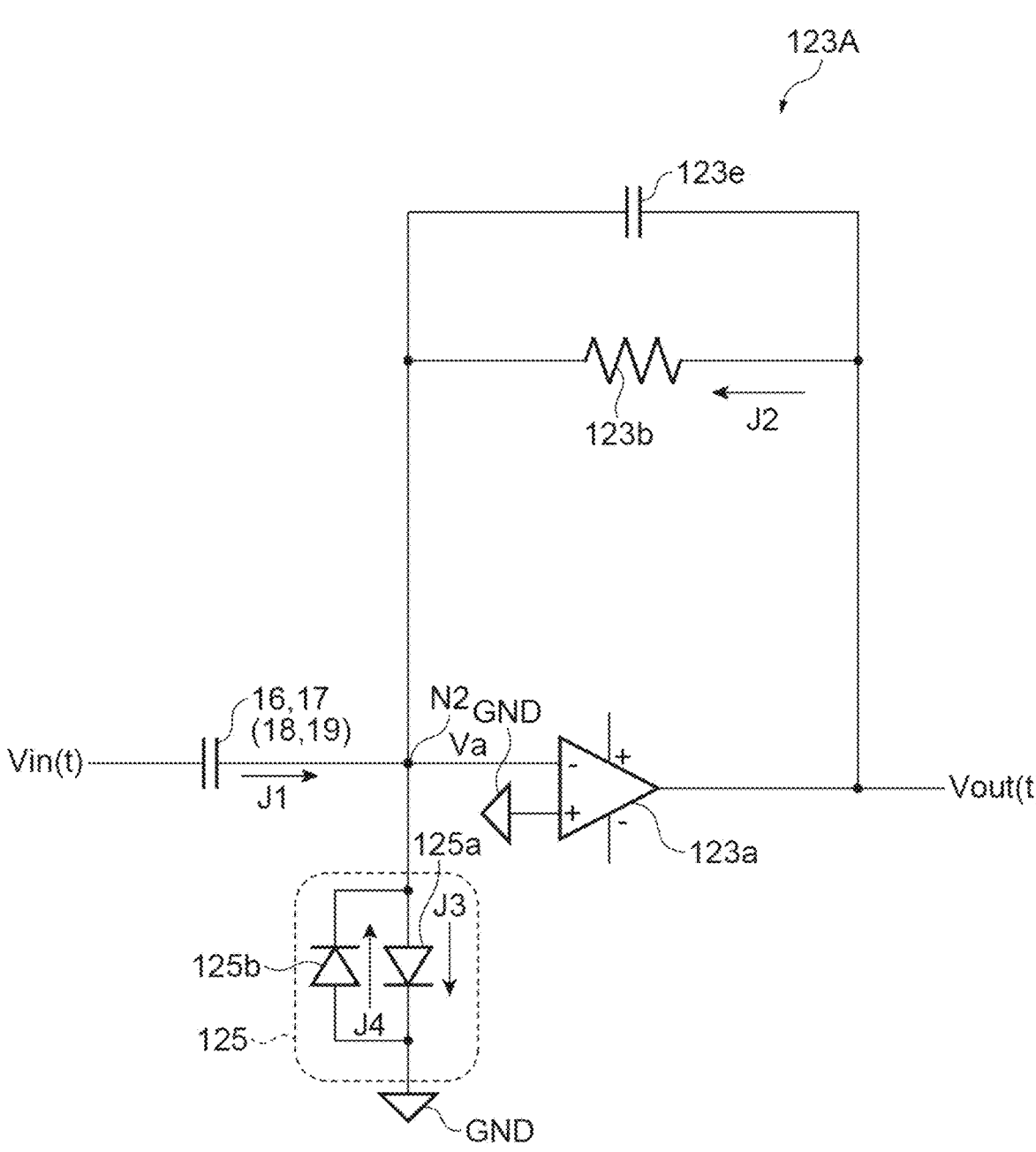
FIG. 14 is a circuit diagram showing the configuration of a current-voltage conversion circuit 123A according to a first modification example.

FIG. 14 is a circuit diagram showing the configuration of a current-voltage conversion circuit 123A according to a first modification example of the embodiment described above. As shown in the diagram, the current-voltage conversion circuit 123A includes the amplifier 123a, the feedback resistor 123b, and a capacitor 123e. The feedback resistor 123b is connected in series between the inverting input terminal and the output terminal of the amplifier 123a. The capacitor 123e is connected in parallel to the feedback resistor 123b between the inverting input terminal and the output terminal of the amplifier 123a. The non-inverting input terminal of the amplifier 123a is connected to a reference potential line GND. In this circuit, the capacitor 123e is used to adjust the cutoff frequency fc of the current-voltage conversion circuit 123A. Assuming that the resistance value of the feedback resistor 123b is Rf and the capacitance value of the capacitor 123e is Cf, the cutoff frequency fc of the current-voltage conversion circuit 123A is given as $fc=1/(2\pi \cdot Rf \cdot Cf)$. By appropriately adjusting the cutoff frequency fc, it is possible to remove a high frequency component included in the capacitance derivative signal Vout(t), which is irrelevant to the actuator operation.

The current-voltage conversion circuit 123A further includes a clamp circuit 125. The clamp circuit 125 is provided in order to shorten the fluctuation period of the capacitance derivative signal Vout(t) caused by the rising PU and the falling PD of the drive voltage Vin(t). In this example, the clamp circuit 125 has switching diodes (hereinafter, simply referred to as diodes) 125a and 125b. The diodes 125a and 125b are connected in parallel to each other between the reference potential line GND and a node N2 between the fixed comb electrodes 16 and 18 (or the movable comb electrodes 17 and 19) and the inverting input terminal of the amplifier 123a. The diode 125a is connected with the direction from the node N2 to the reference potential line GND as its forward direction, and the diode 125b is connected with the direction from the reference potential line GND to the node N2 as its forward direction. In other words, the two diodes 125a and 125b are connected in parallel in opposite directions between the node N2 and the reference potential line GND.

The diode 125a is turned on when the potential of the node N2 exceeds a predetermined threshold value (>0), and a current flows from the node N2 to the reference potential line GND. In addition, the diode 125b is turned on when the potential of the node N2 falls below the predetermined threshold value (<0), and a current flows from the reference potential line GND to the node N2.

Figure 15:
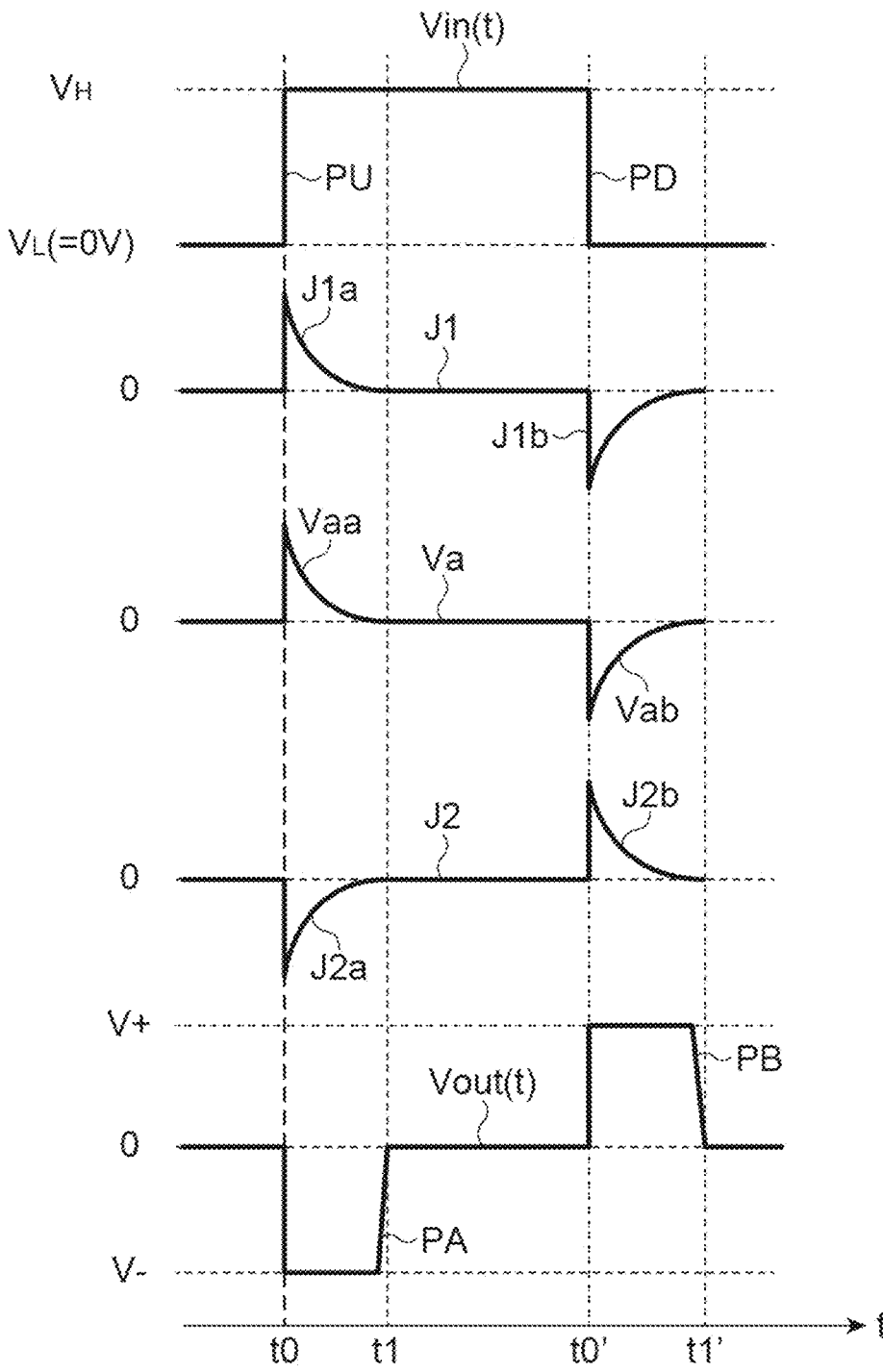
FIG. 15 is a diagram showing the time waveforms of a drive voltage Vin(t), a current signal J1, an inverting input terminal voltage Va of an amplifier 123a, a feedback current J2, and a capacitance derivative signal Vout(t) when a capacitance $C_a$ does not change in a first embodiment.

Here, fluctuations in the capacitance derivative signal Vout(t) due to the rising PU and the falling PD of the drive voltage Vin(t) will be described. FIG. 15 is a diagram showing the time waveforms of the drive voltage Vin(t), the current signal J1, the inverting input terminal voltage Va of the amplifier 123a, the feedback current J2, and the capacitance derivative signal Vout(t) when the capacitance $C_a$ does not change (that is, the Z-direction position of the movable mirror 5 is fixed) in the embodiment described above. Here, it is assumed that the drive voltage Vin(t) rises at time t0 and drops at time t0'.

When the drive voltage Vin(t) rises at time t0, a charge corresponding to the product $(C_a \cdot V_H)$ between the voltage $V_H$ and the capacitance $C_a$ flows momentarily to the capacitor between the fixed comb electrodes 16 and 18 and the movable comb electrodes 17 and 19 to generate a positive pulse wave J1a in the current signal J1. At this time, a negative pulse wave J2a is generated in the feedback current J2 in order to satisfy J1+J2=0. Then, as a result of the generation of the negative pulse wave J2a, the voltage signal (capacitance derivative signal) Vout(t) output from the amplifier 123a is saturated to the negative side (waveform PA). The saturation waveform PA continues for a predetermined period according to the height of the pulse wave J1a and converges at time t1. When the voltage signal Vout(t) is saturated to the negative side, the inverting input terminal of the amplifier 123a cannot maintain virtual ground. Therefore, the inverting input terminal voltage Va of the amplifier 123a rises momentarily in order to reduce the feedback current J2 (waveform Vaa).

In addition, when the drive voltage Vin(t) drops at time t0', the charge stored in the capacitor between the fixed comb electrodes 16 and 18 and the movable comb electrodes 17 and 19 flows out momentarily to generate a negative pulse wave J1b in the current signal J1. At this time, a positive pulse wave J2b is generated in the feedback current J2 in order to satisfy J1+J2=0. Then, as a result of the generation of the positive pulse wave J2b, the voltage signal (capacitance derivative signal) Vout(t) output from the amplifier 123a is saturated to the positive side (waveform PB). This saturation waveform PB continues for a predetermined period according to the height of the pulse wave J1b and converges at time t1'. When the voltage signal Vout(t) is saturated to the positive side, the inverting input terminal of the amplifier 123a cannot maintain virtual ground. Therefore, the inverting input terminal voltage Va of the amplifier 123a drops momentarily in order to increase the feedback current J2. (waveform Vab).

The above operation is also described in the above Equation (2). That is, Equation (2) includes the time derivative dVin(t)/dt of the drive voltage Vin(t). dVin(t)/dt can be ignored as long as the drive voltage Vin(t) is constant. However, dVin(t)/dt cannot be ignored when the drive voltage Vin(t) rises and drops, but rather has an excessive effect on the capacitance derivative signal Vout(t). For example, when the capacitance $C_a$ is 10 pF, the dVin(t) is 100 V, and the rise (or fall) time dt is 100 ns, the second term on the right side of Equation (2) can be calculated as [Equation 10].

[Equation 10]

$$C_a(t) \frac{dVin(t)}{dt} = \frac{10 \times 10^{-12} \times 100}{100 \times 10^{-9}} = 10 (mA) \tag{10}$$

When the resistance value $R_f$ of the feedback resistor 123b is, for example, 1 MΩ described above, the output voltage Vout(t) of the amplifier 123a is calculated to be 1000 V, and accordingly, it can be easily understood that the output voltage Vout(t) is saturated.

Therefore, in the period from time t0 to time t1 and the period from time t0' to time t1', even if the capacitance $C_a$ between the fixed comb electrodes 16 and 18 and the movable comb electrodes 17 and 19 changes due to the movement of the movable mirror 5, the change does not appear in the capacitance derivative signal Vout(t), and accordingly, the change cannot be detected.

Figure 36:
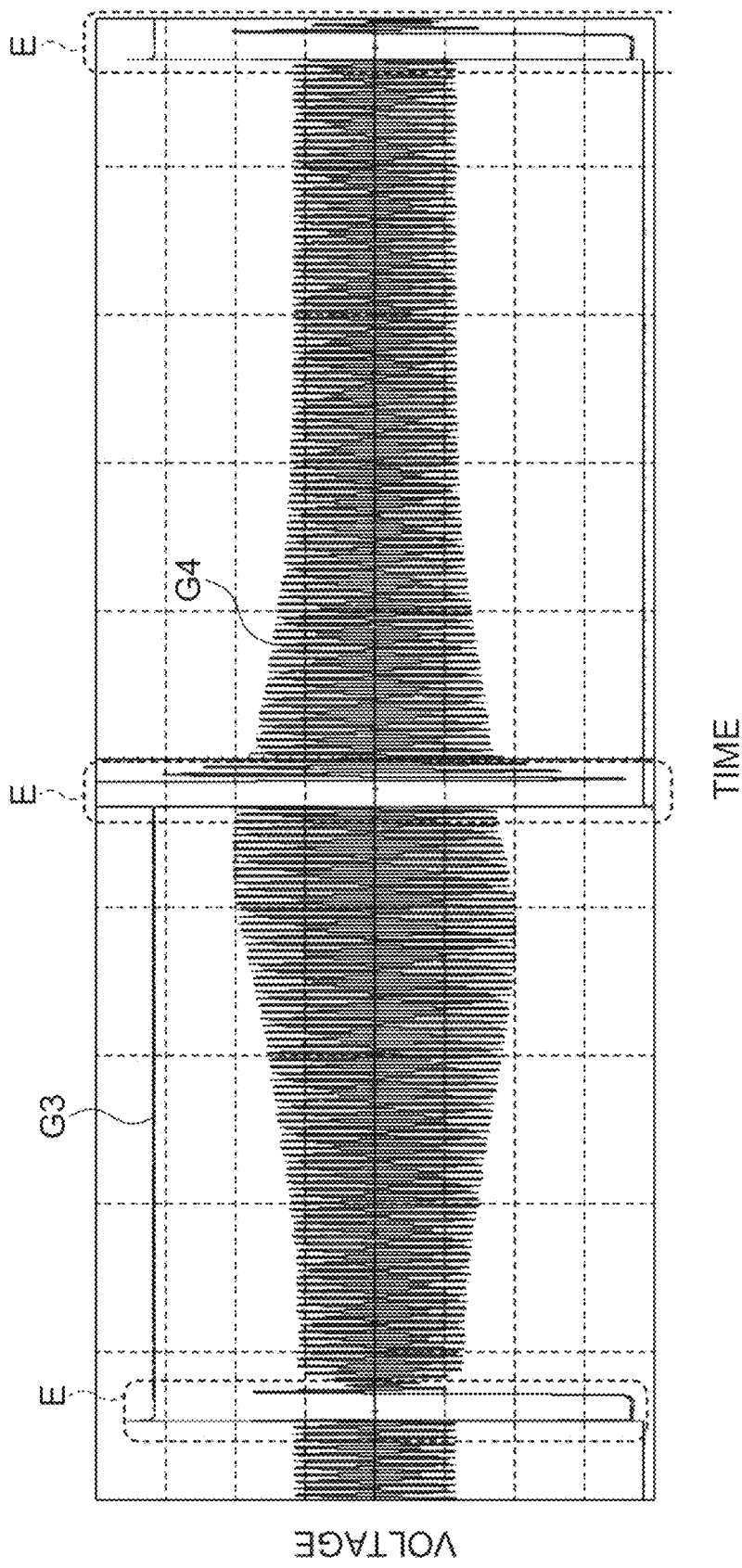
FIG. 36 is a graph showing an example in which a signal Sb output from an arithmetic circuit 204 is measured in the circuit of the comparative example shown in FIG. 32.

In addition, FIG. 36 is a graph showing an example in which the signal Sb output from the arithmetic circuit 204 is measured in the circuit of the comparative example shown in FIG. 32. In addition, in the diagram, a graph G3 shows the drive voltage Vin(t), and a graph G4 shows the signal Sb. Referring to a portion E in FIG. 36, it can be seen that the signal Sb is completely shaken and saturated at the rising and falling timings of the drive voltage Vin(t). Thus, the same problem as described above arises in the method of the comparative example shown in FIG. 32.

Figure 16:
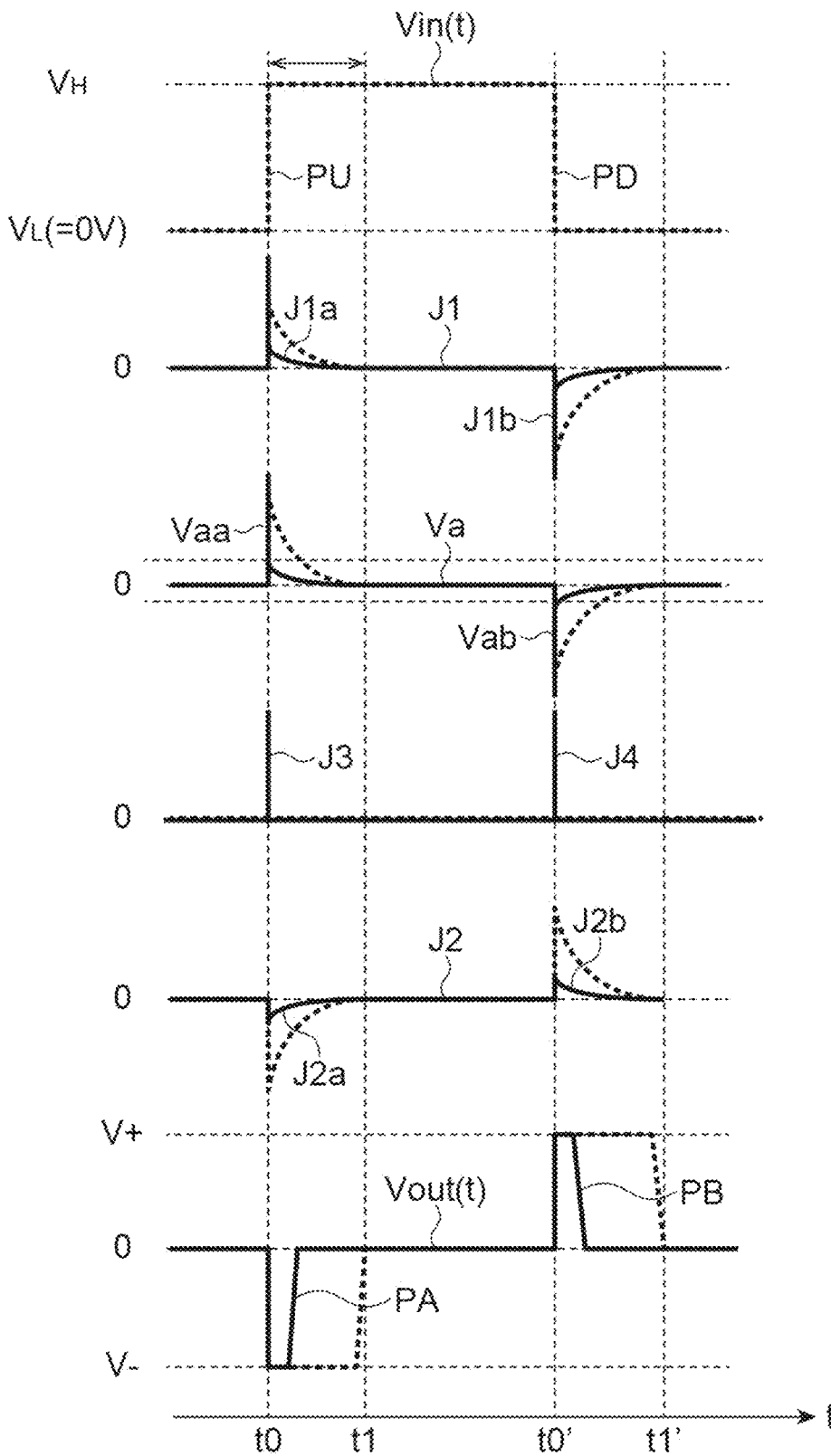
FIG. 16 is a diagram showing the time waveforms of the drive voltage Vin(t), the current signal J1, the inverting input terminal voltage Va of the amplifier 123a, currents J3 and J4, the feedback current J2, and the capacitance derivative signal Vout(t) when the capacitance $C_a$ does not change in a first modification example.

In response to the above problem, the clamp circuit 125 is provided in this modification example. FIG. 16 is a diagram showing the time waveforms of the drive voltage Vin(t), the current signal J1, the inverting input terminal voltage Va of the amplifier 123a, currents J3 and J4, the feedback current J2, and the capacitance derivative signal Vout(t) when the capacitance $C_a$ does not change in this modification example. Also in the diagram, it is assumed that the drive voltage Vin(t) rises at time t0 and drops at time t0'. In addition, for comparison, the time waveform shown in FIG. 15 is shown by a broken line.

When the drive voltage Vin(t) rises at time t0, the charge momentarily flows into the capacitor between the fixed comb electrodes 16 and 18 and the movable comb electrodes 17 and 19 to generate the positive pulse wave J1a in the current signal J1. At this time, since the diode 125a is turned on and the current J3 flows, the height of the pulse wave J1a is suppressed. Therefore, in order to satisfy J1+J2=0, the height of the negative pulse wave J2a generated in the feedback current J2 is also suppressed. Therefore, the saturation waveform PA to the negative side of the capacitance derivative signal Vout(t) converges in a short time.

In addition, when the drive voltage Vin(t) drops at time t0', the charge stored in the capacitor between the fixed comb electrodes 16 and 18 and the movable comb electrodes 17 and 19 flows out momentarily to generate a negative pulse wave J1b in the current signal J1. At this time, since the diode 125b is turned on and the current J4 flows, the height of the pulse wave J1b is suppressed. Therefore, in order to satisfy J1+J2=0, the height of the positive pulse wave J2b generated in the feedback current J2 is also suppressed. Therefore, the saturation waveform PB to the positive side of the capacitance derivative signal Vout(t) also converges in a short time.

As described above, according to this modification example, by providing the clamp circuit 125, it is possible to shorten the fluctuation period of the capacitance derivative signal Vout(t) caused by the rising PU and the falling PD of the drive voltage Vin(t). Therefore, it is possible to suppress a situation in which the detection of the timing when the capacitance derivative signal Vout(t) reaches a predetermined threshold value is interrupted by the fluctuation.

In addition, FIG. 17(a) is a circuit diagram showing the clamp circuit 125 in this modification example, and FIG. 17(b) is a circuit diagram showing a general protection circuit 126 provided in the operational amplifier. As shown in FIG. 17(a), in the clamp circuit 125 of this modification example, diodes 125a and 125b having different orientations are connected in parallel to each other between the node N2 and the reference potential line GND. On the other hand, as shown in the FIG. 17(b), in the general protection circuit 126, the anode of one diode 126a is connected to the node N2, and the cathode is connected to a positive constant potential line V+. In addition, the anode of the other diode 126b is connected to a negative constant potential line V−, and the cathode is connected to the node N2. In other words, the diodes 126a and 126b are connected in series between the constant potential line V− and the constant potential line V+ in the same direction, and the node N2 between the diode 126a and the diode 126b is connected to the inverting input terminal of the amplifier 123a. Therefore, the configuration of the clamp circuit 125 of this modification example is completely different from the configuration of the general protection circuit 126 provided in the operational amplifier.

Second Modification Example

Figure 18:
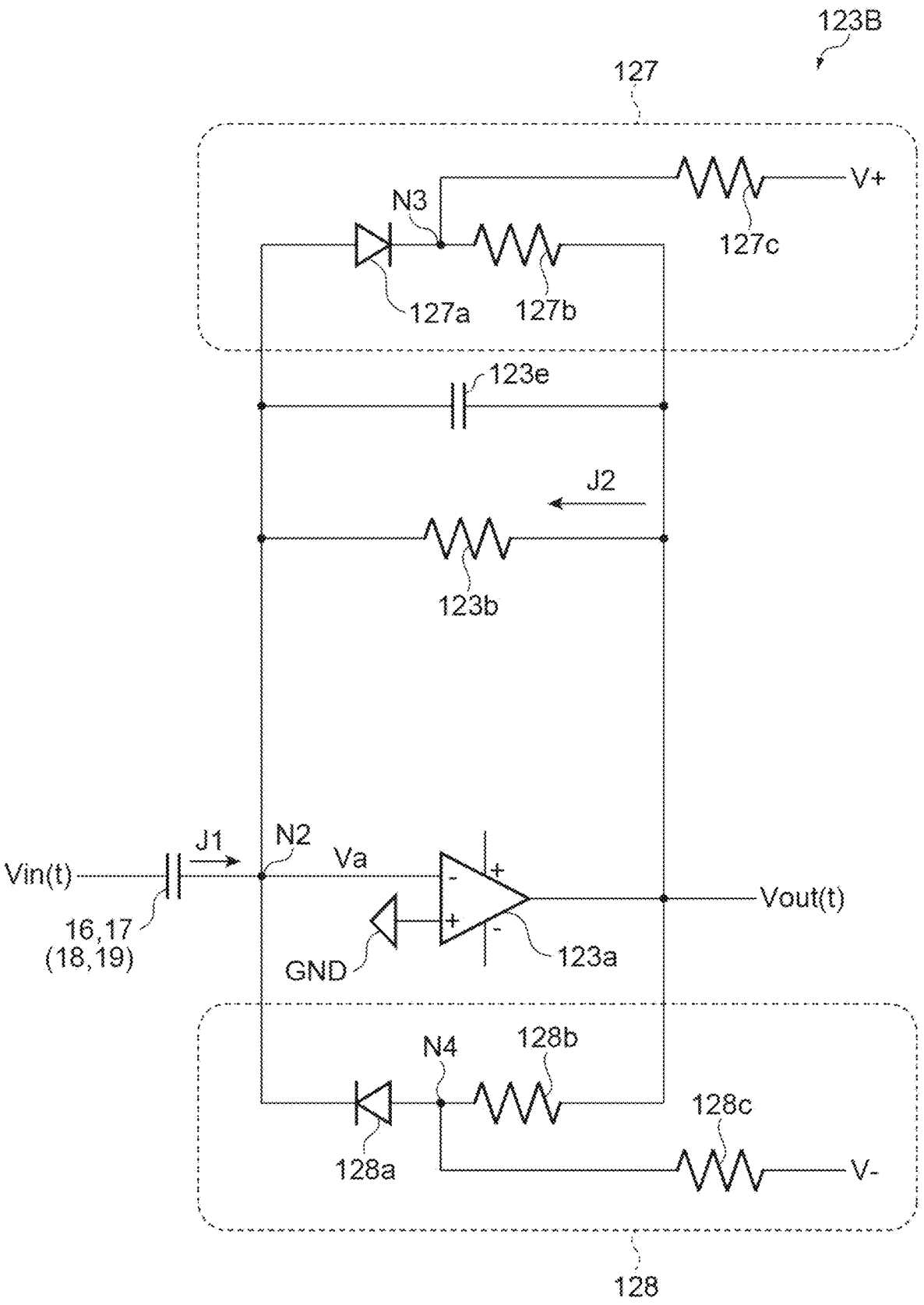
FIG. 18 is a circuit diagram showing the configuration of a current-voltage conversion circuit 123B according to a second modification example.

FIG. 18 is a circuit diagram showing the configuration of a current-voltage conversion circuit 123B according to a second modification example of the embodiment described above. As shown in the diagram, the current-voltage conversion circuit 123B includes an amplifier 123a, a feedback resistor 123b, and a capacitor 123e. Since the configurations thereof are the same as those in the first modification example described above, the description thereof will be omitted.

The current-voltage conversion circuit 123B further includes soft limiter circuits 127 and 128. The soft limiter circuits 127 and 128 are provided in order to shorten the fluctuation period of the capacitance derivative signal Vout (t) caused by the rising PU and the falling PD of the drive voltage Vin(t). In this example, the soft limiter circuit 127 has a switching diode (hereinafter, simply referred to as a diode) 127a and resistors 127b and 127c. The diode 127a and the resistor 127b are connected in series to each other between the node N2 and the output terminal of the amplifier 123a. More specifically, the anode of the diode 127a is connected to the node N2, and the cathode of the diode 127a is connected to the output terminal of the amplifier 123a through the resistor 127b. In addition, a node N3 between the diode 127a and the resistor 127b is connected to the positive constant potential line V+ through the resistor 127c.

In addition, the soft limiter circuit 128 has a switching diode (hereinafter, simply referred to as a diode) 128a and resistors 128b and 128c. The diode 128a and the resistor 128b are connected in series to each other between the node N2 and the output terminal of the amplifier 123a. More specifically, the anode of the diode 128a is connected to the output terminal of the amplifier 123a through the resistor 128b, and the cathode of the diode 128a is connected to the node N2. In addition, a node N4 between the diode 128a and the resistor 128b is connected to the negative constant potential line V-through the resistor 128c.

FIGS. 19, 20, and 21 are diagrams for explaining the operation of this modification example. FIGS. 19(a), 20(a), and 21(a) show the current-voltage conversion circuit 123B shown in FIG. 18 in a simplified manner. FIGS. 19(b), 20(b), and 21(b) are graphs showing the correlation between the current signal J1 and the capacitance derivative signal Vout. A region F1 shown in FIG. 19(b) is a region centered on a point (that is, the origin) where both the current signal J1 and the capacitance derivative signal Vout are zero, and there is a proportional relationship between the current signal J1 and the capacitance derivative signal Vout. The proportional coefficient of this proportional relationship is determined by the resistance value $R_f$ of the feedback resistor 123b. In the region F1, as shown in FIG. 19(a), the current signal J1 and the feedback current J2 flow toward the node N1 and cancel each other out. In the region F1, the soft limiter circuits 127 and 128 do not operate.

On the other hand, a region F2 shown in FIG. 20(b) is a region where the capacitance derivative signal Vout exceeds a predetermined voltage $V_{L+}$, and there is a proportional relationship between the current signal J1 and the capacitance derivative signal Vout. In the region F2, when the capacitance derivative signal Vout exceeds the predetermined voltage $V_{L+}$, the diode 128a is turned on and accordingly, a feedback current J5 flows through the diode 128a and the resistor 128b. At this time, if the resistance value $R_g$ of the resistor 128b is sufficiently smaller than the resistance value $R_f$ of the feedback resistor 123b, the feedback current J5 becomes large enough that the feedback current J2 can be ignored, so that the proportional coefficient between the current signal J1 and the capacitance derivative signal Vout is determined by the resistance value $R_g$ of the resistor 128b. Therefore, since the proportional coefficient in the region F2 is smaller than the proportional coefficient in the region F1, the inclination is reduced.

Similarly, a region F3 shown in FIG. 21(b) is a region where the capacitance derivative signal Vout is below a predetermined voltage $V_{L-}$, and there is a proportional relationship between the current signal J1 and the capacitance derivative signal Vout. In the region F3, when the capacitance derivative signal Vout falls below the predetermined voltage $V_{L-}$, the diode 127a is turned on and accordingly, a feedback current J6 flows through the resistor 127b and the diode 127a. At this time, if the resistance value $R_h$ of the resistor 127b is sufficiently smaller than the resistance value $R_f$ of the feedback resistor 123b, the feedback current J6 becomes large enough that the feedback current J2 can be ignored, so that the proportional coefficient between the current signal J1 and the capacitance derivative signal Vout is determined by the resistance value $R_h$ of the resistor 127b. Therefore, since the proportional coefficient in the region F3 is smaller than the proportional coefficient in the region F1, the inclination is reduced. In addition, the resistance value $R_h$ of the resistor 127b may be equal to the resistance value $R_g$ of the resistor 128b. In this case, the proportional coefficient in the region F3 is equal to the proportional coefficient in the region F2.

In addition, the voltage $V_{L+}$ and the voltage $V_{L-}$ are determined by the following Equations (11) and (12). $V_F$ is the forward voltage of each of the diodes 127a and 128a. In addition, $R_i$ is the resistance value of the resistor 128c, and $R_j$ is the resistance value of the resistor 127c.

[Equation 11]

$$V_{L+} = \frac{R_g}{R_i}V_{REF} + \left(1+\frac{R_g}{R_i}\right)V_F \tag{11}$$

[Equation 12]

$$V_{L-} = -\left\{\frac{R_h}{R_j}V_{REF} + \left(1+\frac{R_h}{R_j}\right)V_F\right\} \tag{12}$$

Also in this modification example, by the same operation as in the first modification example, the saturation waveform PA of the capacitance derivative signal Vout(t) when the drive voltage Vin(t) rises (see FIG. 16) and the saturation waveform PB of the capacitance derivative signal Vout(t) when the drive voltage Vin(t) drops (see FIG. 16) converge in a short time. Therefore, according to this modification example, by providing the soft limiter circuits 127 and 128, it is possible to shorten the fluctuation period of the capacitance derivative signal Vout(t) caused by the rising PU and the falling PD of the drive voltage Vin(t). Therefore, it is possible to suppress a situation in which the detection of the timing when the capacitance derivative signal Vout(t) reaches a predetermined threshold value is interrupted by the fluctuation. In addition, the current-voltage conversion circuit may include the soft limiter circuits 127 and 128 of this modification example and the clamp circuit 125 of the first modification example in combination.

Figure 22:
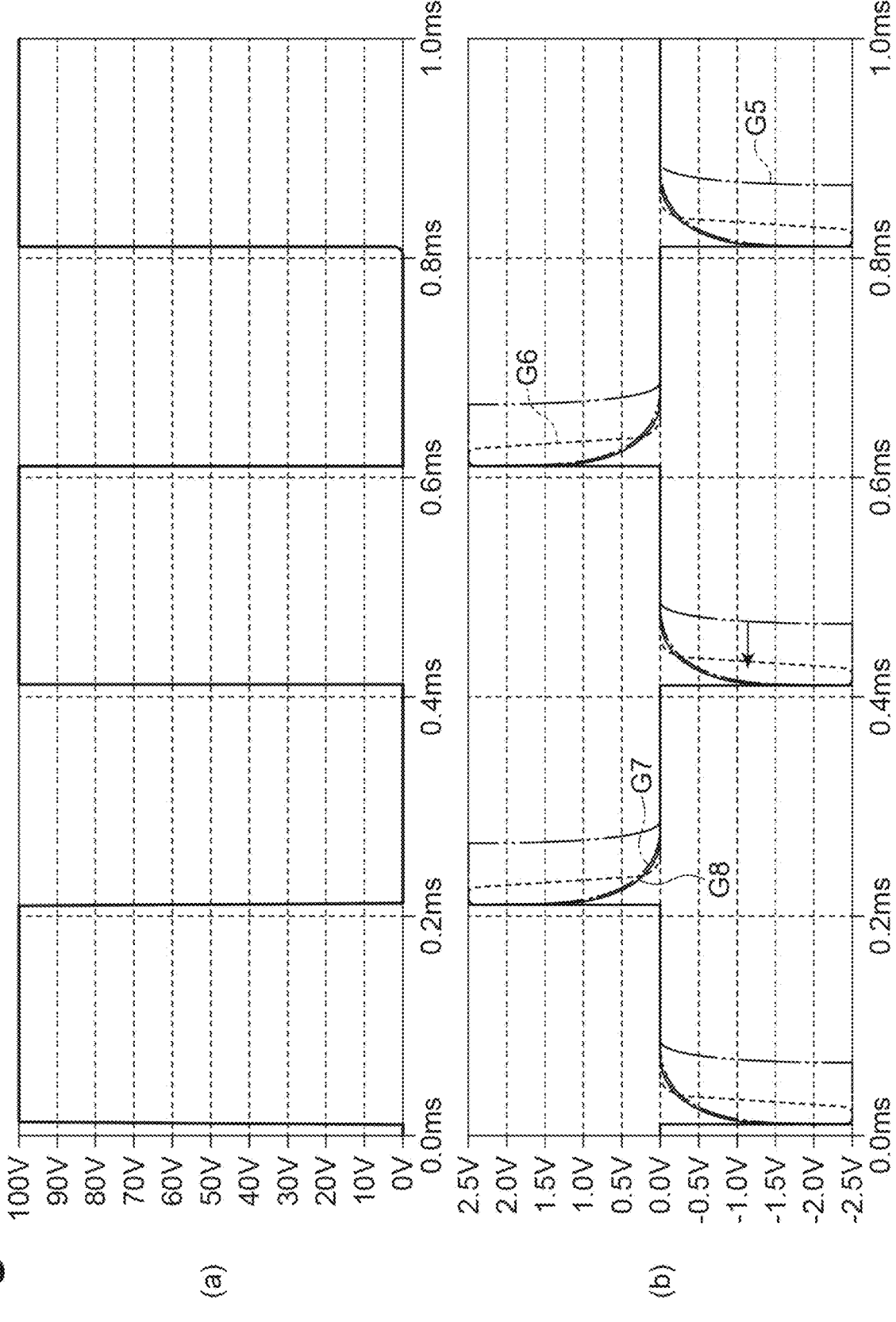
FIG. 22 is a graph relevant to the simulation results of the first modification example and the second modification example.

FIG. 22 is a graph relevant to the simulation results of the first modification example and the second modification example. FIG. 22(a) shows the time change of the drive voltage Vin(t). In FIG. 22(a), the vertical axis indicates voltage (unit: V) and the horizontal axis indicates time (unit: milliseconds). In addition, FIG. 22(b) shows the time change of the capacitance derivative signal Vout(t). In FIG. 22(b), the vertical axis indicates voltage (unit: V) and the horizontal axis indicates time (unit: milliseconds). In addition, in FIG. 22(b), a graph G5 shows a case where neither the clamp circuit nor the soft limiter circuit is provided, a graph G6 shows a case where the clamp circuit 125 is provided, a graph G7 shows a case where the soft limiter circuits 127 and 128 are provided, and a graph G8 shows a case where the clamp circuit 125 and the soft limiter circuits 127 and 128 are provided. As is apparent from the graphs G5 to G8, by providing at least one of the clamp circuit 125 and the soft limiter circuits 127 and 128, it is possible to shorten the fluctuation period of the capacitance derivative signal Vout(t) caused by the rising PU and the falling PD of the drive voltage Vin(t). In particular, the effect when the soft limiter circuits 127 and 128 are provided is noticeable.

Third Modification Example

Figure 23:
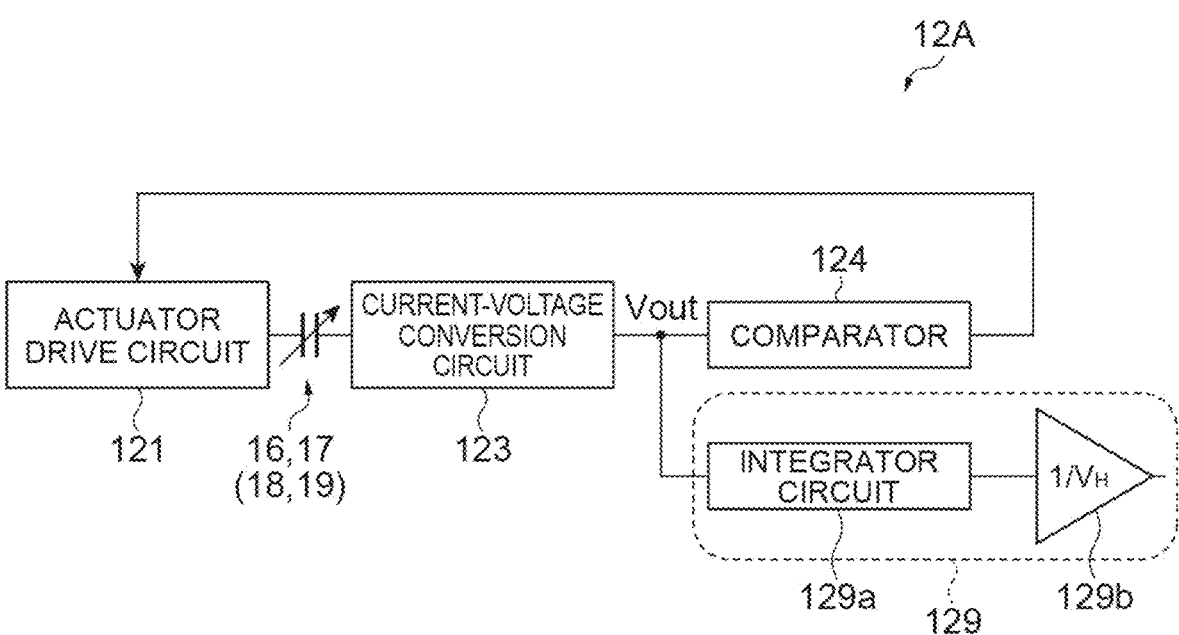
FIG. 23 is a block diagram showing the configuration of a drive unit 12A according to a third modification example.

FIG. 23 is a block diagram showing the configuration of a drive unit 12A according to a third modification example of the embodiment described above. The drive unit 12A of this modification example further includes a displacement amount detection unit 129 in addition to the configuration of the drive unit 12 (see FIG. 5) of the embodiment described above. The displacement amount detection unit 129 includes an integrator circuit 129a and an amplifier 129b. The integrator circuit 129a is connected to the output end of the current-voltage conversion circuit (TIA) 123, and receives the capacitance derivative signal Vout(t) from the current-voltage conversion circuit 123. Then, the integrator circuit 129a time-integrates the capacitance derivative signal Vout(t).

Figure 24:
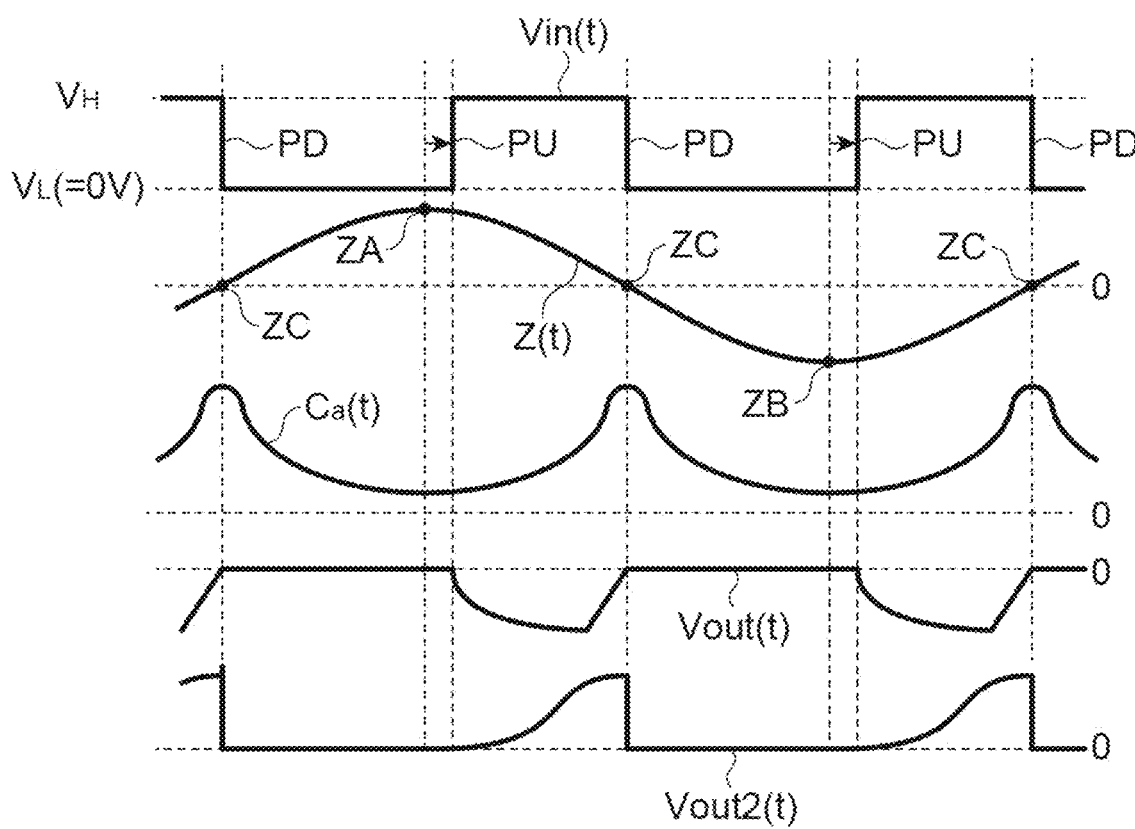
FIG. 24 is a graph showing the time change of each signal in the third modification example.

FIG. 24 is a graph showing the time change of each signal in this modification example. In the diagram, in order from the top, the drive voltage Vin(t), the displacement amount Z(t) of the movable mirror 5, the capacitance $C_a(t)$, the output voltage Vout(t), and the output voltage waveform Vout2(t) from the integrator circuit 129a are shown. In addition, the vertical axis of each graph indicates voltage or capacitance, and the horizontal axis of each graph indicates time. The integrator circuit 129a is reset within a period in which the drive voltage Vin(t) is $V_L$.

Here, the following Equation (13) is satisfied. Therefore, in order to obtain a value corresponding to $\Delta C_a$, the integration result may be divided by $V_H$. The amplifier 129b is provided for that purpose and amplifies the output signal from the integrator circuit 129a with a gain of $(1/V_H)$ times.

[Equation 13]

$$\Delta Ca \propto -\frac{1}{V_H R_f} \int_{i=0}^{i=1} Vout(t)dt \qquad (13)$$

As in this modification example, the displacement amount of the movable mirror 5 in a predetermined period can be easily detected by time-integrating the capacitance derivative signal Vout(t). In addition, the displacement amount detection unit 129 of this modification example may be provided in the first modification example or the second modification example.

Fourth Modification Example

In the embodiment described above, the drive voltage Vin(t) is applied between the fixed comb electrode 16 (18) and the movable comb electrode 17 (19), and the timing when the capacitance derivative signal Vout(t) reaches a predetermined threshold value is detected based on the current signal J1 output from the fixed comb electrode 16 (18) or the movable comb electrode 17 (19). The present invention is not limited to such a form, and the drive voltage Vin(t) may be applied between a part of the fixed comb electrode 16 (18) and a part of the movable comb electrode 17 (19) while applying a voltage for timing detection between the remaining part of the fixed comb electrode 16 (18) and the remaining part of the movable comb electrode 17 (19), and the timing when the capacitance derivative signal Vout(t) reaches a predetermined threshold value may be detected based on the current signal J1 output from any of the remaining parts.

For example, in the configuration shown in FIG. 4, the first electrode support portion 138a (148a) is electrically separated from the second electrode support portion 138b (148b) and the third electrode support portion 138c (148c), and a portion 16A (18A) of the fixed comb electrode 16 (18) facing the first electrode support portion 138a (148a) is electrically separated from a portion 16B (18B) of the fixed comb electrode 16 (18) facing each of the second electrode support portion 138b (148b) and the third electrode support portion 138c (148c). Then, the drive voltage Vin(t) is applied between the second electrode support portion 138b (148b) and the third electrode support portion 138c (148c) and the fixed comb electrode 16B (18B) to drive the movable mirror 5. On the other hand, the current-voltage conversion circuit 123 and the comparator 124 are connected to the first electrode support portion 138a (148a) or the fixed comb electrode 16A (18A), and a voltage for timing detection is applied between the first electrode support portion 138a (148a) and the fixed comb electrode 16A (18A). Then, based on the current signal J1 output from the first electrode support portion 138a (148a) or the fixed comb electrode 16A (18A), the timing when the capacitance derivative signal Vout(t) reaches a predetermined threshold value is detected.

That is, the mirror device of this modification example has the base 11, the movable mirror 5 (movable portion) supported so as to be elastically displaceable with respect to the base 11, the first fixed comb electrode 16B (18B) that includes a plurality of first comb fingers (a plurality of comb fingers 16a (18a) facing the second electrode support portions 138b (148b) and the third electrode support portions 138c (148c)) and is provided on the base 11, and a first movable comb electrode 17B (19B) that includes a plurality of second comb fingers (a plurality of comb fingers 17a (19a) extending from the second electrode support portion 138b (148b) and the third electrode support portion 138c (148c)) and drives the movable mirror 5 by the electrostatic force generated between the first fixed comb electrode 16B (18B) and the first movable comb electrode 17B (19B), the plurality of first comb fingers and the plurality of second comb fingers being alternately arranged. In addition, the mirror device of this modification example includes the second fixed comb electrode 16A (18A) including a plurality of third comb fingers (a plurality of comb fingers 16a (18a) facing the first electrode support portion 138a (148a)) and provided on the base 11 and a second movable comb electrode 17A (19A) including a plurality of fourth comb fingers (a plurality of comb fingers 17a (19a) extending from the first electrode support portion 138a (148a)), the plurality of third comb fingers and the plurality of fourth comb fingers being alternately arranged. Then, the actuator drive circuit 121 applies the drive voltage Vin(t) having a time waveform periodically repeating the rising PU and the falling PD between the first fixed comb electrode 16B (18B) and the first movable comb electrode 17B (19B).

Figure 25:
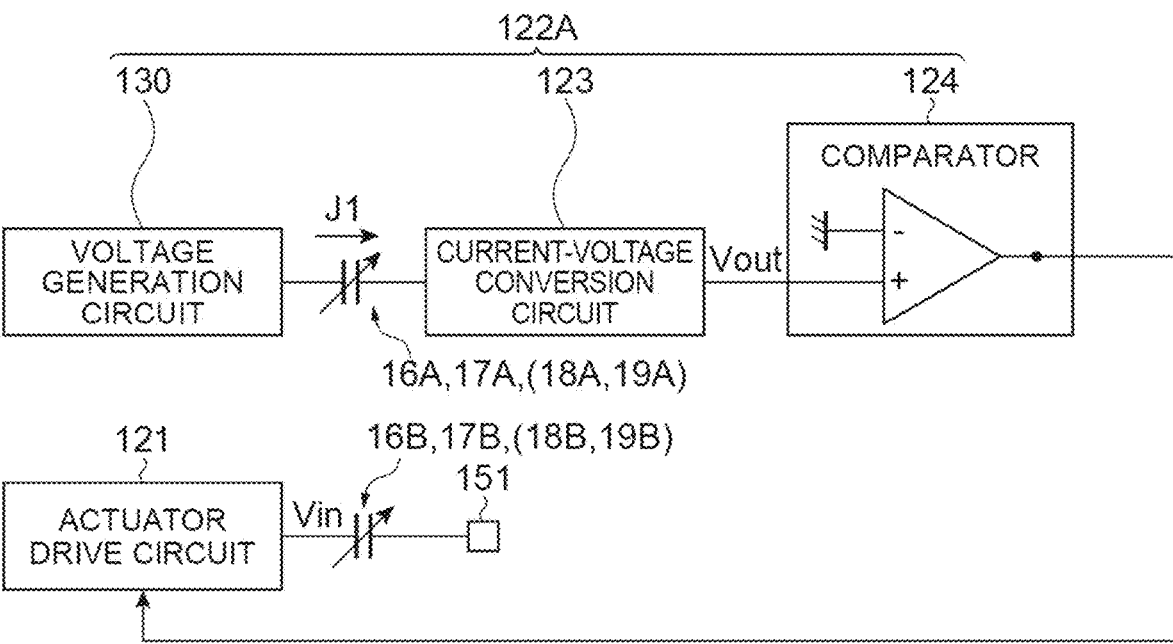
FIG. 25 is a diagram schematically showing the configuration of a timing detection circuit 122A included in a mirror device of a fourth modification example.

Here, FIG. 25 is a diagram schematically showing the configuration of a timing detection circuit 122A included in the mirror device of this modification example. The timing detection circuit 122A includes a voltage generation circuit 130, a current-voltage conversion circuit 123, and a comparator 124. The voltage generation circuit 130 applies a voltage for timing detection including a period of constant voltage $V_H$ excluding 0 V between the second fixed comb electrode 16A (18A) and the second movable comb electrode 17A (19A) shown as variable capacitors. The current-voltage conversion circuit 123 generates the capacitance derivative signal Vout(t) by converting the current signal J1, which is output from the second fixed comb electrode 16A (18A) or the second movable comb electrode 17A (19A) within the period due to the change in the capacitance $C_a$ between the second fixed comb electrode 16A (18A) and the second movable comb electrode 17A (19A), into a voltage signal. The comparator 124 detects the timing when the capacitance derivative signal Vout(t) reaches a predetermined threshold value. In addition, the detailed configurations of the current-voltage conversion circuit 123 and the comparator 124 are the same as those in the embodiment described above. The actuator drive circuit 121 generates the drive voltage Vin(t) so that the relationship between the timing detected by the timing detection circuit 122A and the timing of the falling PD is constant. The drive voltage Vin(t) is applied between the first fixed comb electrode 16B (18B) and the first movable comb electrode 17B (19B) shown as variable capacitors. In addition, of the first fixed comb electrode 16B (18B) and the first movable comb electrode 17B (19B), the comb electrode on a side opposite to a side connected to the actuator drive circuit 121 is electrically connected to the constant potential wiring or has a floating potential.

In this modification example, the drive voltage Vin(t) having a time waveform periodically repeating the rising PU and the falling PD is applied between the first fixed comb electrode 16B (18B) and the first movable comb electrode 17B (19B). Therefore, by bringing the frequency of the drive voltage Vin(t) close to the resonance frequency of the movable mirror 5, the amplitude of the movable mirror 5 can be brought close to the maximum amplitude. At this time, since the second movable comb electrode 17A (19A) is also displaced together with the movable mirror 5, the current signal J1 is output from the second fixed comb electrode 16A (18A) or the second movable comb electrode 17A (19A) due to the change in the capacitance $C_a$ between the second fixed comb electrode 16A (18A) and the second movable comb electrode 17A (19A). When a voltage for timing detection including a period to be constant voltage $V_H$ excluding 0 V is applied between the second fixed comb electrode 16A (18A) and the second movable comb electrode 17A (19A), the current signal J1 within the period indicates the derivative value of the capacitance $C_a$ between the second fixed comb electrode 16A (18A) and the second movable comb electrode 17A (19A). For example, when the movable mirror 5 passes through the center of the amplitude, the current value of the current signal J1 momentarily becomes zero.

In this modification example, a voltage for timing detection including a period to be constant voltage $V_H$ excluding 0 V is applied between the second fixed comb electrode 16A (18A) and the second movable comb electrode 17A (19A). Then, by converting the current signal J1 output from the second fixed comb electrode 16A (18A) or the second movable comb electrode 17A (19A) within the period into a voltage signal, the capacitance derivative signal Vout(t) indicating the derivative value of the capacitance $C_a$ is generated. In addition, the timing when the capacitance derivative signal Vout(t) reaches a predetermined threshold value is detected, and the relationship between the timing and the timing of the falling PD is controlled to be constant. Therefore, since the position of the movable mirror 5 at the time of falling PD of the drive voltage Vin(t) can be made constant, the frequency of the drive voltage Vin(t) can be brought close to the resonance frequency regardless of the fluctuation in the resonance frequency of the movable mirror 5.

In addition, in this modification example, the drive voltage Vin(t) is applied to the plurality of comb fingers 17a (19a) extending from the second electrode support portion 138b (148b) and the third electrode support portion 138c (148c), and the voltage for timing detection is applied to the plurality of comb fingers 17a (19a) extending from the first electrode support portion 138a (148a). As shown in FIG. 4, the distance between the first electrode support portion 138a (148a) and the movable mirror 5 is shorter than the distance between the second electrode support portion 138b (148b) and the third electrode support portion 138c (148c). As described above, the distance between the movable mirror 5 and the second movable comb electrode 17A (19A) to which the voltage for timing detection is applied may be shorter than the distance between the movable mirror 5 and the first movable comb electrode 17B (19B) to which the drive voltage Vin(t) is applied. In this case, the amplitude of the second movable comb electrode 17A (19A) can be made larger, and the second movable comb electrode 17A (19A) can be made to move faster. Therefore, it is possible to improve the detection accuracy of the timing when the capacitance derivative signal Vout(t) reaches a predetermined threshold value.

In addition, as in the embodiment described above, when the drive voltage Vin(t) is applied to all the comb electrodes (in other words, when the comb electrode for driving and the comb electrode for timing detection are shared), the driving force can be made higher by making the electrostatic attraction larger as compared with this modification example.

In addition, in this modification example, as described above, the voltage for timing detection is applied to the fixed comb electrode 16A (18A) and the movable comb electrode 17A (19A) different from the fixed comb electrode 16B (18B) and the movable comb electrode 17B (19B) to which the drive voltage Vin(t) is applied. Therefore, the voltage for timing detection does not need to repeat rising and falling periodically, and for example, the constant voltage $V_H$ may be continuously maintained.

Second Embodiment

Figure 26:
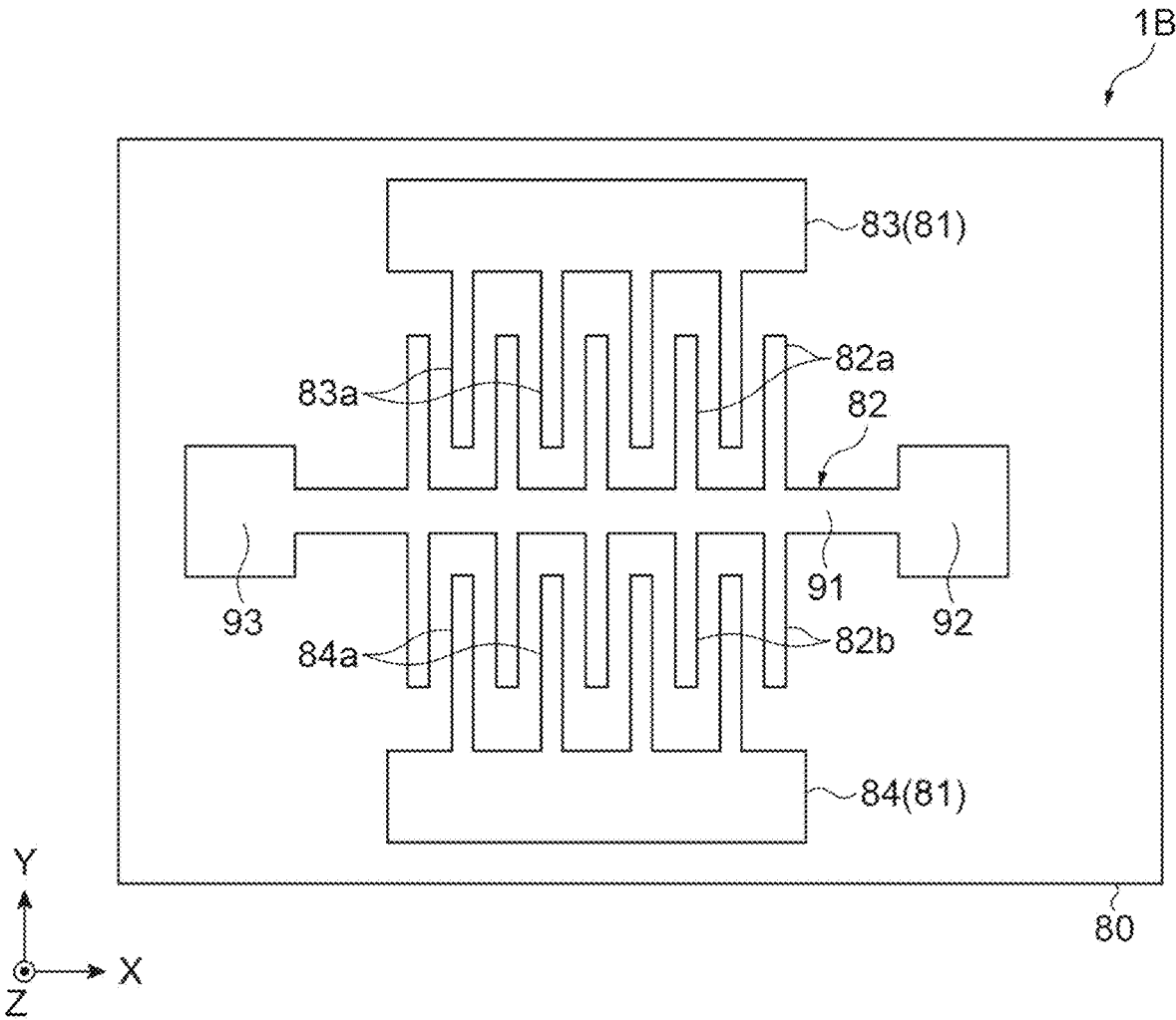
FIG. 26 is a block diagram showing the configuration of a MEMS actuator 1B as a second embodiment.

FIG. 26 is a block diagram showing the configuration of a MEMS actuator 1B as a second embodiment. Unlike the mirror device 7 of the embodiment described above, the MEMS actuator 1B has a slide-type movable portion that vibrates in a direction (Y direction in the present embodiment) crossing (for example, perpendicular to) the thickness direction, that is, the Z direction. Specifically, the MEMS actuator 1B according to the present embodiment includes a fixed comb electrode 81 and a movable comb electrode 82 arranged on a substrate 80 (base in the present embodiment). In the present embodiment, the fixed comb electrode 81 includes a first fixed comb electrode 83 and a second fixed comb electrode 84 fixed on the substrate 80. The first fixed comb electrode 83 includes a plurality of first comb fingers 83a. The plurality of first comb fingers 83a have an elongated shape with the Y direction as its longitudinal direction, and are arranged side by side in the X direction. The second fixed comb electrode 84 includes a plurality of first comb fingers 84a. The plurality of first comb fingers 84a have an elongated shape with the Y direction as its longitudinal direction, and are arranged side by side in the X direction. The first fixed comb electrode 83 and the second fixed comb electrode 84 are arranged so as to face each other in the Y direction with a beam 91 (movable portion in the present embodiment) for supporting the movable comb electrode 82 interposed therebetween. The plurality of first comb fingers 83a and the plurality of first comb fingers 84a extend toward the beam 91.

The movable comb electrode 82 is supported by the elastic beam 91, and there is a gap between the movable comb electrode 82 and the substrate 80 so that the movable comb electrode 82 can be displaced in the Y direction relative to the substrate 80. In the present embodiment, the beam 91 is integrally formed with the movable comb electrode 82. In addition, a fixing portion 92, which is one end portion of the beam 91, and a fixing portion 93, which is the other end portion of the beam 91, are fixed to the substrate 80. As a result, the movable comb electrode 82 has a double-sided beam structure.

The movable comb electrode 82 includes a plurality of second comb fingers 82a and a plurality of second comb fingers 82b. The plurality of second comb fingers 82a have an elongated shape with the Y direction as its longitudinal direction, and are arranged side by side in the X direction. Similarly, the plurality of second comb fingers 82b have an elongated shape with the Y direction as its longitudinal direction, and are arranged side by side in the X direction. The plurality of second comb fingers 82a are arranged on the side of the first fixed comb electrode 83 with respect to the beam 91, and extend from the beam 91 toward the first fixed comb electrode 83. The plurality of second comb fingers 82b are arranged on the side of the second fixed comb electrode 84 with respect to the beam 91, and extend from the beam 91 toward the second fixed comb electrode 84. The movable comb electrode 82 drives the beam 91 by the electrostatic force generated between the movable comb electrode 82 and the fixed comb electrode 81.

Figure 27:
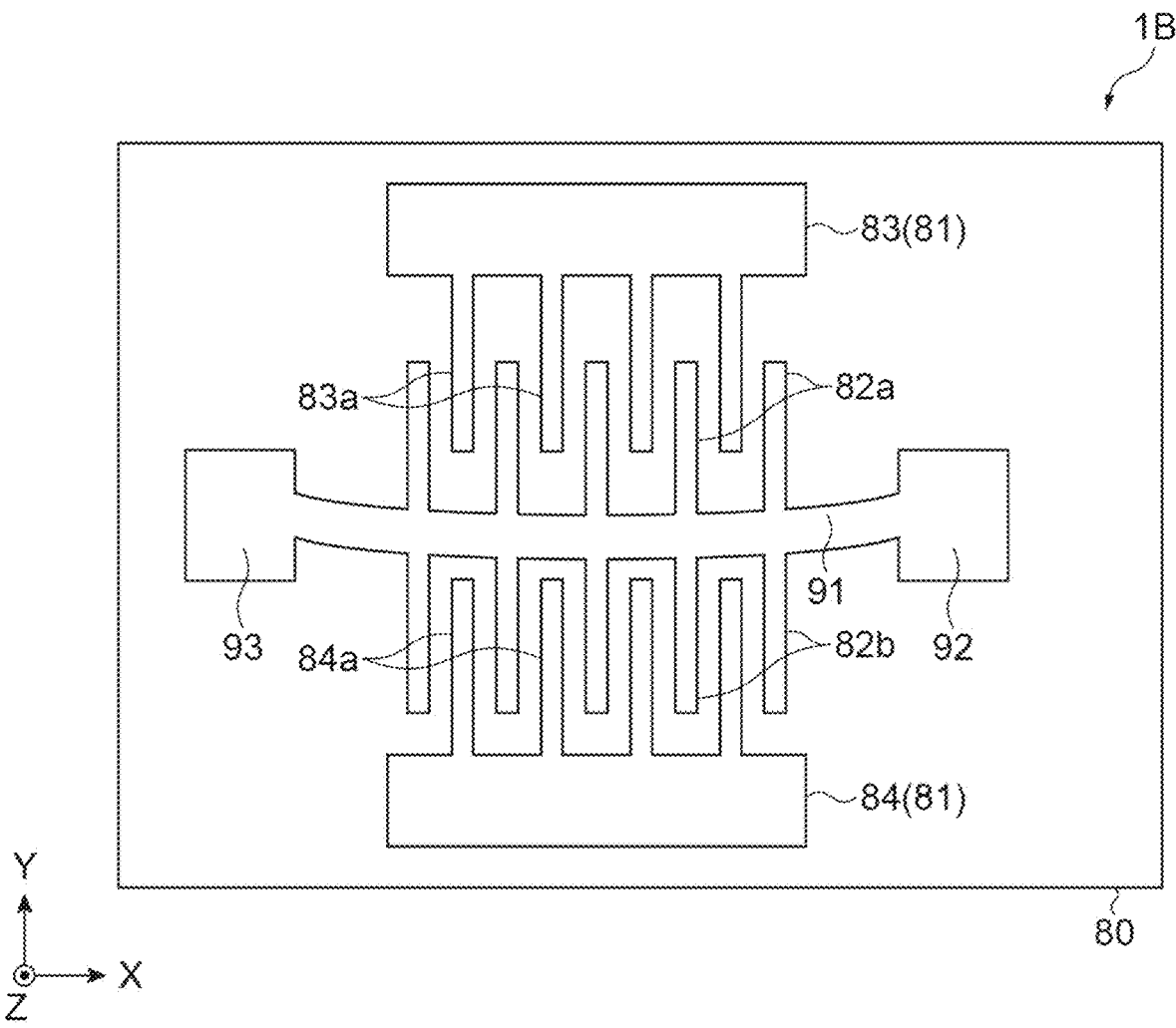
FIG. 27 is a diagram schematically showing a deformation state of a beam 91 when the beam 91 is located at one of vibrating ends.

A drive voltage having a frequency that matches the resonance frequency of the beam 91 is applied between the first fixed comb electrode 83 and the movable comb electrode 82. In addition, a drive voltage having a phase opposite to that of the drive voltage is applied between the second fixed comb electrode 84 and the movable comb electrode 82. That is, the drive voltage applied between the first fixed comb electrode 83 and the movable comb electrode 82 and the drive voltage applied between the second fixed comb electrode 84 and the movable comb electrode 82 have a complementary relationship therebetween. When the drive voltages are applied between the fixed comb electrodes 83 and 84 and the movable comb electrodes 82, the beam 91 vibrates in the Y direction due to the electrostatic attraction. FIG. 27 is a diagram schematically showing a deformation state of the beam 91 when the beam 91 is located at one of the vibrating ends.

The MEMS actuator 1B according to the present embodiment individually includes the actuator drive circuit 121, the current-voltage conversion circuit 123, and the comparator 124 shown in FIG. 5 for each of the fixed comb electrodes 83 and 84. Alternatively, the MEMS actuator 1B according to the present embodiment includes, instead of the current-voltage conversion circuit 123, the current-voltage conversion circuit 123A according to the first modification example, the current-voltage conversion circuit 123B according to the second modification example, or both. In addition, the MEMS actuator 1B according to the present embodiment may further include the displacement amount detection unit 129 according to the third modification example.

In the first embodiment, the configuration in which the movable portion (movable mirror 5) vibrates in the thickness direction of the comb electrode is exemplified. However, as in the present embodiment, the movable portion (beam 91) may vibrate in the longitudinal direction of the comb electrode. Even in this case, as in the first embodiment, the frequency of the drive voltage Vin(t) can be brought close to the resonance frequency regardless of the fluctuation in the resonance frequency of the movable portion.

FIG. 28(*a*) is a diagram schematically showing a capacitance C1 generated between the first fixed comb electrode 83 and the movable comb electrode 82 and a capacitance C2 generated between the second fixed comb electrode 84 and the movable comb electrode 82. The arrow in the diagram indicates the movement direction (Y direction) of the movable comb electrode 82. The movable comb electrode 82 vibrates in the Y direction while maintaining a constant distance $\Delta X$ in the X direction with respect to the first fixed comb electrode 83 and the second fixed comb electrode 84. Therefore, the capacitance C2 decreases as the capacitance C1 increases, and the capacitance C2 increases as the capacitance C1 decreases.

FIG. 28(*b*) is a circuit diagram showing the current-voltage conversion circuit 123 connected to the capacitors C1 and C2. In the present embodiment, the movable comb electrode 82 is provided in common with respect to the first fixed comb electrode 83 and the second fixed comb electrode 84. Therefore, in this circuit diagram, one electrode of the capacitor C1 and one electrode of the capacitor C2 are short-circuited at a node N5. In addition, drive voltages Vin1(*t*) and Vin2(*t*) are applied to the other electrode of the capacitor C1 and the other electrode of the capacitors C2 (that is, the first fixed comb electrode 83 and the second fixed comb electrode 84), respectively. The drive voltage Vin1(*t*) and the drive voltage Vin2(*t*) are complementary to each other. That is, when the voltage value of the drive voltage Vin1(*t*) is $V_H$, the voltage value of the drive voltage Vin2(*t*) is $V_L$, and when the voltage value of the drive voltage Vin1(*t*) is $V_L$, the voltage value of the drive voltage Vin2(*t*) Is $V_H$.

Figure 29:
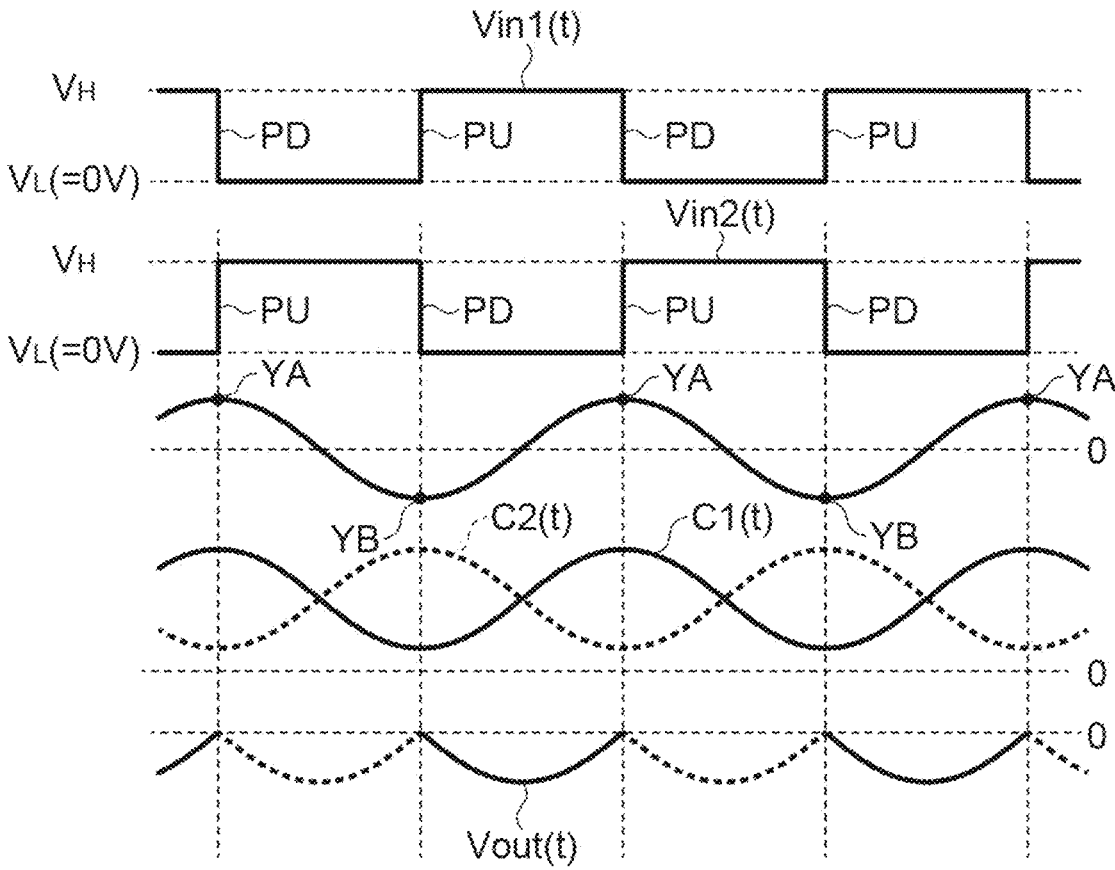
FIG. 29 is a graph showing the time change of each signal in an example.

FIG. 29 is a graph showing the time change of each signal in an example. In the diagram, the drive voltage Vin1(*t*), the drive voltage Vin2(*t*), the displacement amount Y(t) of the beam 91, the capacitances C1 and C2, and the output voltage Vout(t) are shown in order from the top. In addition, the vertical axis of each graph indicates voltage or capacitance, and the horizontal axis of each graph indicates time.

Each of the drive voltages Vin1(*t*) and Vin2(*t*) has a time waveform in which rising PU and falling PD are alternately repeated at fixed periods. In the example shown in FIG. 29, the duty ratio is 50%, the timing of the rising PU of the drive voltage Vin1(*t*) and the timing of the falling PD of the drive voltage Vin2(*t*) match each other, and the timing of the falling PD of the drive voltage Vin1(*t*) and the timing of the rising PU of the drive voltage Vin2(*t*) match each other. In addition, the timings of the rising PU of the drive voltage Vin1(*t*) and the falling PD of the drive voltage Vin2(*t*) are controlled by the actuator drive circuit 121 so as to match the timing when the displacement amount Y(t) of the beam 91 becomes a minimum point YB farthest from the first fixed comb electrode 83. In addition, the timings of the falling PD of the drive voltage Vin1(*t*) and the rising PU of the drive voltage Vin2(*t*) are controlled by the actuator drive circuit 121 so as to match the timing when the displacement amount Y(t) of the beam 91 becomes a maximum point YA farthest from the second fixed comb electrode 84.

The capacitances C1(*t*) and C2(*t*) between the fixed comb electrodes 83 and 84 and the movable comb electrode 82 change according to the displacement amount Y(t) of the beam 91. The capacitance C1(*t*) becomes a maximum at the timing when the displacement amount Y(t) reaches the maximum point YA, and becomes a minimum at the timing when the displacement amount Y(t) reaches the minimum point YB. In addition, the capacitance C2(*t*) becomes a minimum at the timing when the displacement amount Y(t) reaches the maximum point YA, and becomes a maximum at the timing when the displacement amount Y(t) reaches the minimum point YB. Then, the output voltage Vout(t) from the current-voltage conversion circuit 123 is a value (solid line portion) indicating the time derivative of the capacitance C1(*t*) in a period in which the drive voltage Vin1(*t*) is the constant value $V_H$ excluding 0, and is a value (broken line portion) indicating the time derivative of the capacitance C2(*t*) in a period in which the drive voltage Vin2(*t*) is the constant value $V_H$ excluding 0.

The comparator 124 compares the output voltage Vout(t) with a predetermined threshold value (0 V in this example), and provides each actuator drive circuit 121 with an output voltage waveform including a pulse that rises when the output voltage Vout(t) reaches the threshold value. By using the rising timing of this pulse, each actuator drive circuit 121 controls the timing of the falling PD of the drive voltages Vin1(*t*) and Vin2(*t*). That is, the actuator drive circuit 121 matches the timing of the falling PD of the drive voltages Vin1(*t*) and Vin2(*t*) with the timing when the output voltage Vout(t) reaches a predetermined threshold value. In addition, as in the example shown in FIG. 9, the actuator drive circuit 121 may shift the timing of the falling PD after a predetermined time from the timing when the output voltage Vout(t) reaches a predetermined threshold value. Alternatively, as in the example shown in FIG. 10, the duty ratio may be set to be less than 50% (for example, 45%), and the timing of the rising PU of the drive voltages Vin1(*t*) and Vin2(*t*) may be controlled by the actuator drive circuit 121 so as to be slightly delayed from the timing when the displacement amount Y(t) of the beam 91 becomes the maximum point YA or the minimum point YB.

FIG. $30(a)$ is a graph showing the relationship between $(V_H)^2$ and the fluctuation width $\Delta C$ of the capacitance $C_a$ in the first embodiment. FIG. $30(b)$ is a graph showing the relationship between $(V_H)^2$ and the fluctuation width $\Delta C$ of the capacitances C1 and C2 in the second embodiment. In these diagrams, the vertical axis indicates the fluctuation width $\Delta C$ (unit: F), and the horizontal axis indicates $(V_H)^2$ (unit: $V^2$). As shown in FIG. $30(b)$, in the second embodiment of the slide method, it can be said that the relationship between the fluctuation width $\Delta C$ and $(V_H)^2$ is almost along the straight line L1 and the fluctuation width $\Delta C$ is almost proportional to $(V_H)^2$. On the other hand, in the first embodiment of the vertical movement method, there are two proportional coefficients in the relationship between the fluctuation width $\Delta C$ and $(V_H)^2$. That is, in a region where $(V_H)^2$ is less than a predetermined value, the relationship between the fluctuation width $\Delta C$ and $(V_H)^2$ is along the straight line L2, and in a region where $(V_H)^2$ is larger than the predetermined value, the relationship between the fluctuation width $\Delta C$ and $(V_H)^2$ is the straight line L3. In addition, the inclination of the straight line L2 and the inclination of the straight line L3 are different from each other, and the inclination of the straight line L2 is larger than the inclination of the straight line L3.

Such characteristics in the vertical movement method are considered to be due to the following factors. FIG. 31 is a diagram schematically showing the fixed comb electrode 16 (18) and the movable comb electrode 17 (19) in the first embodiment. Now, as shown in FIG. $31(a)$, when the movable comb electrode 17 (19) is displaced within a range in which at least a part of the movable comb electrode 17 (19) overlaps the fixed comb electrode 16 (18), the capacitance $C_a$ between the fixed comb electrode 16 (18) and the movable comb electrode 17 (19) includes an overlap capacitance $C_{a1}$ and a fringe capacitance $C_{a2}$. The overlap capacitance $C_{a1}$ is a capacitance generated in a portion where the fixed comb electrode 16 (18) and the movable comb electrode 17 (19) overlap each other. The fringe capacitance $C_{a2}$ is a capacitance generated in a portion where the fixed comb electrode 16 (18) and the movable comb electrode 17 (19) do not overlap each other. In this case, the change in the capacitance $C_a$ is mainly due to the increase and decrease in the overlap capacitance $C_{a1}$. On the other hand, as shown in FIG. $31(b)$, when the movable comb electrode 17 (19) is displaced to a range in which the movable comb electrode 17 (19) does not overlap the fixed comb electrode 16 (18), the capacitance $C_a$ between the fixed comb electrode 16 (18) and the movable comb electrode 17 (19) includes only the fringe capacitance $C_{a2}$. In this case, the change in the capacitance $C_a$ is mainly due to the increase and decrease in the fringe capacitance $C_{a2}$. It is considered that the characteristics shown in FIG. $30(a)$ occur because the degree of increase and decrease differs between the overlap capacitance $C_{a1}$ and the fringe capacitance $C_{a2}$.

The MEMS actuator, the MEMS actuator drive method, and the MEMS actuator control program according to the present disclosure are not limited to the embodiments described above, and various other modifications can be made. For example, in each embodiment and each modification example described above, a rectangular wave is exemplified as the time waveform of the drive voltage. However, the time waveform of the drive voltage is not limited to the rectangular wave as long as the time waveform of the drive voltage is a waveform that periodically repeats rising and falling and has a period including a constant voltage excluding 0. For example, as the time waveform of the drive voltage, a trapezoidal waveform in which at least one of the rising edge and the falling edge is inclined may be applied. In addition, when the rising waveform of the drive voltage includes an inclined portion, any of the timing between the inclined portion and a constant voltage portion after the rising, the timing between the inclined portion and a portion before the rising (0 V in the embodiment described above), and the timing in the middle of the inclined portion in the rising waveform can be regarded as the rising timing in the embodiment described above. Similarly, when the falling waveform of the drive voltage includes an inclined portion, any of the timing between the inclined portion and a constant voltage portion before the falling, the timing between the inclined portion and a portion after the falling (0 V in the embodiment described above), and the timing in the middle of the inclined portion in the falling waveform can be regarded as the falling timing in the embodiment described above.

In addition, in each embodiment described above, the present invention is applied to two types, a vertical vibration type and a slide type. However, the operation type of the MEMS actuator is not limited to these, and the present invention can also be applied to, for example, a type in which a movable portion rotates. In addition, in the rotating mirror type, the movable portion rotates around a rotation axis formed by an elastic body. In this case, if the amplitude of the movable comb electrode is increased to improve the timing detection accuracy, the movable comb electrode is provided at a position away from the rotation axis. However, the resonance frequency of the movable portion is inversely proportional to the square root of the moment of inertia, and the moment of inertia is proportional to the square of the distance from the rotation axis. For this reason, as the movable comb electrode moves away from the rotation axis, the weight of the movable comb electrode affects the moment of inertia, and the resonance frequency of the movable portion decreases. When the resonance frequency of the movable portion decreases, the rotation speed decreases. Therefore, since the amount of time change of the capacitance, that is, the capacitance derivative signal is reduced, the degree of improvement in the timing detection accuracy is suppressed. In addition, as the number of comb fingers of the movable comb electrode becomes larger, the movable comb electrode becomes heavier. For this reason, in order to achieve the desired resonance frequency, the number of comb fingers of the movable comb electrode should be reduced. As a result, there is a problem that it is difficult to obtain a large capacitance value. On the other hand, when the movable comb electrode is provided in the movable portion in the vertical vibration method, regardless of the position of the movable portion where the movable comb electrode is provided, the moment of inertia that increases is constant, and the amount of decrease in the resonance frequency is also constant. Therefore, the amount of decrease in the resonance frequency due to the provision of the movable comb electrode is smaller than that in the rotating mirror method. From such a point, in the vertical vibration method, the number of comb fingers can be made larger than that in the rotating mirror method, so that a large capacitance value can be obtained. Therefore, since the timing detection accuracy is high, it is possible to relatively easily match the timing when the movable portion passes through a predetermined position with the falling timing of the drive signal.

In addition, in the slide type, the speed of the movable portion is the slowest at the timing when the capacitance value is the largest (the timing when the capacitance derivative value is zero). When the speed of the movable portion decreases, the time change of the capacitance derivative value decreases, so that the timing detection accuracy is suppressed. On the other hand, in the vertical vibration type, the speed of the movable portion is the fastest at the timing when the capacitance value is the largest (the timing when the capacitance derivative value is zero). For this reason, the time change of the capacitance derivative value increases, and high timing detection accuracy can be obtained. Therefore, in the vertical vibration type, it is possible to relatively easily match the timing when the movable portion passes through a predetermined position with the falling timing of the drive signal as compared with the slide type.

REFERENCE SIGNS LIST

1A: optical module, 1B: MEMS actuator, 2: mirror unit, 3: package, 5: movable mirror (movable portion), 5a: mirror surface, 5b: mirror support portion, 6: fixed mirror, 6a: mirror surface, 7: mirror device, 7a, 7b: light passing portion, 8: optical functional member, 8a: surface, 8b: back surface, 9: stress reduction substrate, 11: base (base portion), 11a: main surface, 11b: back surface, 12, 12A: drive unit, 13: first elastic support portion, 14: second elastic support portion, 15: actuator portion, 16, 16A, 16B, 18, 18A, 18B: fixed comb electrode, 16a, 18a: fixed comb finger (first comb finger, third comb finger), 17, 17A, 17B, 19, 19A, 19B: movable comb electrode, 17a, 19a: movable comb finger (second comb finger, fourth comb finger), 20: SOI substrate, 21: support layer, 22: device layer, 23: intermediate layer, 31: support, 31a: surface, 33: lead pin, 33a: one end portion, 34: frame body, 34a: end face, 34b: stepped surface, 35: light transmissive member, 51: arrangement portion, 51a: surface, 52: frame portion, 53: connection portion, 54: rib portion, 54a: inner rib portion, 54b: outer rib portion, 54c: connecting rib portion, 71, 72: electrode pad, 80: substrate (base), 81: fixed comb electrode, 82: movable comb electrode, 82a, 82b: second comb finger, 83, 84: fixed comb electrode, 83a, 84a: first comb finger, 91: rib (movable portion), 92, 93: fixing portion, 121: actuator drive circuit, 122, 122A: timing detection circuit, 123, 123A, 123B: current-voltage conversion circuit (TIA), 123a: amplifier, 123b: feedback resistor, 123e: capacitor, 124: comparator, 125: clamp circuit, 125a, 125b: switching diode, 126: protection circuit, 126a, 126b: diode, 127, 128: soft limiter circuit, 127a, 128a: switching diode, 127b, 127c, 128b, 128c: resistor, 129: displacement amount detection unit, 129a: integrator circuit, 129b: amplifier, 130: voltage generation circuit, 131, 141: lever, 132, 142: first link member, 133, 143: second link member, 134, 144: intermediate member, 135, 145: first torsion bar, 136, 146: second torsion bar, 137, 147: non-linearity reduction spring, 138, 148: electrode support portion, 138a, 148a: first electrode support portion, 138b, 148b: second electrode support portion, 138c, 148c: third electrode support portion, 201: sinusoidal wave generation circuit, 202: variable capacitor, 203: fixed capacitor, 204: arithmetic circuit, 204a: operational amplifier, 204b: feedback capacitor, 205: envelope detector, 206: amplifier, 207: low pass filter, 208: analog-digital converter, 211: capacitor, 212: resistor, $C_{a1}$: overlap capacitance, $C_{a2}$: fringe capacitance, C1, C2: capacitor, F1, F2, F3: region, GND: reference potential line, H: envelope, J1: current signal, J1a, J1b: pulse wave, J2: feedback current, J2a, J2b: pulse wave, J3, J4: current, J5, J6: feedback current, L1, L2, L3: straight line, N1 to N5: node, PA, PB: saturation waveform, PC: pulse, PD: falling, PU: rising, R1, R2: axis line, Ri: ripple, Sa: sinusoidal signal, Sb, Sc: signal, T1 to T4: timing, V+: positive constant potential line, V−: negative constant potential line, $V_H$: constant voltage, Va: inverted input terminal voltage, Vi: input signal, Vin, Vin1, Vin2: drive signal, Vo: output signal, Vout: capacitance derivative signal, YA, ZA: maximum point, YB, ZB: minimum point, ZC: midpoint.

The invention claimed is:

1. A MEMS actuator, comprising:
a base portion;
a movable portion supported so as to be elastically displaceable with respect to the base portion;
a fixed comb electrode including a plurality of first comb fingers and provided to the base portion;
a movable comb electrode that includes a plurality of second comb fingers and drives the movable portion by an electrostatic force generated between the fixed comb electrode and the movable comb electrode, the plurality of first comb fingers and the plurality of second comb fingers being alternately arranged;
a drive circuit that applies a drive voltage having a time waveform, which periodically repeats rising and falling and includes a period to be a constant voltage after the rising and before the falling, between the fixed comb electrode and the movable comb electrode; and
a timing detection circuit that generates a capacitance derivative signal indicating a derivative value of a capacitance between the fixed comb electrode and the movable comb electrode by converting a current signal, which is output from the fixed comb electrode or the movable comb electrode within the period due to a change in the capacitance, into a voltage signal and detects a timing when the capacitance derivative signal reaches a threshold value,
wherein the drive circuit controls a timing of the falling or a timing of the rising of the drive voltage based on the capacitance derivative signal such that a relationship between the timing detected by the timing detection circuit and the timing of the falling is kept constant in real time, regardless of a fluctuation in a resonance frequency of the movable portion.

2. The MEMS actuator according to claim 1, further comprising:
a clamp circuit and/or a soft limiter circuit for shortening a fluctuation period of the capacitance derivative signal due to the rising of the drive voltage.

3. A MEMS actuator, comprising:
a base portion;
a movable portion supported so as to be elastically displaceable with respect to the base portion;
a first fixed comb electrode including a plurality of first comb fingers and provided to the base portion;
a first movable comb electrode that includes a plurality of second comb fingers and drives the movable portion by an electrostatic force generated between the first fixed comb electrode and the first movable comb electrode, the plurality of first comb fingers and the plurality of second comb fingers being alternately arranged;
a second fixed comb electrode including a plurality of third comb fingers and provided to the base portion;
a second movable comb electrode including a plurality of fourth comb fingers, the plurality of third comb fingers and the plurality of fourth comb fingers being alternately arranged;
a drive circuit that applies a drive voltage having a time waveform periodically repeating rising and falling between the first fixed comb electrode and the first movable comb electrode; and a timing detection circuit that applies a voltage including a period to be a constant voltage excluding 0 V between the second fixed comb electrode and the second movable comb electrode, generates a capacitance derivative signal indicating a derivative value of a capacitance between the second fixed comb electrode and the second movable comb electrode by converting a current signal, which is output from the second fixed comb electrode or the second movable comb electrode within the period due to a change in the capacitance, into a voltage signal, and detects a timing when the capacitance derivative signal reaches a threshold value, wherein the drive circuit controls a timing of the falling or a timing of the rising of the drive voltage based on the capacitance derivative signal such that a relationship between the timing detected by the timing detection circuit and the timing of the falling to be is kept constant in real time, regardless of a fluctuation in a resonance frequency of the movable portion.

4. The MEMS actuator according to claim 3,
wherein a distance between the second movable comb electrode and the movable portion is shorter than a distance between the first movable comb electrode and the movable portion.

5. The MEMS actuator according to claim 1,
wherein the drive circuit matches the falling timing with the timing when the capacitance derivative signal reaches the threshold value.

6. The MEMS actuator according to claim 1,
wherein the drive circuit shifts the falling timing to a predetermined time after the timing when the capacitance derivative signal reaches the threshold value.

7. The MEMS actuator according to claim 1,
wherein the threshold value is a value corresponding to a case where the current signal is zero.

8. The MEMS actuator according to claim 1,
wherein the time waveform of the drive voltage periodically includes a rectangular wave with the rising and the falling, and
a duty ratio of the drive voltage is 20% or more and less than 50%.

9. The MEMS actuator according to claim 1,
wherein the timing detection circuit includes a comparator for comparing the capacitance derivative signal with the threshold value.

10. The MEMS actuator according to claim 1,
wherein the timing detection circuit includes a transimpedance amplifier for converting the current signal into the voltage signal.

11. The MEMS actuator according to claim 1, further comprising:
an integrator circuit for time-integrating the capacitance derivative signal.

12. The MEMS actuator according to claim 1,
wherein the movable portion is a vertical vibration type.

13. A MEMS actuator, comprising:
a base portion;
a movable portion supported so as to be elastically displaceable with respect to the base portion;
a fixed comb electrode including a plurality of first comb fingers and provided to the base portion;
a movable comb electrode that includes a plurality of second comb fingers and drives the movable portion by an electrostatic force generated between the fixed comb electrode and the movable comb electrode, the plurality of first comb fingers and the plurality of second comb fingers being alternately arranged;

a drive circuit that applies a drive voltage having a time waveform, which periodically repeats rising and falling and includes a period to be a constant voltage after the rising and before the falling, between the fixed comb electrode and the movable comb electrode; and a timing detection circuit that generates a capacitance derivative signal indicating a derivative value of a capacitance between the fixed comb electrode and the movable comb electrode by converting a current signal, which is output from the fixed comb electrode or the movable comb electrode within the period due to a change in the capacitance, into a voltage signal and detects a timing when the capacitance derivative signal reaches a threshold value, wherein the drive circuit controls a relationship between the timing detected by the timing detection circuit and a timing of the falling to be constant, wherein the movable portion is a slide type.

14. A non-transitory computer readable medium that stores a program for causing a computer to execute a process for controlling the drive circuit of the MEMS actuator according to claim 1, the MEMS actuator control program controls rising and falling timings of the drive voltage output from the drive circuit while controlling the relationship between the timing detected by the timing detection circuit and the falling timing to be constant.

15. A method for driving a MEMS actuator including a base portion, a movable portion supported so as to be elastically displaceable with respect to the base portion, a fixed comb electrode including a plurality of first comb fingers and provided to the base portion, and a movable comb electrode including a plurality of second comb fingers and driving the movable portion by an electrostatic force generated between the fixed comb electrode and the movable comb electrode, the plurality of first comb fingers and the plurality of second comb fingers being alternately arranged, the MEMS actuator drive method comprising:

a drive step for applying a drive voltage having a time waveform, which periodically repeats rising and falling and includes a period to be a constant voltage after the rising and before the falling, between the fixed comb electrode and the movable comb electrode, wherein, in the drive step, a capacitance derivative signal indicating a derivative value of a capacitance between the fixed comb electrode and the movable comb electrode is generated by converting a current signal, which is output from the fixed comb electrode or the movable comb electrode within the period due to a change in the capacitance, into a voltage signal, a timing when the capacitance derivative signal reaches a threshold value is detected, and a timing of the falling or a timing of the rising of the drive voltage is controlled based on the capacitance derivative signal such that a relationship between the timing when the capacitance derivative signal reaches the threshold value is detected and the timing of the falling is controlled to be constant in real time, regardless of a fluctuation in a resonance frequency of the movable portion.

16. A method for driving a MEMS actuator including a base portion, a movable portion supported so as to be elastically displaceable with respect to the base portion, a first fixed comb electrode including a plurality of first comb fingers and provided to the base portion, a first movable comb electrode including a plurality of second comb fingers and driving the movable portion by an electrostatic force generated between the first fixed comb electrode and the first movable comb electrode, the plurality of first comb fingers and the plurality of second comb fingers being alternately arranged, a second fixed comb electrode including a plurality of third comb fingers and provided to the base portion, and a second movable comb electrode including a plurality of fourth comb fingers, the plurality of third comb fingers and the plurality of fourth comb fingers being alternately arranged, the MEMS actuator drive method comprising:

a drive step for applying a drive voltage having a time waveform periodically repeating rising and falling between the first fixed comb electrode and the first movable comb electrode, wherein, in the drive step, a voltage including a period to be a constant voltage excluding 0 V is applied between the second fixed comb electrode and the second movable comb electrode, a capacitance derivative signal indicating a derivative value of a capacitance between the second fixed comb electrode and the second movable comb electrode is generated by converting a current signal, which is output from the second fixed comb electrode or the second movable comb electrode within the period due to a change in the capacitance, into a voltage signal, a timing when the capacitance derivative signal reaches a threshold value is detected, and a timing of the falling or a timing of the rising of the drive voltage is controlled based on the capacitance derivative signal such that a relationship between the timing when the capacitance derivative signal reaches the threshold value is detected and the timing of the falling is controlled to be constant in real time, regardless of a fluctuation in a resonance frequency of the movable portion.

17. The MEMS actuator drive method according to claim 15, wherein, in the drive step, the falling timing is made to match the timing when the capacitance derivative signal reaches the threshold value.

18. The MEMS actuator drive method according to claim 15, wherein, in the drive step, the falling timing is shifted to a predetermined time after the timing when the capacitance derivative signal reaches the threshold value.

19. The MEMS actuator drive method according to claim 15, wherein the threshold value is a value corresponding to a case where the current signal is zero.

20. The MEMS actuator drive method according to claim 15, wherein the time waveform of the drive voltage periodically includes a rectangular wave with the rising and the falling, and a duty ratio of the drive voltage is 20% or more and less than 50%.

21. The MEMS actuator drive method according to claim 15, wherein, in the drive step, a comparison between the capacitance derivative signal and the threshold value is performed by using a comparator.

22. The MEMS actuator drive method according to claim 15, wherein, in the drive step, the current signal is converted into the voltage signal by using a transimpedance amplifier.

23. A non-transitory computer readable medium that stores a program for causing a computer to execute a process for realizing the drive step in the drive method according to claim 15, the MEMS actuator control program controls rising and falling timings of the drive voltage while controlling the relationship between the timing when the capacitance derivative signal reaches the threshold value and the falling timing to be constant.

* * * * *